US006888606B2

(12) United States Patent
Hinata et al.

(10) Patent No.: US 6,888,606 B2
(45) Date of Patent: May 3, 2005

(54) ELECTROOPTIC DEVICE AND ELECTRONIC APPARATUS

(75) Inventors: Shoji Hinata, Matsumoto (JP); Yasuhito Aruga, Matsumoto (JP); Tadashi Tsuyuki, Shimosuwa-machi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/122,631

(22) Filed: Apr. 15, 2002

(65) Prior Publication Data

US 2002/0163614 A1 Nov. 7, 2002

(30) Foreign Application Priority Data

| Apr. 16, 2001 | (JP) | 2001-117251 |
| May 17, 2001 | (JP) | 2001-148298 |
| May 17, 2001 | (JP) | 2001-148299 |
| Apr. 2, 2002 | (JP) | 2002-100570 |

(51) Int. Cl.$^7$ .......................................... G02F 1/1345
(52) U.S. Cl. ................ 349/149; 349/151; 349/152; 349/153; 349/139
(58) Field of Search ...................... 349/139, 143, 349/149, 151, 152, 153, 154, 110

(56) References Cited

U.S. PATENT DOCUMENTS

| 4,297,004 A | * | 10/1981 | Nishimura et al. ......... 349/138 |
| 5,680,192 A | * | 10/1997 | Burrell et al. .............. 349/152 |
| 5,706,069 A | * | 1/1998 | Hermens et al. ........... 349/153 |
| 5,748,179 A | * | 5/1998 | Ito et al. .................... 349/152 |
| 5,946,057 A | * | 8/1999 | Kusanagi .................... 349/40 |
| 5,982,470 A | * | 11/1999 | Nakahara et al. .......... 349/153 |
| 6,097,457 A | * | 8/2000 | Kim et al. .................. 349/110 |
| 6,323,930 B1 | * | 11/2001 | Higuchi et al. ............. 349/152 |

FOREIGN PATENT DOCUMENTS

| JP | 57-101883 | 6/1982 |
| JP | 60-026321 | 2/1985 |
| JP | 62-218937 | 9/1987 |
| JP | 07-270811 | 10/1995 |
| JP | 10-325951 | 12/1998 |
| JP | 11-101984 | 4/1999 |
| JP | 11-133454 | 5/1999 |
| JP | 11-142865 | 5/1999 |
| JP | 11-190852 | 7/1999 |
| JP | 11-288001 | 10/1999 |
| JP | 2000-221537 | 8/2000 |
| JP | 2001-75118 | 3/2001 |
| JP | 2001-083504 | 3/2001 |

OTHER PUBLICATIONS

Communication from Japan re: counterpart application No. 2002–100569.

Communication from Japan re: counterpart application No. 2002–100570.

* cited by examiner

*Primary Examiner*—Robert H. Kim
*Assistant Examiner*—Michael H. Caley
(74) *Attorney, Agent, or Firm*—Harness, Dickey & Pierce, P.L.C.

(57) ABSTRACT

A liquid crystal device 1, that is, an electrooptic device, has a second electrode 11 provided so as to oppose a first electrode 10, and a liquid crystal provided between the first electrode 10 and the second electrode 11. This liquid crystal device 1 further has a first substrate 2 on which the first electrode 10 is provided and a wire 14 which is formed on the first substrate 2 and is electrically connected to the second electrode 11 at a conduction position 4a. Since the wire 14 extends inside the conduction position 4a, the picture frame region that is outside a sealing material 4 can be decreased.

20 Claims, 32 Drawing Sheets

ELECTROOPTIC DEVICE AND ELECTRONIC APPARATUS

FIELD OF THE INVENTION

The present invention relates to electrooptic devices, such as a liquid crystal device, an EL (Electro Luminescence) device, and an electrophoretic device, and relates to electronic apparatuses using these electrooptic devices.

DESCRIPTION OF THE RELATED ART

In recent years, in electronic apparatuses such as notebook personal computers, mobile phones, wristwatches, and the like, liquid crystal devices have been widely used as means for displaying various information. In addition, it is expected that EL devices will also be used in the future. In electronic apparatuses, specifically in portable type electronic apparatuses, such as notebook personal computers, mobile phones, wristwatches, and the like, a liquid crystal device or the like is contained in a limited space inside the case. However, according to demands to increase the amount of information which can be displayed by the liquid crystal device or the like, it has been desired that the display region of the liquid crystal device or the like be increased as much as possible, and in addition, that the region other than the display region, i.e., the non-display region, be decreased. Related to this, the non-display region may be called a picture frame region in some cases.

As the liquid crystal devices described above, an active matrix type liquid crystal device having the structure in which a switching element is provided in each display dot forming a display region and a passive matrix (that is, a single matrix) type liquid crystal device having the structure which does not use the switching elements described above have been well known.

Concerning the passive matrix type liquid crystal device, in general, this liquid crystal device has the structure in which liquid crystal is enclosed between a pair of substrates and electrodes in a stripe pattern are formed on surfaces of both substrates so as to orthogonally oppose each other. In this liquid crystal device, portions at which the electrodes on the pair of substrates intersect each other are display dots, and the liquid crystal in each display dot is driven from the outside.

In order to drive liquid crystal from the outside as described above, for example, a non-display region of each substrate is protruded from the periphery of the opposing substrate, driver IC's are mounted on the individual protruding regions, the output terminals of the individual driver IC's and electrodes on each substrate are electrically connected to each other by using wires, and output signals from each driver IC are supplied to the electrodes on each substrate via the wires.

However, in the structure described above, a region on which the driver IC is mounted is necessary for each substrate, and hence, there has been a problem in that a non-display region, i.e., a picture frame region, of a liquid crystal device becomes larger.

In addition, since a shape having a protruding portion which largely protrudes from one of the left side and the right side of the liquid crystal device or one of the upper side and the lower side thereof, that is, an asymmetrical shape, is formed, when this liquid crystal device is contained in a container of a portable electronic apparatus, for example, there has been a problem in that the liquid crystal device may not be contained in the container unless otherwise the peripheral portion thereof for the electronic apparatus is increased, or in addition, the liquid crystal display portion may not be disposed at the center of the electronic apparatus.

Accordingly, in order to decrease a picture frame portion of a liquid crystal device, to form a symmetrical picture frame portion, and to reduce the number of driver IC's, the following structure has been proposed specifically for small-scale liquid crystal devices, such as a mobile phone, having a relatively small number of pixels. That is, a method has been proposed in which all electrodes formed on two substrates are connected to ends of a number of wires which are provided in a non-display region of one of the substrates, and the other ends of these wires are connected to output terminals of one driver IC so that the electrodes on individual substrates are driven by this one driver IC.

FIG. 13 shows a conventional example of a liquid crystal device having the structure as described above. In this conventional liquid crystal device 150, a lower substrate 100 and an upper substrate 101 are bonded together with a sealing material 141 provided continuously so as to form a rectangular shape. In addition, inside the sealing material 141, a shading region 180 is formed along the entire inner periphery thereof. Furthermore, the lower side of the lower substrate 100 in the figure protrudes from the upper substrate 101, and hence, a protruding region 100*a* is formed. Next, one driver IC 102 is mounted on this protruding region 100*a*.

On the surface of the lower substrate 100 opposing the upper substrate 101, a number of segment electrodes 110 extend in the longitudinal direction in the figure, and on the whole, the segment electrodes 110 are formed in a stripe pattern. These segment electrodes 110 are connected to terminals of the driver IC 102 via wires 115. In addition, on the surface of the upper substrate 101 opposing the lower substrate 100, a number of common electrodes 111 are formed extending in the direction so as to orthogonally intersect the segment electrodes, that is, in the lateral direction in the figure, and on the whole, the common electrodes 111 are formed in a stripe pattern.

To ends of these common electrodes, associated wires 140 are connected. These wires 140 extend along the extension direction of the common electrodes 111 and outside the shading region 180 and the sealing material 141, are then bent to extend along the left and the right sides of the upper substrate 101, i.e., in the longitudinal direction in the figure, and are gathered at both side portions of the lower side of the lower substrate 100.

At the portions at which the wires 140 are gathered, vertical conduction members 142 which are formed of, for example, an anisotropic conductive film, a conductive paste, or a conductive material containing conductive particles are provided. By the presence of these vertical conduction members 142, the wires 140 on the upper substrate 101 and the wires 143 formed on the lower substrate 100 are electrically connected to each other. Next, the wires 143 on the lower substrate 100 are connected to the individual terminals of the driver IC 102.

As described above, all wires 143 and all wires 115 are connected to the driver IC 102 on the lower substrate 100, and image signals and scanning signals are supplied to all segment electrodes 110 and common electrodes 111 from this driver IC 102.

However, the conventional liquid crystal device 150 having the structure described above has the following problems. That is, since the wires 115 for the segment electrodes 110 are disposed at positions corresponding to the central portion of the lower side of the upper substrate 101, the vertical conduction members 142, which are used for connecting the wires 140 at the upper substrate 101 side for the common electrodes 111 to the wires 143 at the lower substrate 100 side for the common electrodes, are provided at the left and the right of the lower side of the upper substrate 101.

As described above, in order to provide the vertical conduction members 142, since only limited spaces of the left and the right of the lower side of the upper substrate 101 can be used, when a number of the wires 140 and 143 are disposed, pitches between the wires 140 and between the wires 143 (that is, the wire width + the gap between the wires) must be decreased, and as a result, there has been a problem in that short-circuiting may occur between adjacent wires, or that the reliability of the wires may be degraded in some cases. In addition, when the pitches between the wires 140 and between the wires 143 are increased to a certain extent so that the problem described above may not occur, the area occupied by the vertical conduction members 142 is increased, and as a result, the picture frame region is increased, which is a problem.

Accordingly, instead of the structure in which the vertical conduction members 142 are provided separately from the sealing material 141 as shown in FIG. 13, a liquid crystal device 151 (FIG. 14) having the structure in which the sealing material 141 contains conductive particles 145 so that the sealing material 141 itself serves as a vertical conduction member has been proposed.

In particular, both of the wires 140 at the upper substrate 101 side for the common electrodes 111 and the wires 143 at the lower substrate 100 side for the common electrodes 111 extend to the region in which the sealing material 141 is formed, and these wires 140 and 143 are electrically connected to each other via the sealing material 141. When the conductive particles 145 are used, when the gaps are provided to some extent, short-circuiting between adjacent wires 140 and between the adjacent wires 143 may not occur.

When this structure is used, since the long regions of the sealing material 141 extending along the left and right sides of the substrates 100 and 101 can be used as the vertical conduction members, the pitches between the wires 140 and between the wires 143 can be increased, and hence, the problem of short-circuiting which occurs between the wires 140 and between the wires 143 at positions corresponding to the vertical conduction members can be avoided. In this structure, the same reference numerals of the constituent elements shown in FIG. 13 designate the same constituent elements shown in FIG. 14, and detailed description thereof is omitted.

However, in the case of the liquid crystal device 151 shown in FIG. 14, although the vertical conduction member can be largely formed, the regions in which the wires 140 and 143 are formed must be provided outside the sealing material 141 as in the case shown in FIG. 13. As described above, in recent liquid crystal devices, the display capacity (that is, the number of pixels) tends to further increase. When the display capacity is increased as described above, in response to this increase, the number of wires is increased. When the wires 140 and 143 are provided outside the sealing material 141 as described above, and the number of wires is increased, the region in which the wires are formed is increased, and as a result, it becomes difficult to produce liquid crystal devices having a smaller picture frame.

In order not to increase the regions in which wires are formed even when the display capacity of liquid crystal devices is increased, it has been considered that the pitches between the wires are decreased, that is, the wire width is decreased and/or the gap between the wires is decreased; however, in the case described above, the resistance of the wire is increased, and as a result, the display quality of the liquid crystal device may be adversely affected in some cases. For example, in the case in which 100 pieces of wires are formed at pitches of 50 $\mu$m, a region approximately 5 mm wide is necessary for forming the wires. The resistance of the wires formed of a conventional wire material is increased to the range of from several thousand ohms to several mega ohms, and thus a problem of deformed signal waveforms or the like may arise in some cases.

In addition, in the conventional liquid crystal device 151 shown in FIG. 14, the wires 143 at the lower substrate 100 side for the common electrodes 111 are disposed outside the sealing material 141 and are exposed to outside air, and hence, the wires 143 may be corroded by the influence of moisture in the outside air in some cases.

The present invention was made in order to solve the problems described above, and an object of the present invention is to achieve miniaturization of display devices by decreasing picture frame regions thereof without causing short-circuiting of the wires, degrading the reliability thereof, or the like.

SUMMARY OF THE INVENTION

To these ends, an electrooptic device of the present invention comprises a first substrate; a first electrode; a second electrode disposed to oppose the first electrode; a wire provided on the first substrate; and an electrooptic material provided between the first electrode and the second electrode; wherein the first electrode is provided on the first substrate, the wire is electrically connected to the second electrode at a conduction position, and the wire extends inside the conduction position.

According to this structure, since the wire provided on the first substrate is disposed inside the position of a conduction member which electrically connects the substrates to each other, that is, the central side of the substrate, compared to a conventional liquid crystal device having the structure in which the wire is disposed outside the conduction position of the substrate, the non-display region, that is, the picture frame region, can be decreased.

In the electrooptic device having the structure described above, the electrooptic material may be liquid crystal or an EL (Electro Luminescent) material. The liquid crystal is a material which changes the molecular orientation thereof with change in electric field applied thereto, and when this change in orientation is controlled, the liquid crystal can modulate light passing therethrough. In addition, an EL element is a self-luminous element which can control luminescence and non-luminescence by controlling a voltage applied thereto.

The electrooptic device having the structure described above may further comprise a sealing material enclosing the electrooptic material described above, and the conduction position may be formed in the sealing material. As described above, when the conduction position is formed by using the sealing material, the conduction position may be provided at an optional position in the vicinity of the periphery of the substrate and in a relatively wide area, and hence, problems of short-circuiting, an increase in resistance, or the like can be prevented.

In the electrooptic device having the structure described above, one end of the wire may be connected to an external circuit. As the external circuit mentioned above, there may be mentioned a driver IC itself, a TAB (Tape Automated Bonding) substrate mounting a driver IC thereon, an FPC (Flexible Printed Circuit) which connects a driver IC disposed outside to this electrooptic device, or the like.

In the electrooptic device having the structure in which the conduction position is formed in the sealing material, a conductive material may be contained in the sealing material, and hence, the wire and the second electrode may be connected to each other via the conductive material.

By incorporating the conductive material such as conductive particles with the sealing material, the sealing material for sealing liquid crystal may also be used as a vertical conduction member between substrates. In the case described above, a so-called anisotropic conductive connection can be reliably performed in which electrodes and wires, which positionally correspond to each other, are only electrically connected to each other, and electrodes and wires, which do not positionally correspond to each other, are not electrically connected to each other.

In the case in which the sealing material is used as the vertical conduction member between substrates, since the area of the conduction member between substrate can be widely secured, the pitches between wires can be sufficiently secured. In addition, when the sealing material is used as the vertical conduction member between substrates, since it is not necessary to provide the vertical conduction member between substrates in addition to the sealing material, and the space outside the sealing material may be as small as that necessary used for printing the sealing material, that is, the space may be decreased to a margin or the like, the sealing material can be disposed in the vicinity of the periphery of the substrate, and as a result, the picture frame region can be minimized.

In the electrooptic device having the structure described above, a plurality of the second electrodes may be provided, a plurality of the wires may be provided so as to be connected to the individual second electrodes, at least one wire of said plurality of the wires may be electrically connected to the corresponding second electrode at one side of the first substrate, and the other wires of said plurality of the wires may be electrically connected to the other corresponding second electrodes at a side opposing said one side. According to this structure, the positions at which the wires and the electrodes are electrically connected to each other may be provided at both right and left sides of the substrate or at both top and bottom sides thereof.

Accordingly, the area of the vertical conduction member between substrates can be more sufficiently secured. In addition, a plurality of wires which are to be connected to a plurality of electrodes formed on one of the substrates may be optionally provided for two vertical conduction member between substrates. In the step described above, when the plurality of wires is divided into halves, a symmetrical picture frame region can be formed.

In the electrooptic device having the structure in which the positions at which electrodes and wires are connected to each other are provided on both right and left sides of the substrate or on both top and bottom sides thereof, a dummy pattern corresponding to at least one of the second electrodes may be provided on the first substrate, and in addition, the dummy pattern may be provided at a side opposite to the conduction point between the second electrode and the wire so as to oppose said at least one of the second electrodes.

The sealing material serves to seal liquid crystal or the like, and since being provided between the pair of substrates, the sealing material also serves to maintain a gap between the substrates. When this cell gap varies within the surface of the substrate, display defects may be generated thereby. When the sealing material is used as the vertical conduction member between substrates, at the connection position between the electrode and the wire, the wire is always present between the sealing material and the substrate. However, when the electrode is connected to the wire at one end thereof, since the wire is not provided at the other end of the electrode, there may be a position at which the wire exists and a position at which no wire exists between the sealing material and the substrate, the cell gap varies, and as a result, display defects may occur in some cases.

Accordingly, when dummy patterns each having the same thickness as that of the wire are disposed at the other ends of the electrodes at which the wires do not exist, the cell gap can be constant at any place, and hence, display defects can be prevented. In this step, in order not to complicate a process for manufacturing an electrooptic device, the wires and the dummy patterns are preferably formed of the same material.

Next, an electrooptic device of the present invention comprises a first substrate; first electrodes; second electrodes which are provided to oppose the corresponding first electrodes; wires provided on the first substrate; an electrooptic material provided between the first electrodes and the second electrodes; and a shading layer; wherein the first electrodes are provided on the first substrate, the wires are electrically connected to the corresponding second electrodes at conduction positions, at least one of the wires spatially intersects at least one of the second electrodes which is not connected thereto, and a shading layer is provided at the intersection.

When a plurality of electrodes and a plurality of wires are formed, depending on the way of disposing the wires, one wire may spatially intersect an electrode which is not connected to the wire mentioned above, that is, they may overlap each other with a space therebetween in plan view in some cases. In addition, liquid crystal or the like may exist at the space between the wire and the electrode in some cases. In the cases described above, the wire and the electrode are placed so as to oppose each other with the liquid crystal or the like provided therebetween.

Naturally, the region in which the wires extend is formed in the vicinity of the periphery of the display region, and turn-on does not occur in the region described above. However, as described above, when there is an area at which the wires and the electrodes oppose each other with liquid crystal or the like provided therebetween, and for example, when scanning signals are sequentially supplied to the electrodes via a plurality of the wires, there may be positions at which the electrodes and the wires oppose each other with liquid crystal provided therebetween and to which voltages are applied, liquid crystal disposed at these positions is driven, turn-on occurs in the region which is naturally a non-lighting region, and as a result, white light is emitted therefrom. In the case described above, when display of the liquid crystal device is externally displayed, the display quality is significantly degraded.

In contrast, as described above, when the shading layer is provided at the intersecting positions between the wires and the electrodes, even when turn-on occurs in the region described above, the light is shaded with the shading layer so as not to be emitted outside, white light emission from the non-display region in the vicinity of the periphery of the substrate can be prevented, and as a result, the visibility of image can be improved.

The electrooptic device provided with the shading layer may further comprise a second substrate in addition to the first substrate, wherein the second electrodes may be provided on the second substrate, and the shading layer may be formed on the second substrate.

The electrooptic device provided with the shading layer may further comprise a color layer containing at least two different colors; and a member defining the two colors; wherein the member may comprise substantially the same material as that for the shading layer. Accordingly, a method for manufacturing a liquid crystal device can be prevented from being complicated.

In the electrooptic device having the structure described above, the wires may comprise a first conductive film having a resistance lower than that of the first electrode. According to this structure, the wiring resistance is decreased, and hence, the display quality can be maintained at a higher level.

In the electrooptic device using the first conductive film having a low resistance as the wires, the wires may comprise a second conductive film which is the same layer as that for the first electrode, and the first conductive film and the second conductive film may form a laminated film.

The electrooptic device using the first conductive film having a low resistance as the wires may further comprise a driver IC mounted on the first substrate, wherein the driver IC drives the second electrodes via the wires.

In the electrooptic device using the first conductive film having a low resistance as the wires, parts of the wires provided outside the region of the sealing material may be formed so as not to include the first conductive films. Accordingly, the contact between the first conductive film and outside air can be reliably prevented, and as a result, corrosion of the first conductive films, that is, corrosion of the wires, can be more reliably prevented.

Next, an electrooptic device of the present invention comprises a first substrate; first electrodes in a stripe pattern provided on the first substrate; a second substrate; second electrodes which are provided on the second substrate in a stripe pattern and which intersect the first electrodes; a sealing material which bonds the first substrate to the second substrate so that the individual surfaces thereof provided with the electrodes oppose each other; liquid crystal enclosed in a region surrounded by the first substrate, the second substrate, and the sealing material; a conductive material; and wires which are provided on the first substrate and which are electrically connected to the second electrodes on the second substrate via the conductive material; wherein the wires each comprise a first conductive film having a resistance lower than that of first electrodes, and a part or the entirety of the first conductive film is provided in the region surrounded by the sealing material.

The electrooptic device described above is a liquid crystal device using the liquid crystal as the electrooptic material and is a passive matrix type liquid crystal device having the structure in which display dots are formed at the intersections between the two electrode groups, each electrode group containing electrodes disposed in a stripe pattern.

According to the liquid crystal device having the structure described above, since the wire is formed of the first conductive film having a resistance lower than that of the first electrode, the wiring resistance is decreased, and hence, the display quality can be maintained at a higher level. In addition, since a part or the entirety of the first conductive film is provided in the region surrounded by the sealing material, the first conductive film is prevented from being exposed to outside air, and hence, corrosion of the wire formed of the first conductive film described above can be prevented.

In the passive matrix type electrooptic device described above, the wires each may further comprise a second conductive film formed of the same layer as that for the first electrode, and the first conductive film and the second conductive film may form a laminated film.

In the passive matrix type electrooptic device described above, the first conductive film may be formed of ITO, and the second conductive film having a low resistance may be formed of silver, aluminum, or an alloy containing silver or aluminum. As the alloy containing silver, an alloy containing 98% of silver (Ag), 1% of palladium (Pd), and 1% of copper (Cu) may be mentioned by way of example.

The passive matrix type electrooptic device described above may further comprise a driver IC mounted on the first substrate, wherein the driver IC may drive the second electrodes via the wires.

In the passive matrix type electrooptic device described above, a part of the wire provided outside the region of the sealing material preferably does not include the first conductive film. Accordingly, the contact between the first conductive film and outside air can be reliably prevented, and as a result, corrosion of the conductive films, that is, corrosion of the wires, can be more reliably prevented.

An electrooptic device of the present invention comprises a first substrate; pixel electrodes in a dot matrix provided on the first substrate; TFD elements which are electrically connected to the corresponding pixel electrodes and which are provided on the first substrate; a second substrate; second electrodes which are provided on the second substrate in a stripe pattern and which oppose the corresponding pixel electrodes; a sealing material which bonds the first substrate to the second substrate so that the individual surfaces thereof provided with the electrodes oppose each other; liquid crystal enclosed in a region surrounded by the first substrate, the second substrate, and the sealing material; a conductive material; and wires which are provided on the first substrate and which are electrically connected to the second electrodes on the second substrate via the conductive material; wherein the TFD element has the laminated structure comprising a first metal film, an insulating film, and a second metal film, the wires each comprise a first conductive film having a resistance lower than that of pixel electrodes, and a part or the entirety of the first conductive film is provided in the region surrounded by the sealing material.

The electrooptic device described above is a liquid crystal device using the liquid crystal as the electrooptic material and is an active matrix type liquid crystal device having the structure in which TFD's (Thin Film Diode) are used as a switching element.

According to the electrooptic device having the structure described above, since each of the wires is formed of the first conductive film having a resistance lower than that of the pixel electrodes, the wiring resistance is decreased, and hence, the display quality can be maintained at a higher level. In addition, according to this electrooptic device, since a part or the entirety of the first conductive film is provided in the region surrounded by the sealing material, the first conductive film is prevented from being exposed to outside air, and hence, corrosion of the wires each formed of the first conductive film can be prevented.

In the active matrix type electrooptic device described above, the wires each may further comprise a second conductive film which is the same layer as that for the first electrodes, and the first conductive film and the second conductive film may form a laminated film.

In the active matrix type electrooptic device described above, the first conductive film may be formed of the same layer as that for the second electrodes forming the two-terminal switching devices.

The active matrix type electrooptic device described above may further comprise a driver IC mounted on the first substrate, wherein the driver IC may drive the second electrodes via the wires.

In the active matrix type electrooptic device described above, a part of each of the wire provided outside the region of the sealing material preferably does not include the first conductive film. Accordingly, the contact between the first conductive film and outside air can be reliably prevented.

In the active matrix type electrooptic device described above, the second conductive film which is the same layer as that for the first electrode may comprise ITO, and the first conductive film having a resistance lower than that of the first electrode may comprise Cr.

Next, an electronic apparatus according to the present invention comprises the electrooptic device having the structure described above. According to the structures described above, since the compact electrooptic device having the decreased picture frame region is provided, although the entire device is compact, the display region is wide, and hence, an electronic apparatus having superior portability can be realized.

DETAILED DESCRIPTION OF THE PREFERRED EMBODIMENTS

First Embodiment of Electrooptic Device

Figure 1:
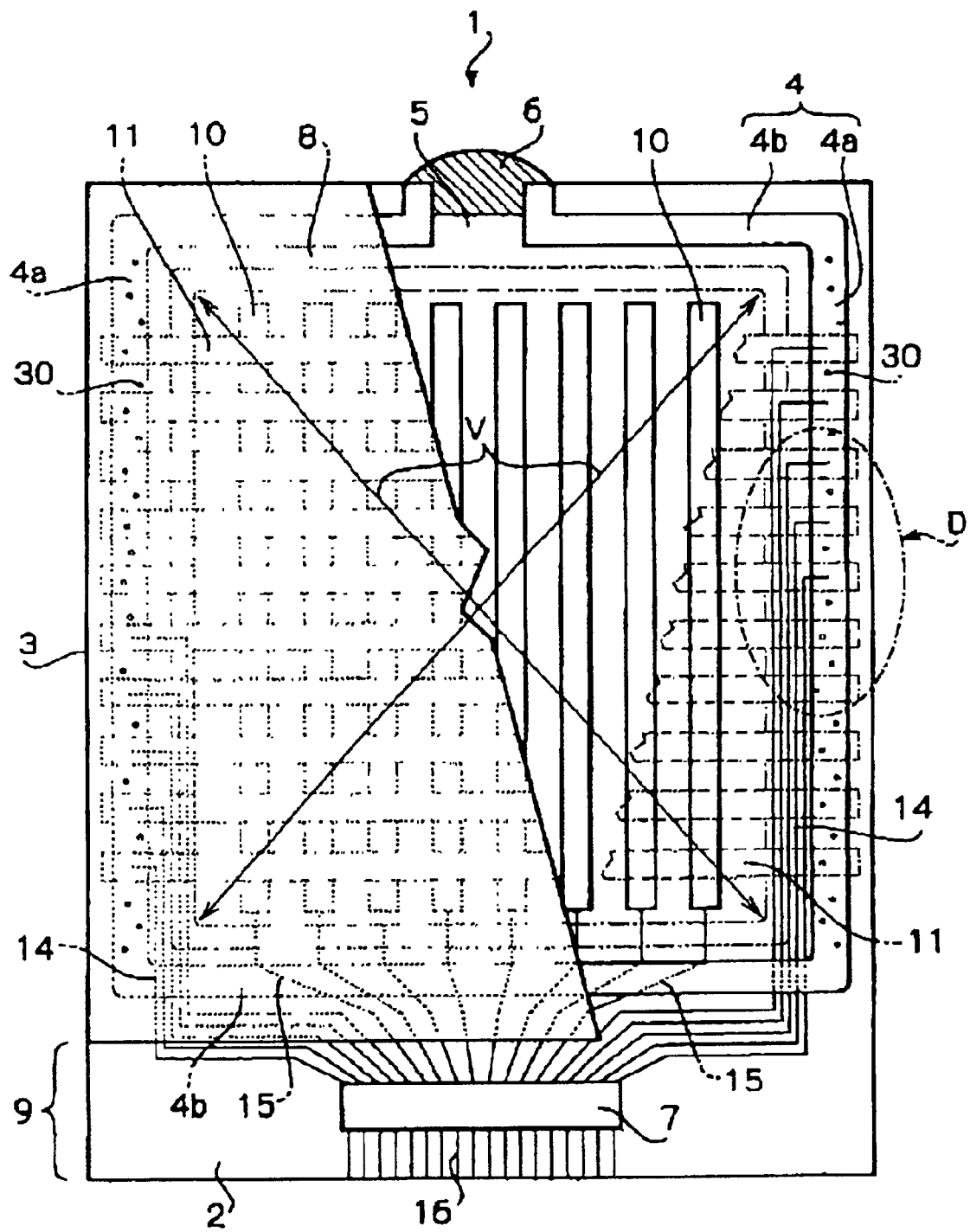
FIG. 1 is a partly cutaway plan view of a liquid crystal device which is one example of an electrooptic device according to one embodiment of the present invention.
Figure 2:
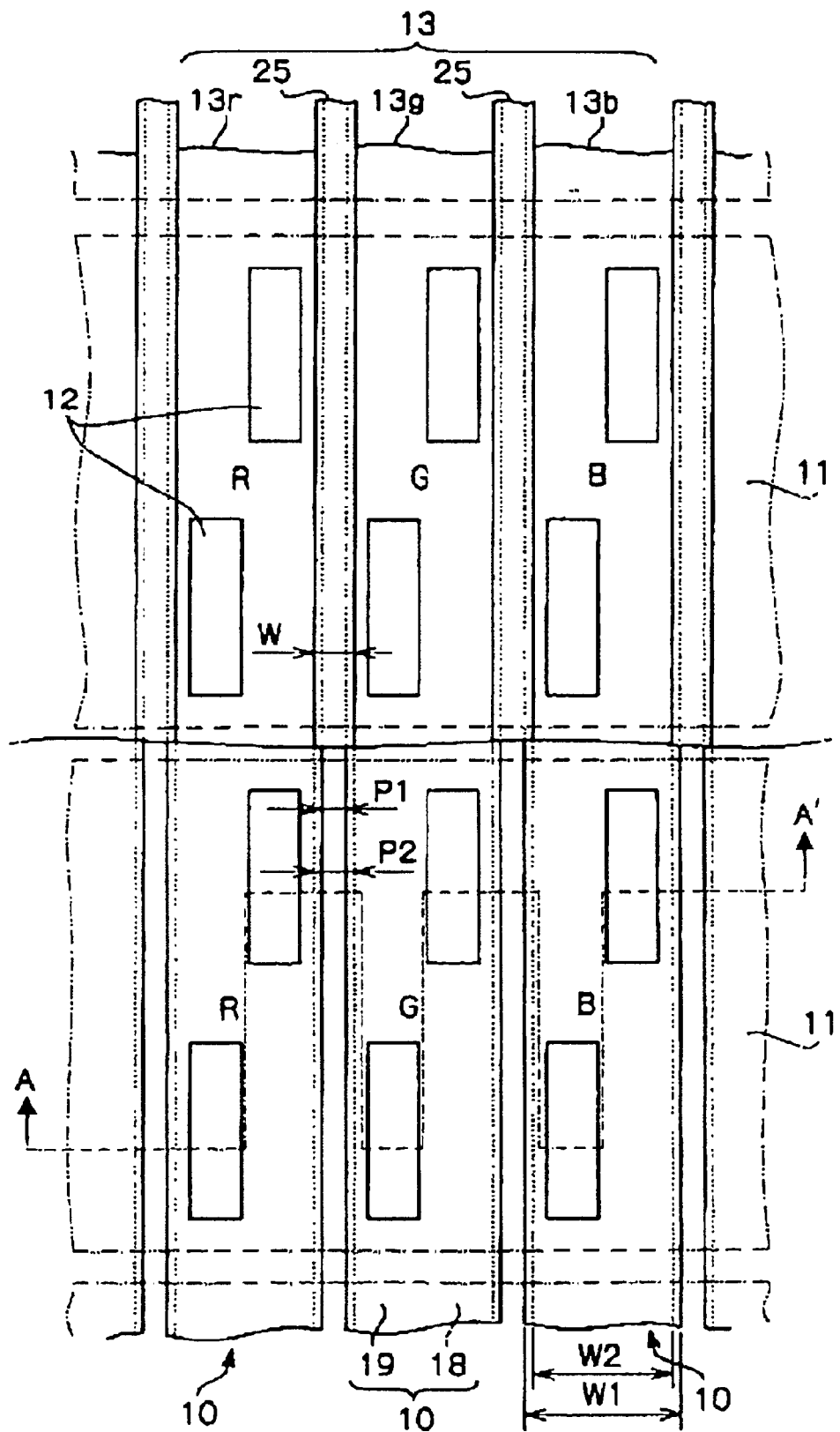
FIG. 2 is an enlarged plan view showing display dot portions of the liquid crystal device in FIG. 1.
Figure 3:
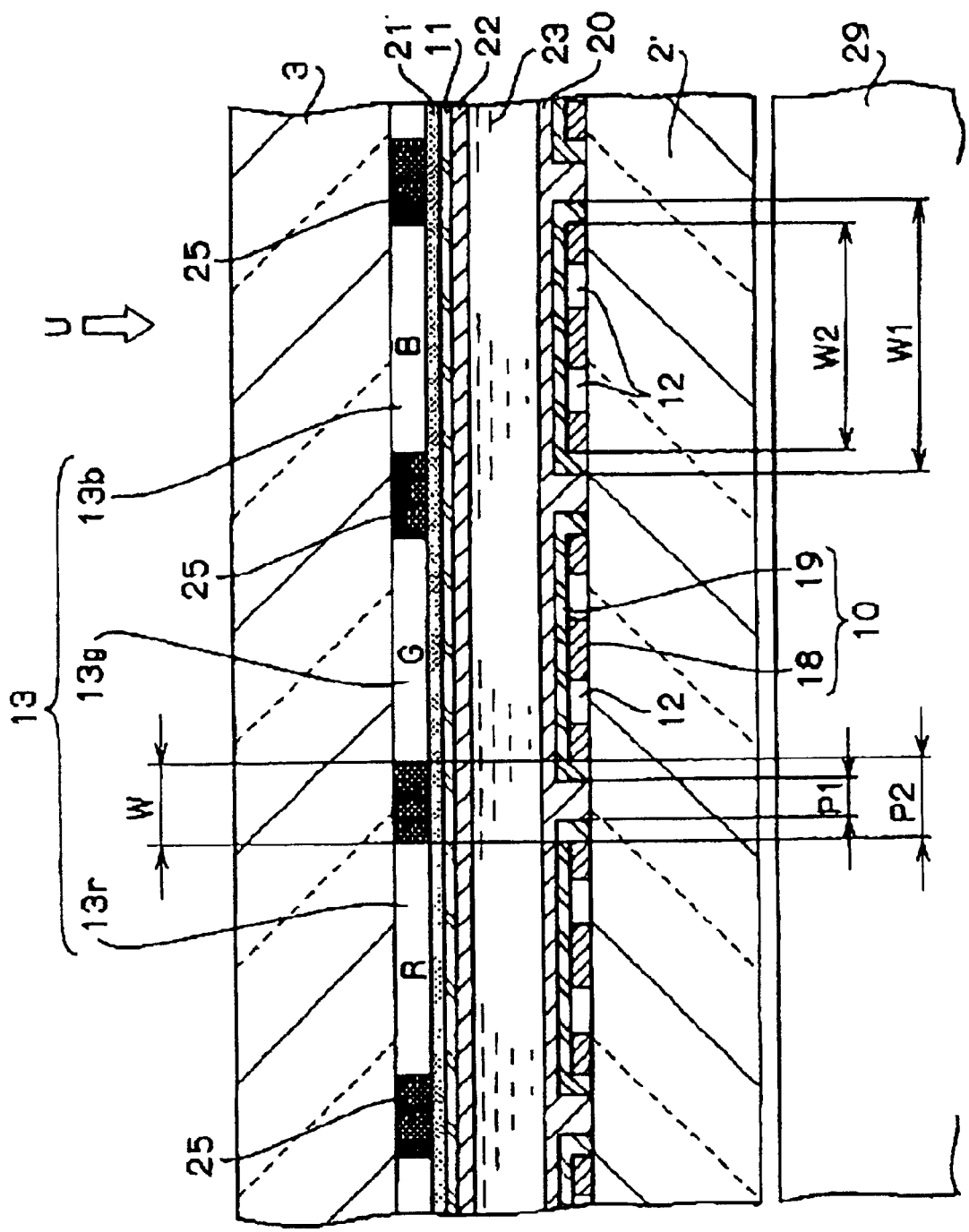
FIG. 3 is a view showing a part of the cross-sectional structure of the liquid crystal device taken along the line A–A' in FIG. 2.
Figure 4:
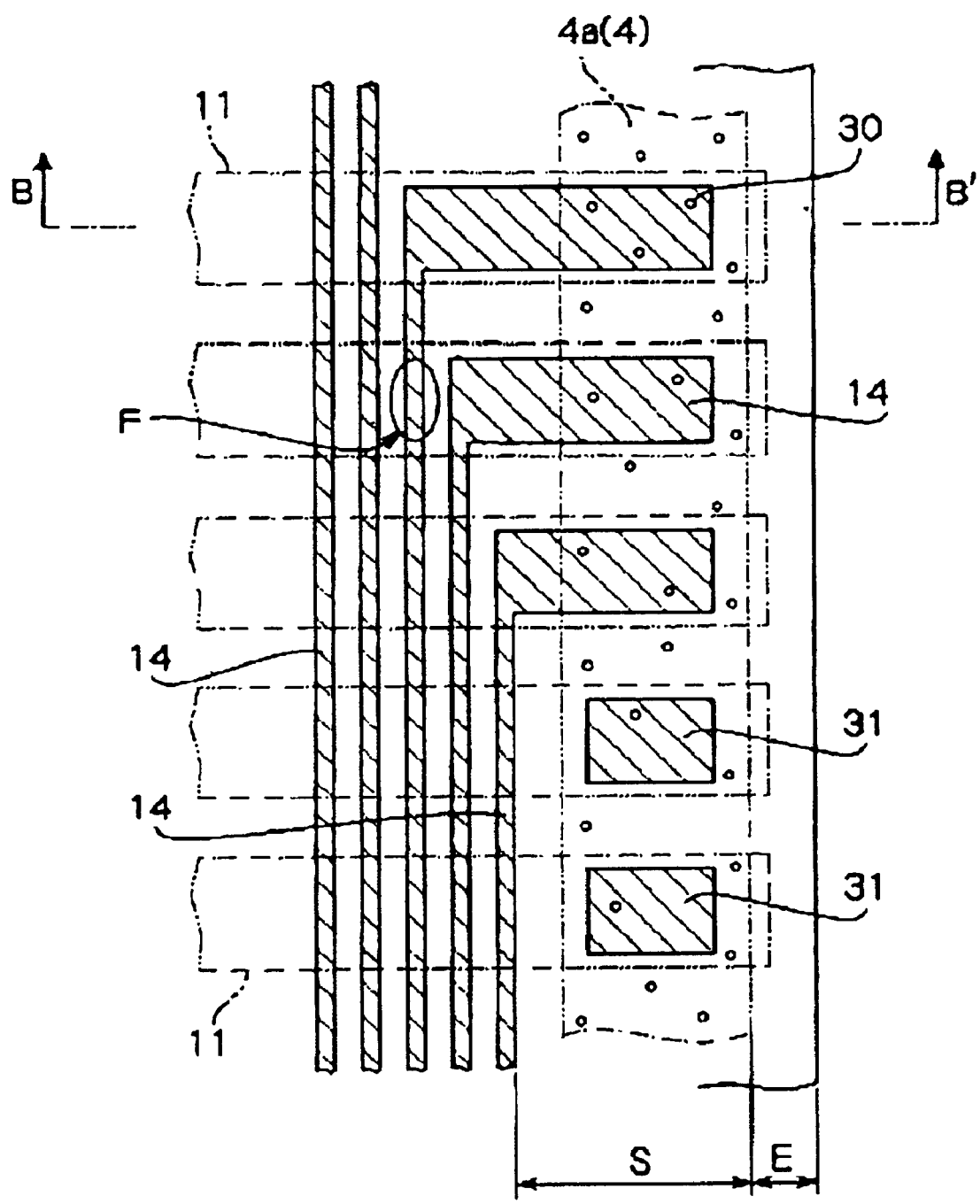
FIG. 4 is an enlarged plan view showing a vertical conduction member indicated by the arrow D of the liquid crystal device in FIG. 1.
Figure 5:
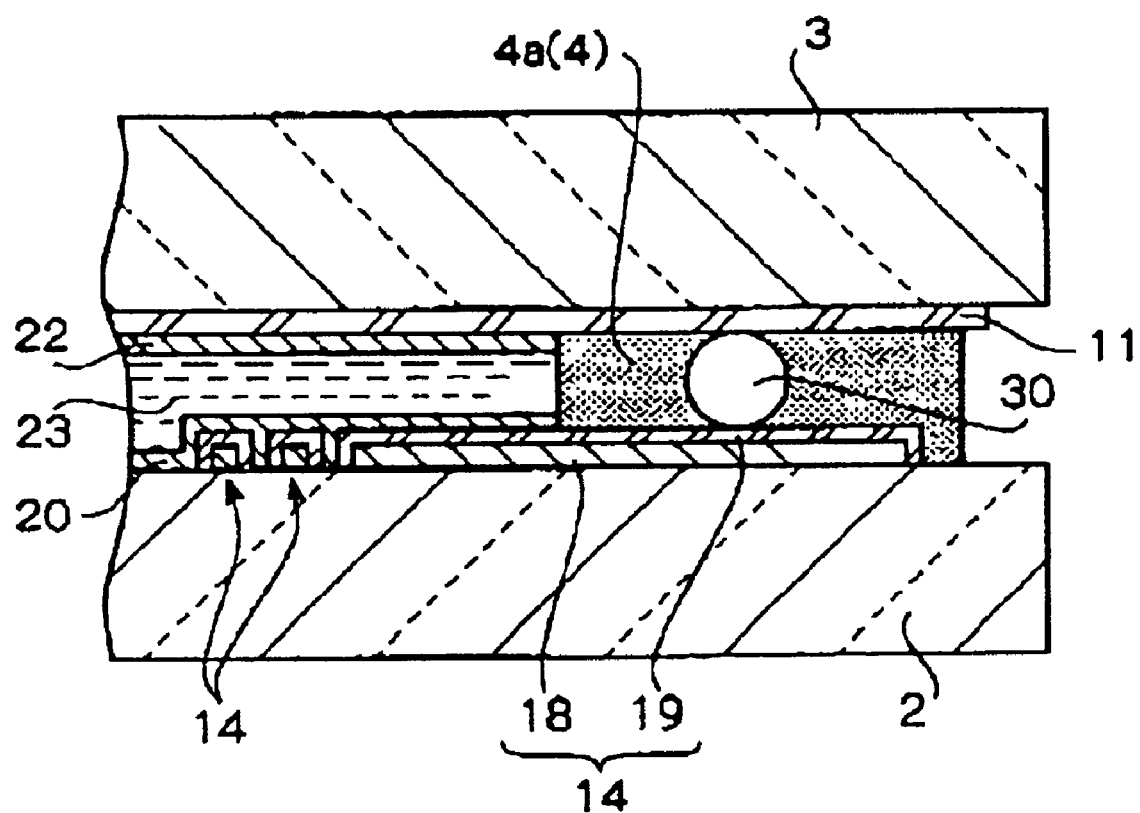
FIG. 5 is a view showing the cross-sectional structure of the vertical conduction member taken along the line B–B' in FIG. 4.

Hereinafter, an embodiment in which the present invention is applied to a liquid crystal device, which is a passive matrix type, is a transflective type, and performs color display, will be described. FIG. 1 shows the plan structure of a liquid crystal device according to an embodiment of an electrooptic device of the present invention. In addition, FIG. 2 is an enlarged plan view showing pixel portions of the liquid crystal device in FIG. 1. In addition, FIG. 3 shows the cross-sectional structure of the liquid crystal device taken along the line A–A' in FIG. 2. FIG. 4 shows an enlarged vertical conduction member indicated by the arrow D in FIG. 1. Furthermore, FIG. 5 shows the cross-sectional structure of a sealing portion taken along the line B–B' in FIG. 4. In all the figures described below, in order to facilitate understanding of the structure of the liquid crystal device, the thicknesses and the dimensional ratios of individual constituent elements are optionally changed.

In FIG. 1, a liquid crystal device 1 has a lower substrate 2 having a rectangular shape in plan view and an upper substrate 3 also having a rectangular shape in plan view. These substrates 2 and 3 are bonded together with a sealing material 4 provided continuously so as to form a rectangular shape, and are disposed so as to oppose each other. The sealing material 4 has an aperture at the upper side of the substrates 2 and 3 shown in the figure so as to be used as a liquid crystal injection inlet 5, and through this liquid crystal injection inlet 5, liquid crystal is injected in a space surrounded by both substrates 2 and 3 and the sealing material 4. After the liquid crystal being injected, the liquid crystal injection inlet 5 is sealed with a plugging material 6.

The entire sealing material 4 is formed continuously and circularly, parts of the sealing material forming the right side and the left side thereof (that is, the longer sides opposing each other) serve as a conductive sealing material 4a and parts of the sealing material forming the upper side and the lower side thereof (that is, the shorter sides opposing each other) serve as a non-conductive sealing material 4b. The conductive sealing material 4a contains a vertical conductive material such as conductive particles 30 and serves as a vertical conduction member in addition to the function of enclosing the liquid crystal.

The lower substrate 2 has an outer shape larger than that of the upper substrate 3. In particular, edges, that is, end faces, of the upper substrate 3 and the lower substrate 2 at the upper side, the right side, and the left side are flush with each other; however, at the lower side shown in FIG. 1, the peripheral portion of the lower substrate 2 protrudes from the upper substrate 3, thereby forming a protruding region 9.

In addition, on the end portion at the lower side of the lower substrate 2, a driver semiconductor element 7 is mounted as an electronic component, and by the operation of this semiconductor element 7, electrodes formed on both upper substrate 3 and the lower substrate 2 are driven. Inside the sealing material 4, a shading layer 8 is provided continuously so as to form a rectangular shape. The region inside the inner periphery of the shading layer 8 is a display region V which displays images in practice.

In FIG. 1, on the surface of the lower substrate 2 at the liquid crystal side, a plurality of segment electrodes 10 extending in the longitudinal direction in the figure are disposed in parallel with each other in the lateral direction so as to form a stripe pattern on the whole. In addition, on the surface of the upper substrate 3 at the liquid crystal side, a plurality of segment electrodes 11 extending in the lateral direction in the figure are disposed in parallel with each other in the longitudinal direction so as to orthogonally intersect the segment electrodes 10, and on the whole, a stripe pattern of the segment electrodes is formed.

Related to this, in FIG. 1, eight pieces of the segment electrodes 10 are schematically shown, and ten pieces of the common electrodes 11 are schematically shown; however, actually, a number of these electrodes are formed on the individual substrates.

In FIG. 3, on the surface of the upper substrate 3 at the liquid crystal side, a color filter 13 containing color layers 13r, 13g, and 13b having color R (red), G (green), and B (blue), respectively, is provided. As shown in FIG. 2, this color filter 13 is disposed in the direction in which the segment electrodes 10 extend (that is, in the longitudinal direction in the figure). In addition, a pattern of the color layers 13r, 13g, and 13b is formed in a longitudinal stripe form in this embodiment. That is, one color among the color R, G, and B is disposed in the longitudinal direction, and these different colors are repeatedly disposed in the lateral direction in order. Three dots having the color R, G, and B and aligned in the lateral direction as shown in FIG. 2 form one pixel on the screen.

In FIG. 3, the segment electrode 10 has a laminated structure composed of an APC film 18 having a width W2 and a transparent conductive film 19 having a width W1 and covering the APC film. The APC film 18 is a film composed of an alloy containing silver (Ag), palladium (Pd), and copper (Cu) at a predetermined ratio. In addition, the transparent film 19 is formed of, for example, ITO (Indium Tin Oxide).

In the APC film 18, two light transmissive window portions 12 are formed in each display dot, and these window portions 12 serve as a light transmissive region. These window portions 12 are disposed in a stagger pattern as shown in FIG. 2. In this embodiment, the "display dot" is an area at which the segment electrode 10 and the common electrode 11 intersect each other in plan view in FIG. 2.

As shown in FIG. 1, both ends of each common electrode 11 are in contact with the conductive sealing material 4a and further extend outside the conductive sealing material 4a. Of the plurality of common electrodes 11, the common electrodes 11 in the upper-half (five pieces in FIG. 1) in FIG. 1 are electrically connected to wires 14, which are used for the common electrodes and which are provided on the lower substrate, at the right ends of the common electrodes via the conductive particles 30 mixed with the conductive sealing material 4a.

In addition, these wires 14 extend from the conductive sealing material 4a to the center of the substrate, that is, the inside of the region surrounded by the sealing material 4, are then bent to extend in the longitudinal direction along the right side of the lower substrate 2 past the non-conductive sealing material 4b in the lower-half in the figure to the protruding region 9, and are then connected to output terminals of the driver semiconductor element 7.

In a manner similar to the above, the common electrodes 11 (five pieces in FIG. 1) in the lower-half in FIG. 1 are electrically connected to the wires 14 on the lower substrate 2 at the left sides of the common electrodes 11 via the conductive particles 30 mixed with the conductive sealing material 4a.

In addition, these wires 14 extend from the conductive sealing material 4a to the center of the substrate, that is, the inside of the region surrounded by the sealing material 4, are then bent to extend in the longitudinal direction along the left side of the lower substrate 2 past the non-conductive sealing material 4b in the lower-half in the figure to the protruding region 9, and are connected to output terminals of the driver semiconductor element 7.

All the wires 14 are disposed inside the conductive sealing material 4a and outside the inner periphery of the shading layer 8. That is, the wires 14 extend in the width of the conductive sealing material 4a, the region between the conductive sealing material 4a and the shading layer 8, and the width of the shading layer 8, further extend past the non-conductive sealing material 4b to the protruding region 9, and are then connected to output terminals of the driver semiconductor element 7 mounted on the protruding region 9.

In addition, concerning the segment electrodes 10, the wires 15 for the segment electrodes are formed to extend from the lower ends thereof to the non-conductive sealing material 4b and are continuously connected to the output terminals of the driver semiconductor element 7. As described above, a number of wires 14 and 15 intersect the non-conductive sealing material 4b provided at the lower sides of the individual substrates 2 and 3; however, since the non-conductive sealing material 4b has no conductivity, even when the wires 14 and 15 are disposed with narrow pitches therebetween, short-circuiting of these wires 14 and 15 may not occur in the non-conductive sealing material 4b.

In this embodiment, as is the segment electrode 10, these wires 14 and 15 also have the laminated structure composed of the APC film 18 and the ITO film 19. In addition, as shown in FIG. 1, on the end portion of the protruding region 9 of the lower substrate 2, external input terminals 16 used as input wires are formed, and the input terminals of the driver semiconductor element 7 are connected to ends of the external input terminals 16. To the other ends of the external input terminals 16, a wiring substrate, which is not shown in the figure, is connected, and various signals are supplied to the semiconductor element 7 via this wiring substrate.

In the display dot portion, that is, the cross-sectional structure of the pixel portion, as shown in FIG. 3, the segment electrodes 10 each having a two-layered structure composed of the ITO film 19 provided on the APC film 18 are formed on the lower substrate 2 composed of a transparent electrode such as a glass or a plastic. These segment electrodes 10 extend in the direction perpendicular to the plane and has a stripe pattern when viewed in the direction indicated by the arrow U.

On the segment electrodes 10, an alignment film 20 composed of a polyimide resin or the like is formed. In addition, alignment treatment such as rubbing treatment is performed on the surface of this alignment film 20. The ITO film 19 is not only formed on the upper surface of the APC film 18, but also on the side surfaces of the APC film. That is, the width W1 of the ITO film 19 is formed larger than the width W2 of the APC film 18.

In addition, on the surface of the upper substrate 3 composed of a transparent substrate such as a glass or a plastic, the color filter 13 composed of the individual color layers 13r, 13g, and 13b having color R, G, and B, respectively, is formed. On this color filter 13, an overcoat film 21 for planarizing the steps among the individual color layers 13r, 13g, and 13b and protecting the surfaces thereof is formed. This overcoat film 21 may be a resin film composed of an acrylic resin, a polyimide resin, or the like, or may be an inorganic film such as a silicon oxide film.

Furthermore, a plurality of the common electrodes 11 which are composed of a single-layered ITO film is formed on the overcoat film 21. These common electrodes 11 extend in the lateral direction on the plane and are formed in a stripe pattern when viewed in the direction indicated by the arrow U. On the common electrodes 11, an alignment film 22 composed of a polyimide resin or the like is formed, and in addition, on the surface of this alignment film 22, alignment treatment such as rubbing treatment is performed. Between the upper substrate 3 and the lower substrate 2, liquid crystal 23 composed of STN (Super Twisted Nematic) liquid crystal or the like is enclosed. In addition, a lighting apparatus 29 is provided as a backlight at the bottom surface side of the lower substrate 2.

On the upper substrate 3, a black stripe 25 is formed. This black stripe 25 is composed of resin black, a metal such as chromium having a relatively low reflectance, or the like, the black strip 25 is formed so as to define among the individual color layers 13r, 13g, and 13b having color R, G, and B, respectively. The width W of the black stripe 25 is larger than a gap P1 between the ITO films 19 provided in a pair of the display dots adjacent to each other, that is, the gap between the segment electrodes, and is approximately equivalent to a gap P2 between the APC films 18.

In FIG. 2 which shows the structure described above, the external line indicating the outline of the segment electrode 10 shows the edges of the ITO film 19, the inner line from the external line shows the edges of the APC film 18, and the line indicating the outline of the black stripe 25 overlaps the line showing the edges of the APC film 18. That is, the width of the black stripe 25 provided in the boundaries among the individual color layers 13r, 13g, and 13b is formed so as to be larger than the gap P1 between the ITO films 19 of the segment electrodes 10 adjacent to each other and to be approximately equivalent to the gap P2 between the APC films 18.

In FIG. 4, the three common electrodes 11 at the upper side are electrically connected to the wires 14 at the right sides thereof via the conductive particles 30 in the conductive sealing material 4a. In addition, as can be understood by referring to FIG. 1, the two common electrodes 11 at the lower side are electrically connected to the wires 14 at the left sides thereof. In FIG. 5 showing a cross-sectional view taken along the line B–B' in FIG. 4, the end portion of the common electrode 11 formed on the upper substrate 3 protrudes from the conductive sealing material 4a. In addition, the end portion of the wire 14 on the lower substrate 2 is disposed in the conductive sealing material 4a. In the conductive sealing material 4a, the conductive particles 30 having a diameter of approximately 10 μm is contained, and when these conductive particles 30 are brought into contact with the common electrode 11 on the upper substrate 3 and the wire 14 on the lower substrate 2, the common electrode 11 and the wire 14 are electrically connected to each other.

As is the segment electrode 10, the wire 14 has a two-layered structure composed of the ITO film 19 provided on the APC film 18, and the side surfaces of the APO film 18 are also covered with the ITO film 19. For the common electrodes 11 connected to the wires 14 at the left sides thereof, that is, the two common electrodes 11 at the lower side in FIG. 4, dummy patterns 31 are formed in the conductive sealing material 4a at the positions corresponding to the right end portions of the common electrodes 11 mentioned above. As in the case of the wire 14, these dummy patterns also have a two-layered structure composed of the ITO film 19 provided on the APC film 18.

For the common electrodes 11 connected to the wires 14 at the right sides thereof (the three common electrodes 11 at the upper side in FIG. 4), dummy patterns 31 are formed in the conducive sealing material 4a at the positions each intersecting the left end portion of the common electrode 11. In FIG. 4, the outlines of the ITO films 19 should be viewed at the peripheries of the APC films forming the wires 14 and the dummy patterns in practice; however, for the convenience of illustration in the figure, they are omitted in the figure.

The liquid crystal device of this embodiment is a transflective liquid crystal device, and when transmissive display is performed, in FIG. 3, light emitted from the lighting apparatus 29 disposed at the rear side of the lower substrate 2 is supplied to the liquid crystal 23 via the window portions 12 formed in the APC film 18. On the other hand, in the case in which reflective display is performed, external light such as sunlight or indoor light incident on the upper substrate 3 side is first transmitted through the layer of the liquid crystal 23, is reflected from the APC film 18 on the lower substrate 2, and is again supplied to the layer of the liquid crystal 23.

While the light is supplied to the layer of the liquid crystal 23 as described above for transmissive display or reflective display, in the display region V, an appropriate display dot is selected in accordance with a scanning signal and a data signal, a voltage exceeding the threshold voltage is applied to the liquid crystal forming the display dot thus selected, and as a result, the orientation of the liquid crystal is controlled. When the orientation of the liquid crystal in each display dot is controlled as described above, light passing through the liquid crystal is placed in a modulated state or in a non-modulated state and is then supplied to a polarizer. The polarizer selects light which is allowed to pass therethrough depending on whether the light is modulated or not, and accordingly, images such as letters, numerals, or figures are externally displayed.

In the liquid crystal device of this embodiment, as shown in FIG. 1, since the conductive sealing material 4a which serves as a vertical conduction member which electrically connects the common electrodes 11 to the wires 14 is provided at the peripheral portions of the substrates 2 and 3, and a number of the wires 14 are formed at the central portion of the substrate than the sealing material 4, that is, inside the conduction positions, compared to the conventional liquid crystal device in which the wires 14 are disposed outside the sealing material 4, the picture frame region can be decreased.

As a result, the edge portions of the substrates 2 and 3 located outside the sealing material 4 each may have a space equivalent to the margin that is only necessary for printing, that is, a space of approximately 0.3 μm wide, and hence, a very limited space is only necessary. In addition, since the APC, which has a low resistivity, is used as a material for forming the wires 14, smaller pitches between the wires 14 can be achieved, and hence, the picture frame region can be further decreased.

In addition, in this embodiment, the structure is formed so that one driver semiconductor element 7 on the lower substrate 2 is responsible to drive the segment electrodes 10 and the common electrodes 11 using the conductive sealing material 4a. Accordingly, the picture frame region can be decreased on the whole, and hence, a liquid crystal device suitably used for a compact and portable electronic apparatus or the like can be formed.

As shown in FIG. 1, in addition to one driver semiconductor element 7 disposed at the lower side of the lower substrate 2, since a number of the wires 14 are divided into halves and are disposed at two different places, that is, the left side and the right side, the shape of the picture frame region becomes symmetrical in the lateral direction as shown in FIG. 1. Accordingly, advantages can be obtained in that when this liquid crystal device 1 is placed in an electronic apparatus, a liquid crystal display portion can be disposed at the center of the apparatus, and that the picture frame region of a container in the electronic apparatus can be decreased.

Furthermore, since the sealing material 4 itself serves as the vertical conduction member, a wide area can be secured for the vertical conduction member, and as a result, the pitches between the wires 14 can be increased. Accordingly, problems of short-circuiting of the wires 14, an increase in resistance, or the like may not arise.

Since the liquid crystal device 1 of this embodiment performs color display, and three display dots R, G, and B are formed in each pixel, one display dot has a rectangular shape as shown in FIG. 2. That is, the common electrode 11 has a width larger than that of the segment electrode 10. In this embodiment, as shown in FIG. 4, by forming the structure in which the common electrodes 11 are electrically connected in the vertical direction, the areas of connection portions can be increased. For example, when the width of the conductive sealing material 4a is set to 0.5 mm and the width of the common electrode 11 is set to 200 μm (that is, 0.2 mm), the connection area is approximately 1 mm². When the connection area can be increased as described above, the reliability of the vertical conduction can be improved.

In addition, as shown in FIGS. 4 and 5, since the wires 14 are disposed inside the sealing material 4, the wires 14 are not exposed to outside air, and hence, the reliability of the wires can be improved by preventing the corrosion of the wires 14. Furthermore, although the APC film 18 itself has properties in that electromigration is unlikely to occur when a device is operated, in this embodiment, the ITO films 19 forming the segment electrode 10 and the wires 14 and 15 cover not only the upper surfaces of the APC films but also the side surfaces thereof thus, the problems of the corrosion caused by adhesion of moisture in manufacturing steps and the electromigration caused by contamination of the film surface can be avoided.

As shown in FIG. 5, the wire 14 has the laminated structure composed of the APC film 18 and the ITO film 19. In this case, when the total thickness of the wire 14, that is, the sum of the thicknesses of the APC film 18 and the ITO film 19 is, for example, approximately 0.3 μm, a step of 0.3 μm is formed in the sealing material 4 by a position at which the wire 14 is provided and a position at which the wire 14 is not provided. When the step as described above is left behind as it is, cell gaps may vary, and as a result, display defect may occur in some cases.

Concerning this problem described above, in this embodiment, as shown in FIG. 4, at the end portions of the common electrodes 11 at which the wires 14 are not provided, the dummy patterns 31 having the same structure as that of the wire 14, that is, the same thickness as that of the wire 14, are disposed. Accordingly, the cell gaps become constant at any positions, and hence, display defects can be prevented. In this connection, since the wires 14 and the dummy patterns 31 are formed of the same layers and by the same steps, the dummy patterns 31 may be formed only by forming an additional pattern in a mask pattern, and hence, the manufacturing process is not complicated.

In addition, as shown in FIG. 3, since the black matrix 25 formed on the upper substrate 3 is provided so as to completely cover the gaps P2 formed between the APC films 18 in the segment electrodes 10 adjacent to each other, no light leakage occurs, and color mixing can be prevented. Furthermore, by using the APC film 18 having superior reflectance, the brightness of display is improved when reflective display is performed, and simultaneously, the color saturation is improved when transmissive display is performed. As a result, in both reflective and transmissive display, individual colors can be clearly created.

In this embodiment, as shown in FIG. 1, the sealing material 4 is formed of the conductive sealing material 4a and the non-conductive material 4b; however, the sealing material 4 may be only formed of the conductive sealing material 4a.

In addition, in this embodiment, the driver semiconductor element 7 is mounted on the protruding region 9; however, in place of this arrangement, without mounting the driver semiconductor element 7 on the protruding region 9, the driver semiconductor element 7 may be disposed outside the liquid crystal device 1. In the case described above, a wiring substrate such as an FPC (Flexible Printed Circuit) is connected to the external input terminals 16, and output signals of the semiconductor element 7 provided outside is transmitted to the wires 14 and the wires 15 via this FPC.

Furthermore, in this embodiment, the passive matrix type transflective color liquid crystal device is described by way of example; however, the present invention may also be applied to an active matrix type transflective color liquid crystal display having two-terminal type switching elements such as TFD's or three-terminal type switching elements such as TFT's.

Second Embodiment of Electrooptic Device

Figure 6:
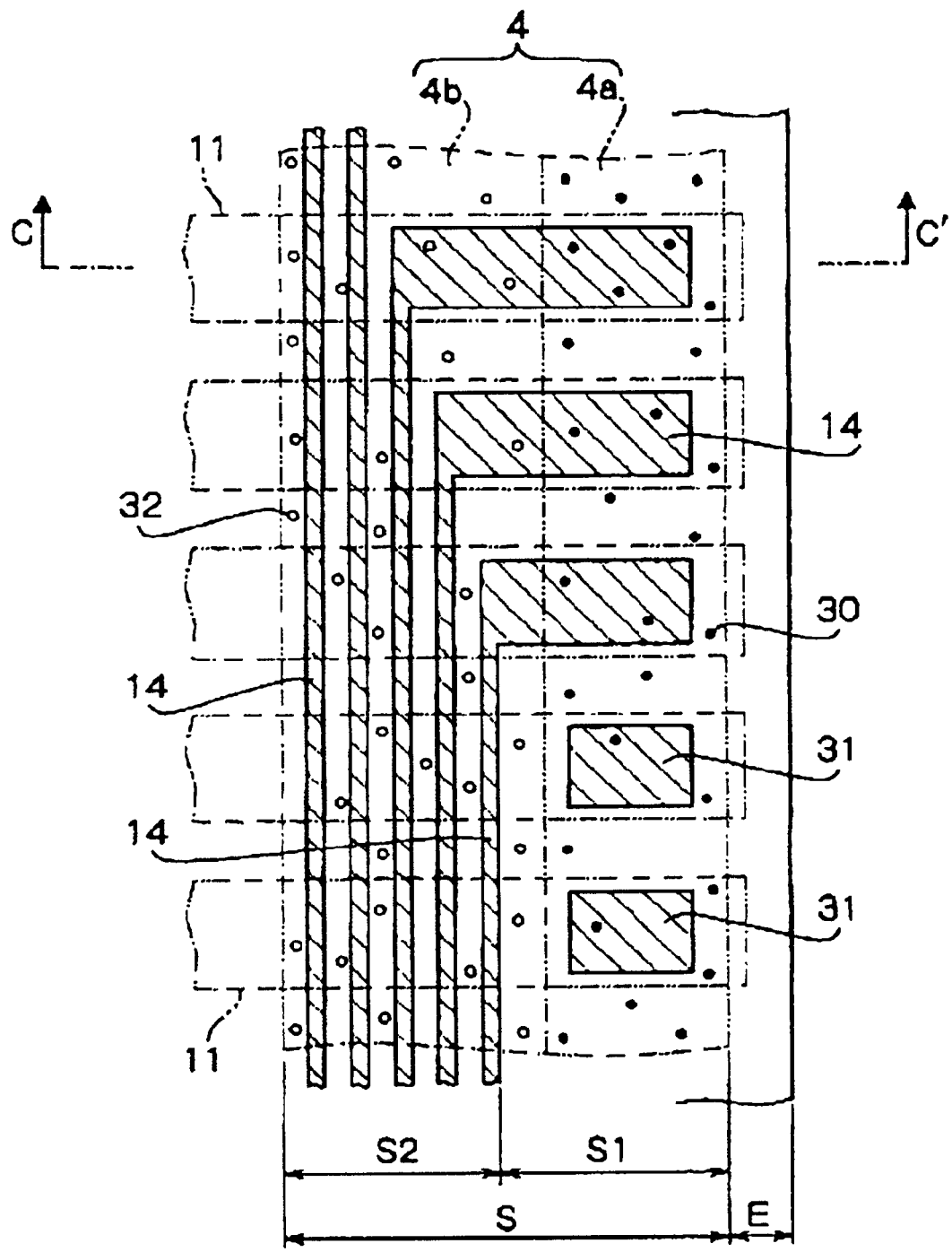
FIG. 6 is a plan view showing a major portion of a liquid crystal device which is one example of an electrooptic device according to another embodiment of the present invention.
Figure 7:
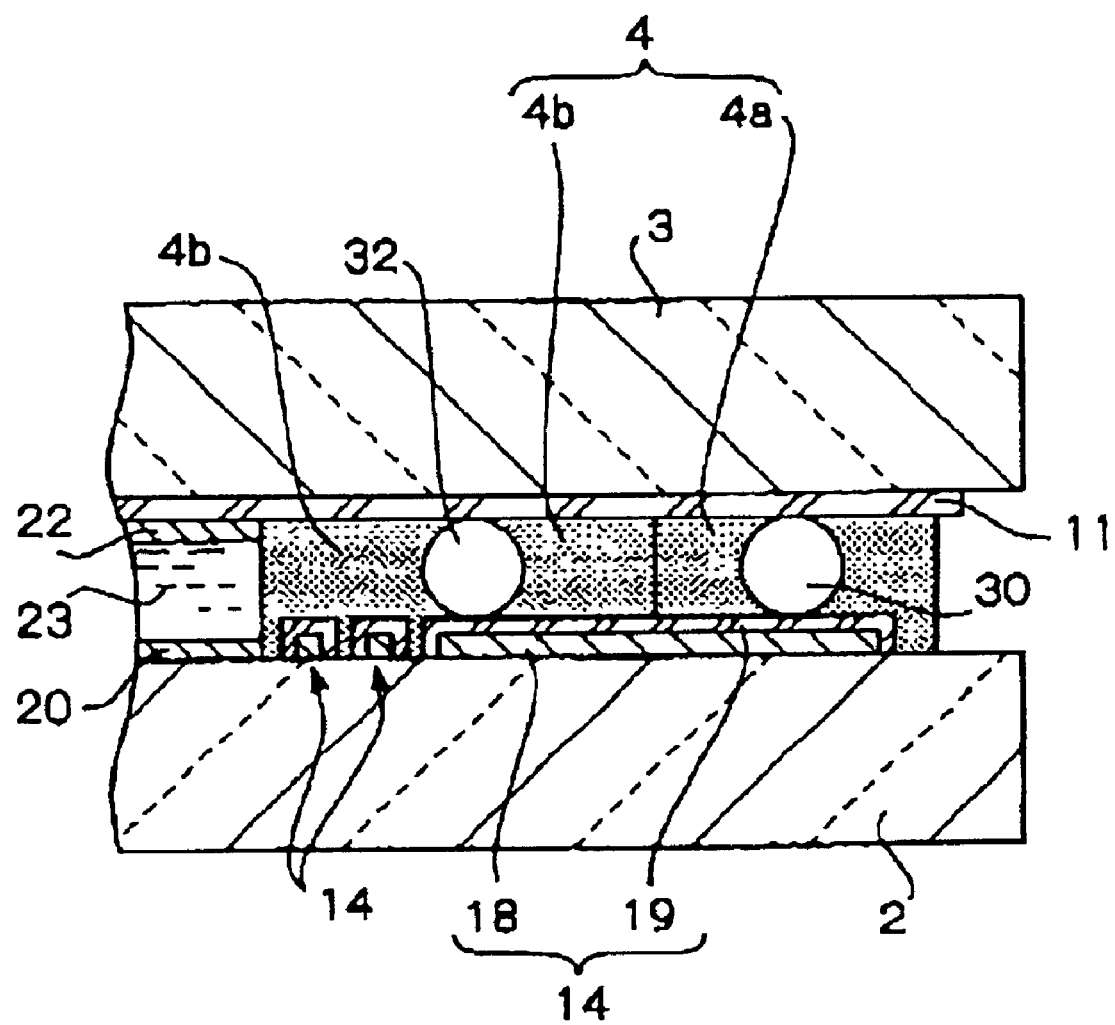
FIG. 7 is a view showing the cross-sectional structure of a vertical conduction member taken along the line C–C' in FIG. 6.

FIGS. 6 and 7 each show a major portion of a liquid crystal device which is one example of an electrooptic device according to another embodiment of the present invention. In this embodiment, since the entire structure of the liquid crystal device is equivalent to that of the embodiment shown in FIG. 1, the detailed description is omitted. The point of this embodiment different from that of the above embodiment shown in FIGS. 4 and 5 is only the structure relating to the vertical conduction member, and this point will be described with reference to FIGS. 6 and 7. In this embodiment, the same reference numerals in FIGS. 4 and 5 designate the same constituent elements in FIGS. 6 and 7.

In the embodiment shown in FIG. 4, in the sealing material 4 formed continuously in a rectangular shape, the parts thereof along the right sides and the left sides of the substrates 2 and 3 are formed as the conductive sealing material 4a, and the parts along the upper sides and the lower sides are formed as the non-conductive sealing material 4b. In this embodiment shown in FIG. 6, parts along the upper sides and the lower sides of the substrates 2 and 3, that is, parts along the shorter sides opposing each other, are composed of the non-conductive material 4b, and this structure is equivalent to that of the above embodiment shown in FIG. 4. However, in this embodiment, parts along the right sides and the left sides of the substrates 2 and 3, that is, parts along the longer sides opposing each other, have a double structure composed of the conductive sealing material 4a and the non-conductive sealing material 4b.

That is, as shown in FIG. 6, the sealing material 4 has the double structure in the width direction, that is, the structure composed of the conductive sealing material 4a and the non-conductive sealing material 4b disposed adjacent to each other in the lateral direction. The conductive sealing material 4a is provided at the peripheral portion of the substrate, and the non-conductive sealing material 4b is provided at the central portion of the substrate. Conductive material such as the conductive particles 30 or the like are mixed with the conductive sealing material 4a, and as a result, the conductive sealing material 4a serves as the vertical conduction member as well as a material enclosing the liquid crystal.

In addition, the conductive material is not mixed with the non-conductive sealing material 4b, and instead of that, gap material 32 is mixed therewith in order to secure the cell gaps. Accordingly, the non-conductive sealing material 4b exclusively serves as a material enclosing the liquid crystal. In the region in which the non-conductive sealing material 4b is formed, the wires 14 are disposed. The structure of the wire 14, the dummy patterns 31, and the like are formed in a manner similar to that of the embodiment in FIG. 4.

The width of the sealing material 4 required for sealing the liquid crystal has been approximately determined, and in this embodiment, for example, this width is set to 0.5 mm. When this width is applied to the embodiment shown in FIG. 4, the width S of the conductive sealing material 4a in the figure is 0.5 mm. In the embodiment shown in FIG. 4, since the entire sealing material 4 is composed of the conductive sealing material 4a, the advantage in that the vertical conduction area can be increased, and hence, short-circuiting may not occur between the common electrodes 11 having a wide pitch therebetween.

However, the pitches between the wires 14 is small, and when the wires 14 are disposed in the region in which the conductive sealing material 4a is formed, short-circuiting may occur between the wires 14. Accordingly, the wires 14 must be disposed inside the conductive sealing material 4a. In particular, when the distance E from the edges of each of the substrates 2 and 3, that is, the end faces of the substrates, to the conductive sealing material 4a, is set to, for example, 0.3 mm, in the region having a width of 0.8 mm, which is the total width of the distance E from the edge of the substrate to the conductive sealing material 4a and the width of the conductive sealing material 4a, the wires 14 cannot be disposed, and the wires 14 must be disposed at the central portion side of the substrate further from the conductive sealing material 4a. Accordingly, in the embodiment shown in FIG. 4, the decrease in picture frame region is limited.

In contrast, in this embodiment shown in FIG. 6, since both of the conductive sealing material 4a and the non-conductive sealing material 4b serve to enclose the liquid crystal, a width of 0.5 mm, which is the width of the sealing material required for sealing the liquid crystal, is shared by the two types of sealing materials described above. While the reliability of the vertical conduction is ensured, as shown in FIG. 6, for example, the width S1 of the conductive sealing material 4a is set to 0.2 mm, and the width S2 of the non-conductive sealing material 4b is set to 0.3 mm.

In the case described above, since the total width S of the sealing material 4 is surely 0.5 mm, as in the case of the embodiment shown in FIG. 4, the liquid crystal can be reliably enclosed. In this embodiment, the point different from that of the embodiment shown in FIG. 4 is that since the non-conductive sealing material 4b has no conductivity, the wires 14 may be disposed in the region in which the sealing material 4 is formed except for the region in which the conductive sealing material 4a is formed, that is, in the region in which the non-conductive sealing material 4b is formed.

In particular, in FIG. 6, when the distance E from the periphery of each of the substrates 2 and 3 to the conductive sealing material 4a is 0.3 mm, in the region having a width of 0.5 mm, which is the sum of the distance E from the periphery of the substrate and the width S1 of the conductive sealing material 4a, the wires 14 cannot be disposed;

however, in the region at the central portion of the substrate further from the region described above, the wires 14 can be disposed. That is, compared to the case of the embodiment shown in FIG. 4, the decrease in picture frame can be achieved by 0.3 mm at one side, and accordingly, by 0.6 mm at both sides. As described above, by using the sealing material 4 having the double structure of this embodiment, the decrease in picture frame can be further performed compared to the embodiment shown in FIG. 4.

In the case in which the sealing material 4 having the double structure is formed, when bubbles are incorporated in the conductive sealing material 4a and the non-conductive sealing material 4b, the reliability of enclosure of the liquid crystal is degraded. In order to form the sealing material 4 having the double structure without incorporating bubbles therein, for example, a method shown in FIG. 8 may be used. That is, a resin material used as the conductive sealing material 4a is printed on the upper substrate 3, a resin material used as the non-conductive sealing material 4b is printed on the lower substrate 2, and both substrates 2 and 3 are bonded together so that both sealing material 4a and 4b are brought into contact with each other.

Figure 8:
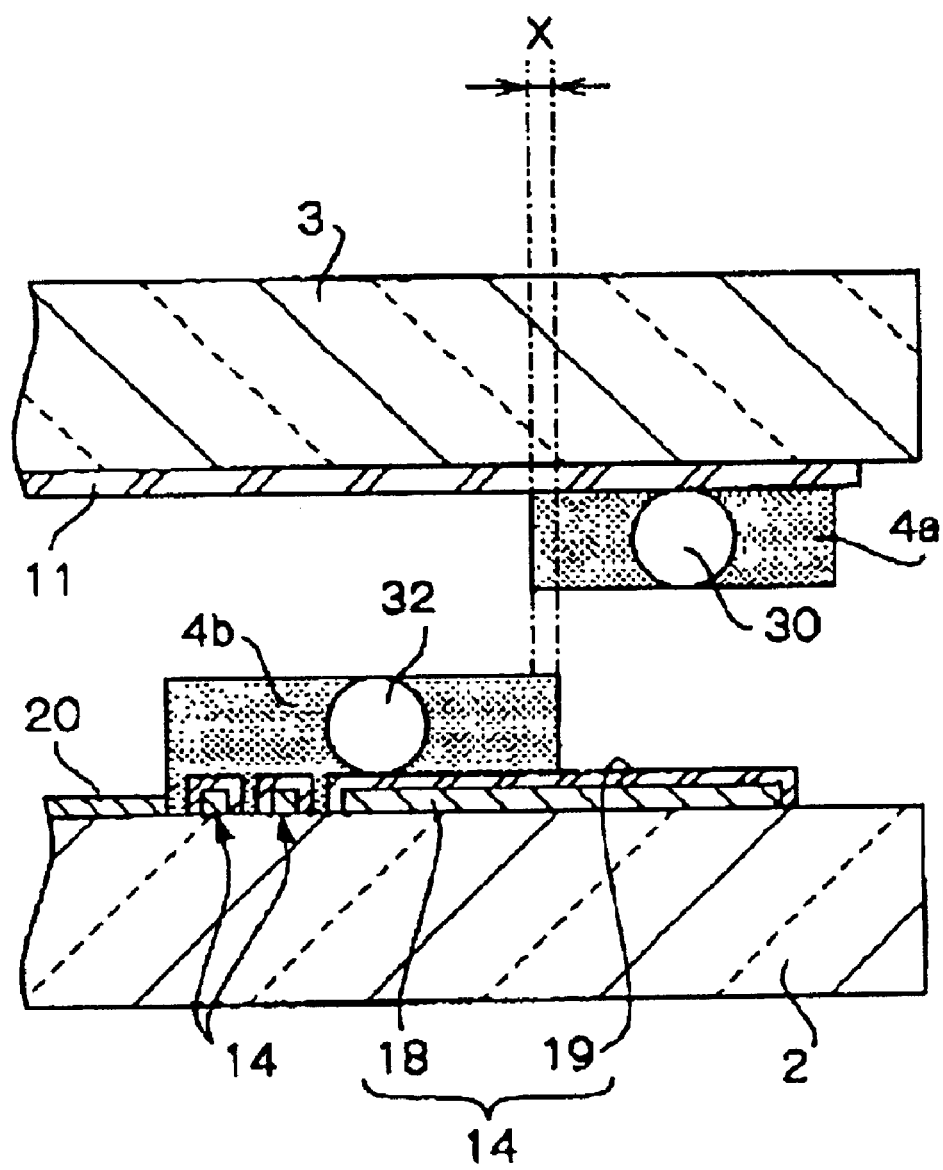
FIG. 8 is a cross-sectional view showing one example of a method for forming the vertical conduction member shown in FIG. 7.

When the substrates 2 and 3 are bonded together, as shown in FIG. 8, it is preferable that a dimension X of the inner peripheral portion of the conductive sealing material 4a be overlaid on a dimension X of the outer peripheral portion of the non-conductive sealing material 4b, that is, the conductive sealing material 4a and the non-conductive sealing material 4b preferably overlap each other as described above. When the structure is thus formed, the inner periphery of the conductive sealing material 4a and the outer periphery of the non-conductive sealing material 4b can be brought into close contact with each other along the entire circumference without forming any gap between the sealing materials 4a and 4b, and hence, the generation of bubbles can be substantially prevented.

Third Embodiment of Electrooptic Device

Figure 9:
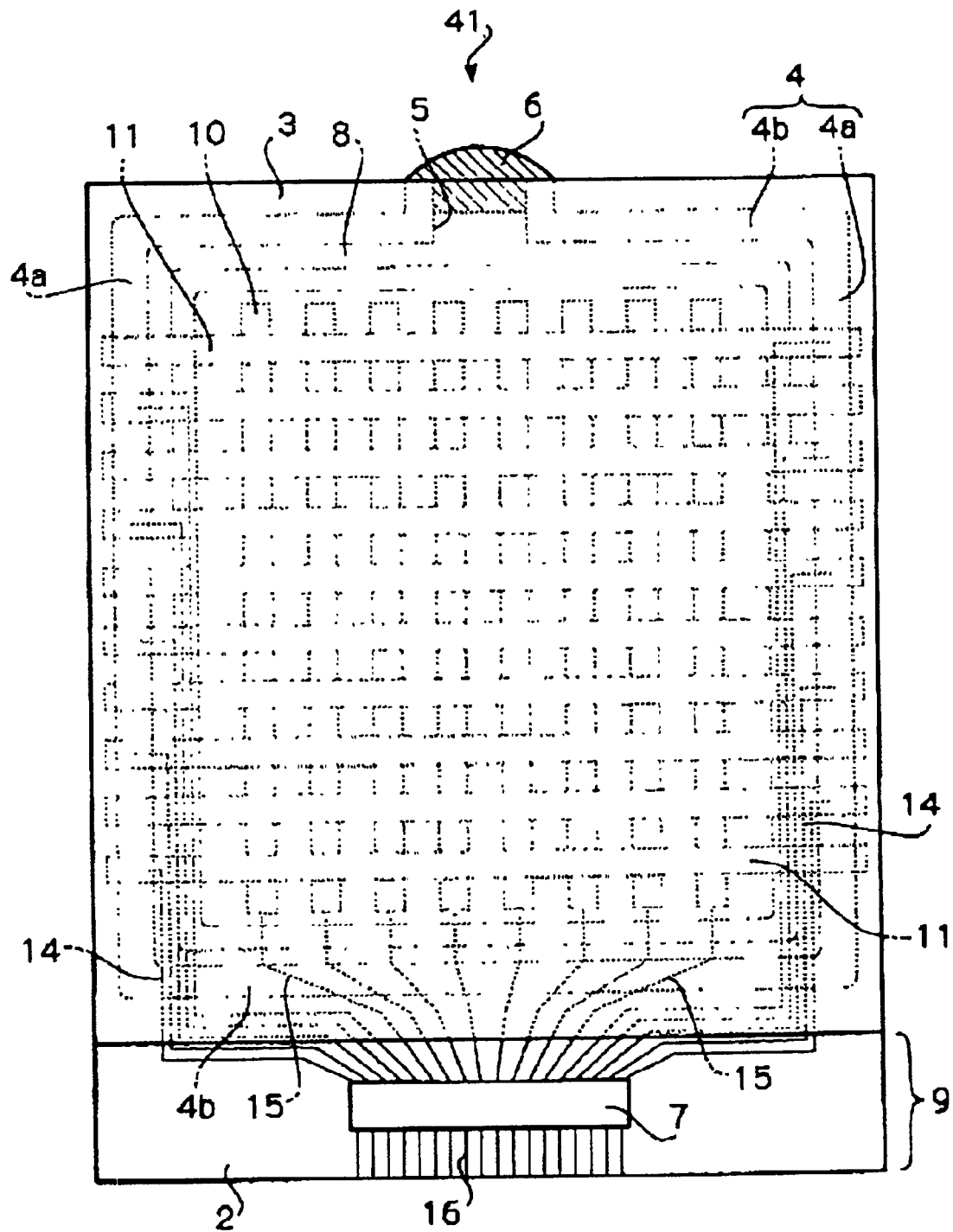
FIG. 9 is a plan view showing a liquid crystal device which is one example of an electrooptic device according to still another embodiment of the present invention.

FIG. 9 shows a liquid crystal device which is one example of an electrooptic device according to still another embodiment of the present invention. In this embodiment, since the basic structure of a liquid crystal device 41 shown in this embodiment is equivalent to that of the embodiment shown in FIG. 1, the detailed description is omitted. The point of the liquid crystal device 41 different from the liquid crystal device 1 shown in FIG. 1 mainly relates to a method for disposing the wires, and this point will be described with reference to FIG. 9.

In the liquid crystal device 1 in FIG. 1, of a plurality of the common electrodes 11, concerning the common electrodes 11 in the upper half, the wires 14 extend from the right sides thereof, and on the other hand, concerning the common electrodes 11 in the lower half, the wires 14 extend from the left sides thereof. In contrast, in the liquid crystal device 41 shown in FIG. 9, the common electrode 11 located at the topmost position has the wire 14 extending from the right side thereof, and the second common electrode 11 from the top has the wire 14 extending from the left side thereof, that is, the wires 14 extend alternately to the right and to the left. The rest of the structure is the same as that of the embodiment shown in FIG. 1.

In the liquid crystal device 41 of this embodiment, as in the case of the liquid crystal device 1 shown in FIG. 1, the advantages in that the picture frame region can be decreased, a symmetrical and plane shape can be formed, the reliability of vertical conduction can be improved, the reliability of the wires can be improved, and the like can be obtained.

In addition to that, in the liquid crystal device 41 of this embodiment, particularly in the active matrix drive system, when the wires 14 extend alternately to the left and to the right, since the difference in resistance between adjacent wires 14 in the vertical direction is not generated, a particular advantage, that is, it is difficult to see the change in display quality at the boundary region, can be obtained.

Furthermore, when line inversion drive is performed in which drive voltages applied to the common electrodes 11 are inverted alternately, such as a positive polarity, a negative polarity, a positive polarity, and so on, the wires 14 which are collectively extended to the right or to the left have the same polarity, and hence electrolytic corrosion resistance can be obtained, which is particularly advantageous.

Embodiment of Electronic Apparatus

Figure 10:
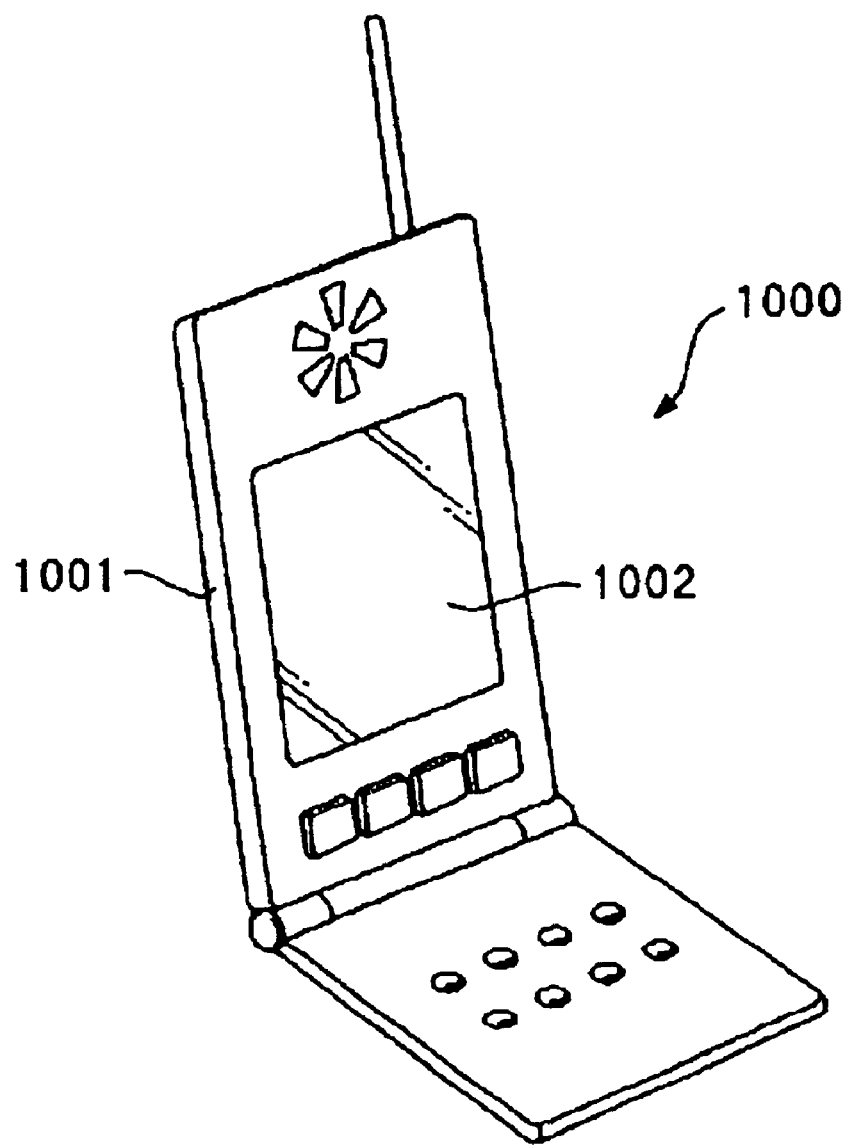
FIG. 10 is a perspective view showing an electronic apparatus according to an embodiment of the present invention.

FIG. 10 shows a mobile phone which is an example of an electronic apparatus according to an embodiment of the present invention. A mobile phone 1000 shown in the figure has a main body 1001, and a liquid crystal display portion 1002 using a liquid crystal device is provided in the main body 1001.

Figure 11:
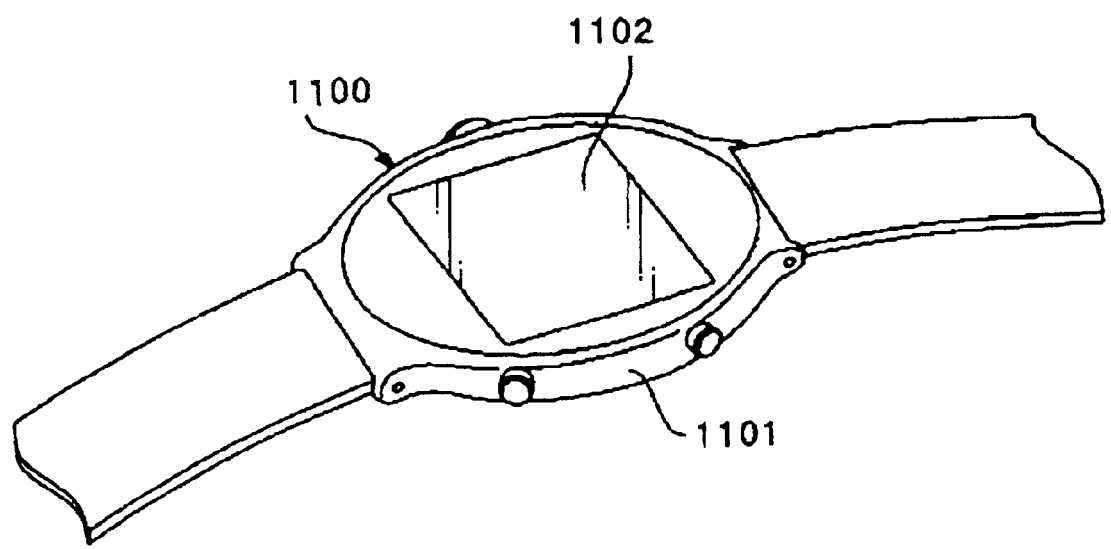
FIG. 11 is a perspective view showing an electronic apparatus according to another embodiment of the present invention.

FIG. 11 shows a wristwatch type electronic apparatus which is an example of an electronic apparatus according to another embodiment of the present invention. A wristwatch type electronic apparatus 1100 shown in the figure has a watch body 1101, and a liquid crystal display portion 1102 using a liquid crystal device is provided in the body 1101.

Figure 12:
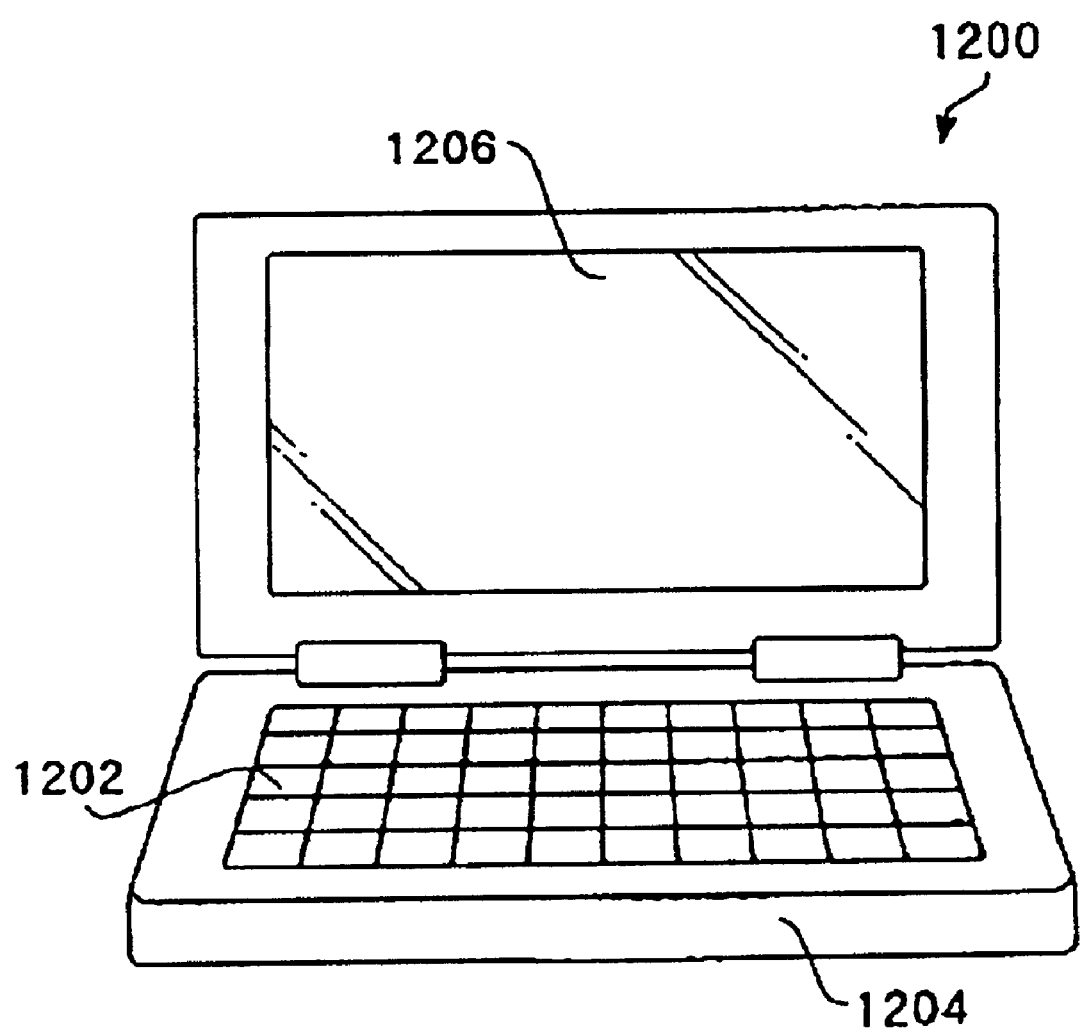
FIG. 12 is a perspective view showing an electronic apparatus according to still another embodiment of the present invention.

FIG. 12 shows a portable information processing device, such as a word processor or a personal computer, which is an example of an electronic apparatus according to still another embodiment of the present invention. A portable information processing device 1200 shown in the figure is formed of a device main body 1204 provided with an input portion 1202, such as a keyboard, a liquid crystal display portion 1206, and the like. The liquid crystal display portion 1206 can be formed by using the liquid crystal device of the present invention.

Since the electronic apparatuses shown in FIGS. 10, 11, and 12 are each provided with the liquid crystal display portion using the liquid crystal device of the present invention, that is, since they are each provided with a compact liquid crystal device which is realized by decreasing the picture frame region, although the entire device is compact, and the portability is superior, the display region is wide.

The technical scope of the present invention is not limited to the embodiments described above, and it is apparent that various modifications may be performed without departing from the spirit and the scope of the present invention. For example, in the embodiments described above, since the sealing materials provided at the left and the right side of the substrate are used as the conductive sealing material, the structure of the vertical conduction and the enclosure of the liquid crystal can be simplified, and as a result, a decrease in picture frame region can be suitably performed. However, when the advantages described above are not fully desired, in addition to the sealing material, an anisotropic conductive film or other conductive member may also be disposed outside the sealing material, and wires may extend from the conductive film or the like mentioned above toward the inside.

In addition, concerning the positions and the number of the vertical conduction members, and the method for extending the wires to each vertical conduction member, various modifications based on the embodiments described above may be optionally performed. In FIG. 1, the driver semiconductor element 7 is mounted on the substrate 2 provided with the segment electrodes 10; however, instead of this structure described above, the structure may be formed in which the driver semiconductor element 7 is mounted on the substrate 3 provided with the common electrodes 11, and the segment electrode 10 may be connected to the wires 14 via the vertical conduction member 30.

Furthermore, as a material for forming the segment electrode and the wire, in addition to the APC film, a silver-palladium alloy (AP) film or another silver alloy film may be used. In the embodiments described above, the present invention is applied to the passive matrix type transflective color liquid crystal device; however, the present invention may be applied to an active matrix type liquid crystal device using switching elements such as TFD's. In the case described above, when a counter substrate, which is disposed to opposes the element substrate and has electrodes in a stripe pattern, is regarded as the upper substrate shown in FIG. 1, the same structure as that of the embodiment shown in FIG. 1 can be used. In addition, the present invention may be applied to any types of liquid crystal devices, such as a monochrome liquid crystal device, a reflective liquid crystal device, and a transmissive liquid crystal device.

Fourth Embodiment of Electrooptic Device

Figure 15:
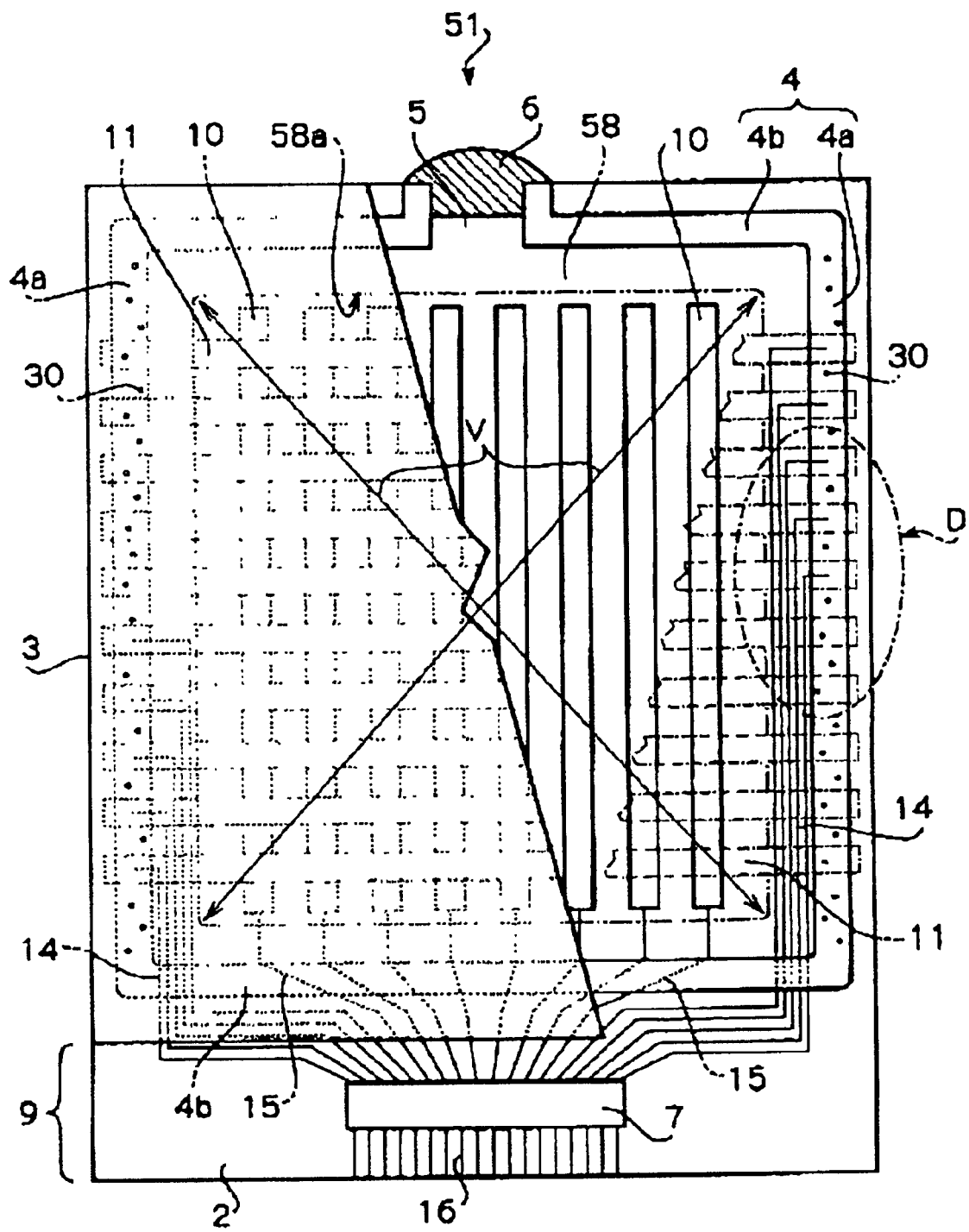
FIG. 15 is a plan view showing a liquid crystal device which is one example of an electrooptic device according to still another embodiment of the present invention.

FIG. 15 shows a liquid crystal device which is one example of an electrooptic device according to still another embodiment of the present invention. The point of a liquid crystal device 51 shown in FIG. 15 different from the liquid crystal device 1 shown in FIG. 1 mainly relates to a shading layer which is provided in wide regions at the peripheral portions of the substrates 2 and 3, and the rest of the structure can be formed equivalent to that of the liquid crystal device 1 shown in FIG. 1. Accordingly, the same reference numerals in FIG. 1 designate the same constituent elements in FIG. 15, and the detailed descriptions thereof are omitted.

Figure 16:
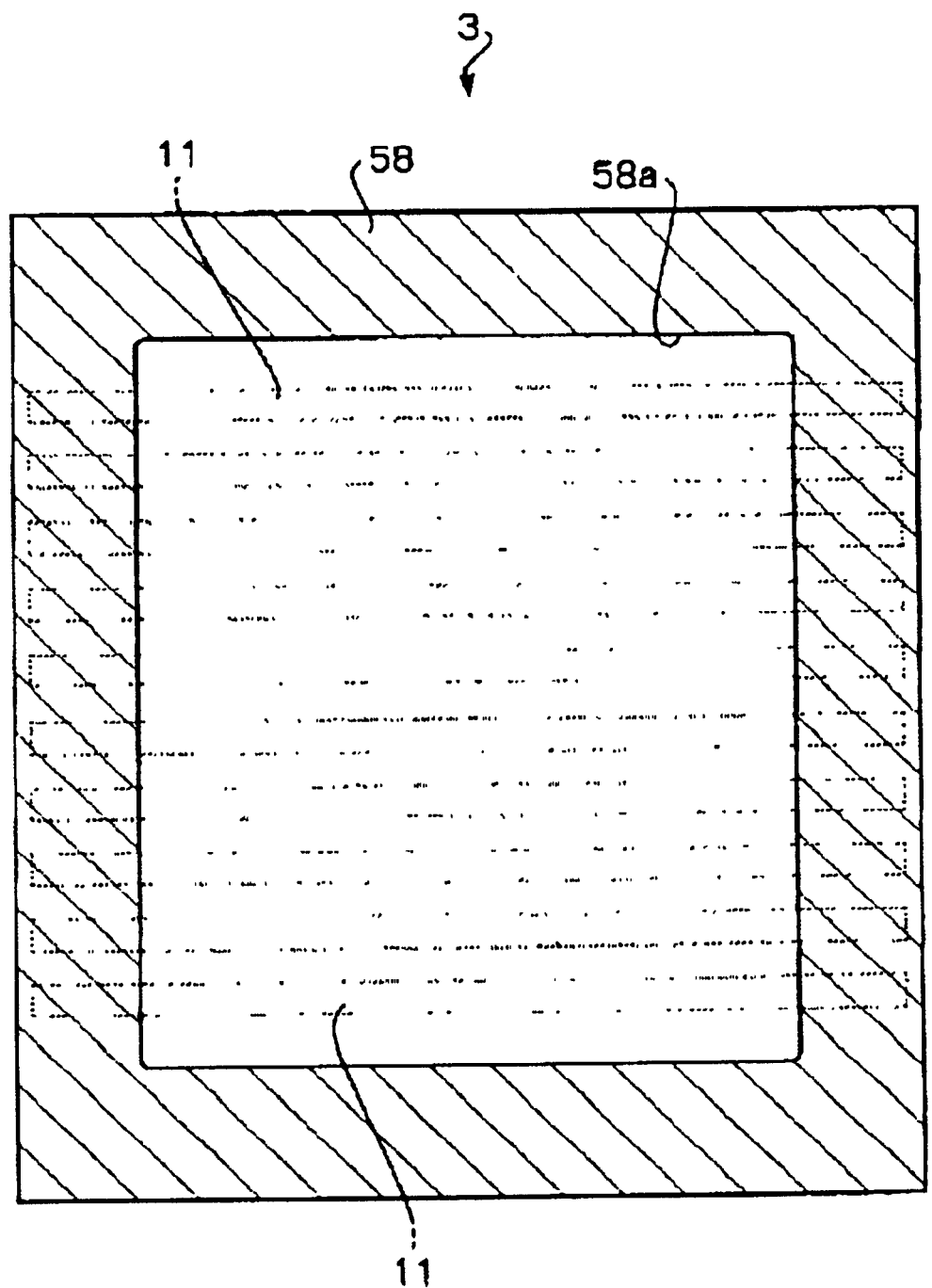
FIG. 16 is a plan view showing a substrate used in the liquid crystal device shown in FIG. 15.

As shown in FIG. 15, a shading layer 58 is provided at the peripheral portions of the substrates 2 and 3. As shown in FIG. 16, this shading layer 58 is formed in a wide area on the surface of the upper substrate 3 at the liquid crystal side from the end faces toward the inner side of the substrate. That is, the shading layer 58 is uniformly formed on the entire region from the inner periphery 58a thereof to the end faces of the substrate. This shading layer 58 may also be provided on the lower substrate 2.

The inner periphery 58a of the shading layer 58 surrounds the display dots which are formed at the intersections between the segment electrodes 10 and the common electrodes 11. Since the region formed of the display dots is the display region V which exhibits an image display, the inner periphery 58a of the shading layer 58 surrounds the display region V.

For example, the shading layer 58 may be formed of the same material and by the same step as those used for forming the black stripe 25 shown in FIG. 3. That is, the shading layer 58 may be formed of resin black, a metal having a relatively low reflectance such as chromium, or the like.

Figure 13:
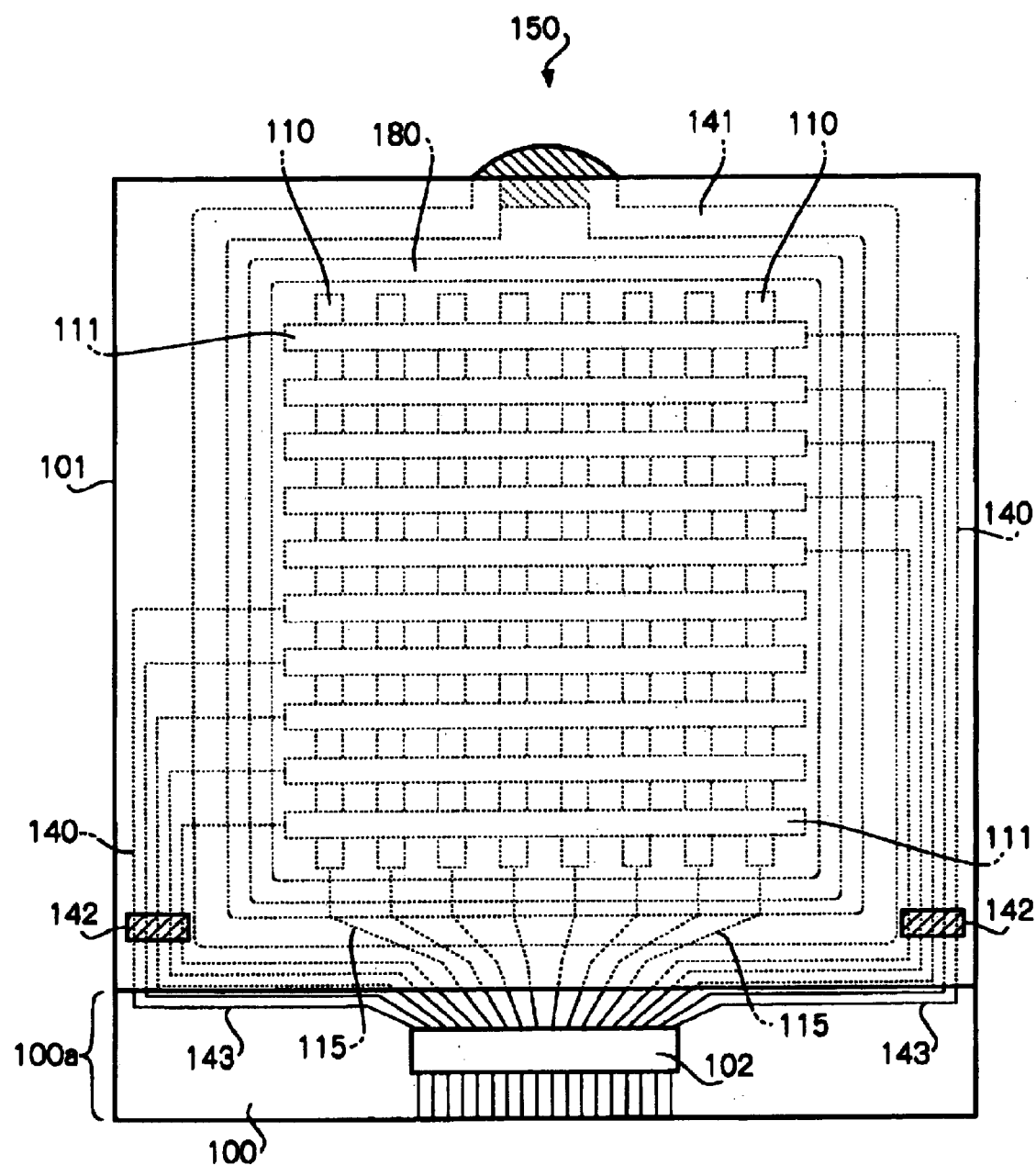
FIG. 13 is a plan view showing one example of a conventional liquid crystal device.
Figure 14:
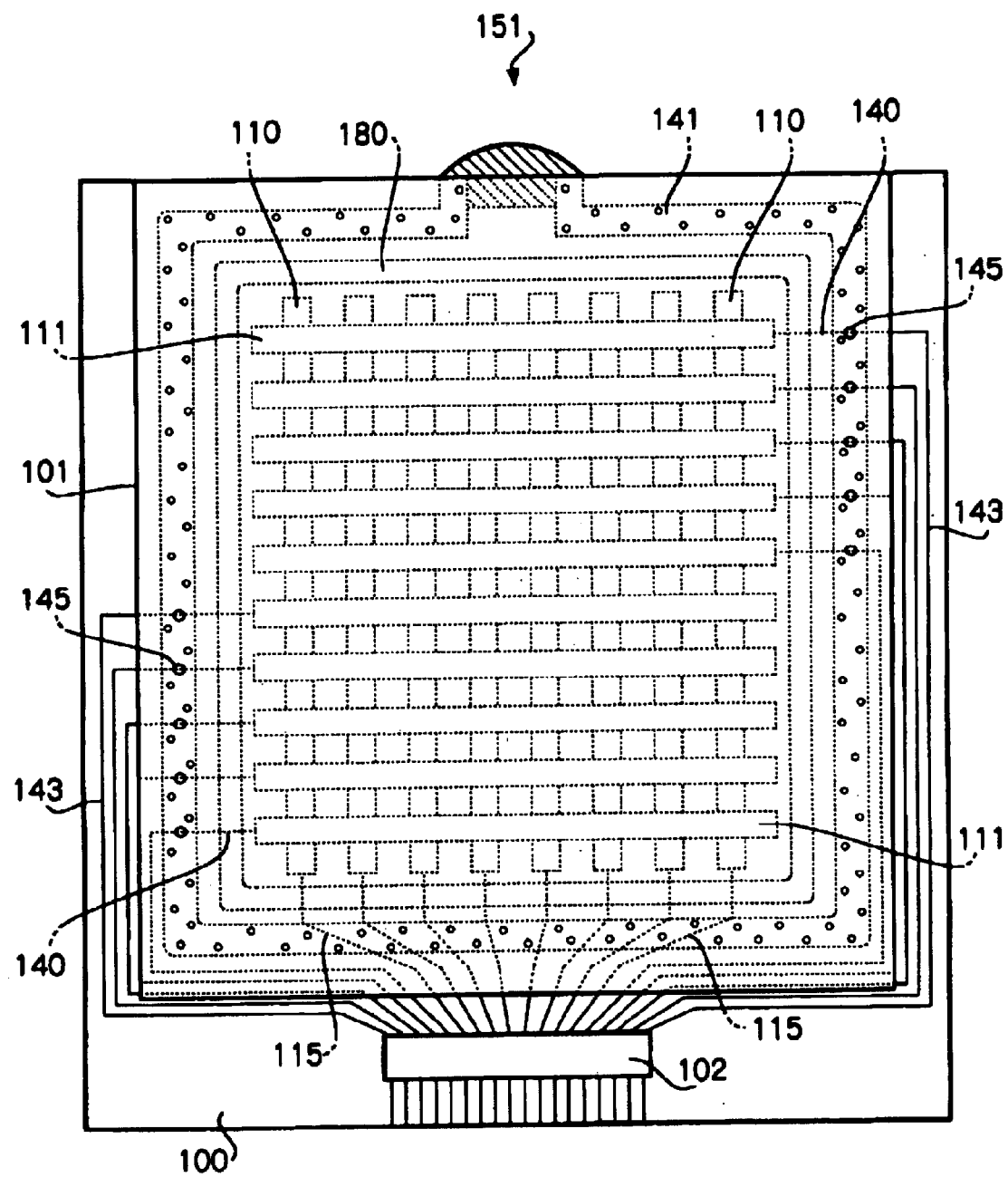
FIG. 14 is a plan view showing another example of a conventional liquid crystal device.

In a conventional liquid crystal device 150 shown in FIG. 13, the wires 140 extend outside the common electrodes 111 and are provided along the peripheral portions of the substrate. Accordingly, the wires 140 and the common electrodes 111 do not overlap each other in plan view, that is, they do not spatially intersect each other, and hence, it has not been necessary to consider about turn-on in the region of the wires 140.

However, in this embodiment shown in FIG. 15, as shown in FIG. 4, since the wires 14 are disposed inside the conductive sealing material 4a, the wires 14 formed on the lower substrate 2 and the common electrodes 11 formed on the upper substrate 3 overlap each other in plan view. In addition, the positions at which the wires 14 and the common electrodes 11 overlap each other are in the region surrounded by the sealing material 4, that is, the region inside the conductive sealing material 4a, and hence, the liquid crystal is present in this region. Accordingly, the wires 14 and the common electrodes 11 oppose each other with the liquid crystal provided therebetween.

In the case in which scanning signals or data signals are supplied to a liquid crystal device having the structure as described above to drive the liquid crystal, and the scanning signals are sequentially supplied to the common electrodes 11 from the top via the wires 14, for example, when a scanning signal is applied to the topmost common electrode 11, the scanning signal is not applied to the common electrode 11 located at the second position from the top. However, since a voltage is applied to the liquid crystal at the position at which the wire 14 connected to the topmost common electrode 11 and the common electrode 11 located at the second position intersect each other, that is, the position indicated by the reference character F in FIG. 4, the liquid crystal at this position is driven, and there may be a disadvantage in that turn-on, that is, a so-called crossline turn-on, occurs in the picture frame region which is naturally a non-lighting region.

Figure 17:
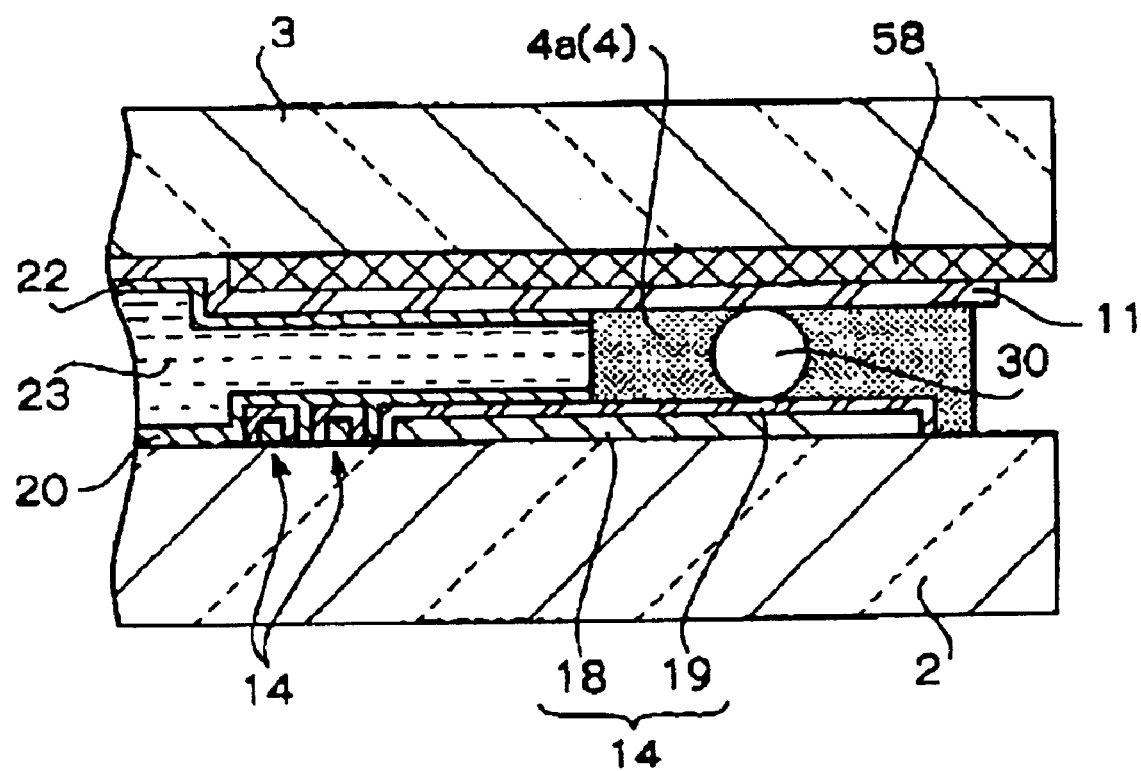
FIG. 17 is a cross-sectional view showing a vertical conduction member of the liquid crystal device shown in FIG. 15.

Concerning this phenomenon, in this embodiment, as shown in FIGS. 15 and 17, since the shading layer 58 is formed on the upper substrate 3 so as to cover all regions in which the wires 14 are formed on the lower substrate 2, even when crossline turn-on occurs in the region other than the display region V as described above, the light is shaded by the shading layer 58, so that the light is prevented from being emitted outside. Accordingly, turn-on in the peripheral region of the substrate, which is unnecessary for display, can be shaded.

In addition, in this embodiment, regions other than that at which crossline turn-on occurs, corresponding to areas at which the wires are formed or the sealing material is formed, are also covered by the shading layer 58. Accordingly, the irregularity in cell thickness caused by the formation of the wires 14, that is, the irregularity in cell gap, in other words, the irregularity in thickness of the liquid crystal layer, can be removed. Consequently, display problems that are caused by the irregularity in cell thickness such as display irregularity or unnecessary coloring, which occurs in the region surrounded by the sealing material 4, can be solved.

Furthermore, leakage of reflected light from the APC film in the region outside the display region V, leakage of light emitted from the lighting apparatus 29 to the rear side, white light emission at a part of the picture frame region which is in the vicinity of the periphery of the substrate, or the like can be simultaneously prevented by the shading layer 58. As described above, by providing the shading layer 58 in the wide area in the vicinity of the periphery of the substrate, the visibility of images created by the liquid crystal device can be improved.

Fifth Embodiment of Electrooptic Device

Figure 18:
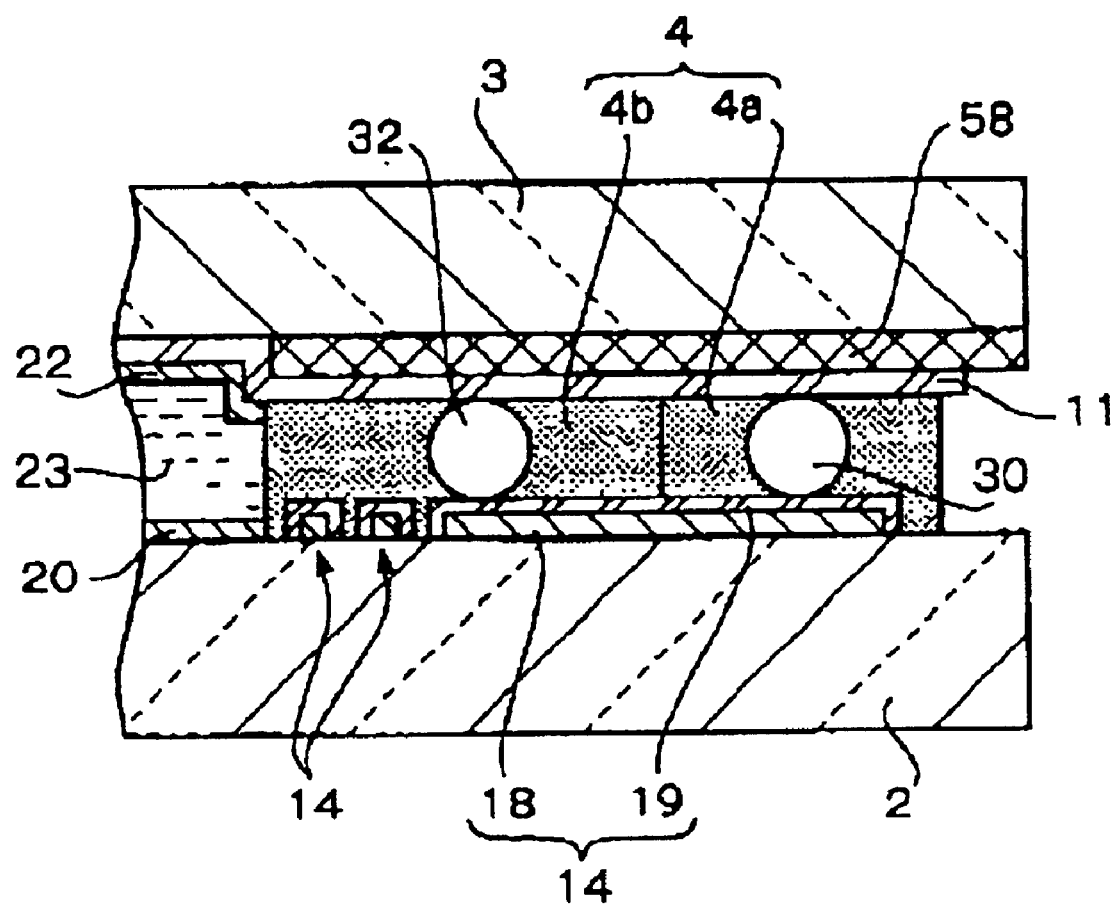
FIG. 18 is a cross-sectional view showing a major portion of a liquid crystal device which is one example of an electrooptic device according to still another embodiment of the present invention.

FIG. 18 shows a liquid crystal device which is one example of an electrooptic device according to still another embodiment of the present invention. In the above embodiment shown in FIG. 7, the sealing material 4 has the double structure composed of the conductive sealing material 4a and the non-conductive sealing material 4b. In addition, in the above embodiment shown in FIG. 15, the shading layer 58 is provided in the wide area in the vicinities of the peripheries of the substrates 2 and 3. In this embodiment shown in FIG. 18, the shading layer 58 having the wide area shown in FIG. 15 is provided for the liquid crystal device having the sealing material 4 formed of the double structure shown in FIG. 7.

In the embodiment shown in FIG. 7, since the wires 14 are disposed in the region in which the non-conductive sealing material 4b is formed, only in the region in which the non-conductive sealing material 4b is formed, a problem of crossline turn-on may not arise even when the common electrodes 11 and the wires 14 intersect each other. However, due to problems of the control of width of the sealing material 4, the control of the position of the sealing material 4, assembly accuracy of the upper substrate 3 and the lower substrate 2, that is, bonding accuracy by the sealing material 4, and the like, the wires 14 may be disposed inside the region in which the sealing material 4 is formed, that is, at the liquid crystal side.

When all the wires 14 are disposed in the region in which the non-conductive sealing material 4b is formed, no problem may arise; however, even when a part of the wire 14 is located inside the region in which the non-conductive sealing material 4b is formed, as a result, a problem of crossline turn-on may arise. Accordingly, even in the liquid crystal device in which the sealing material having the double structure is used, it is preferable that the shading layer 58 be provided in the wide area from the end faces of the substrates 2 and 3 to the inner sides thereof. When the shading layer 58 is provided as described above, light generated by crossline turn-on can be reliably shaded, and hence, the visibility of display can be improved.

Sixth Embodiment of Electrooptic Device

Figure 19:
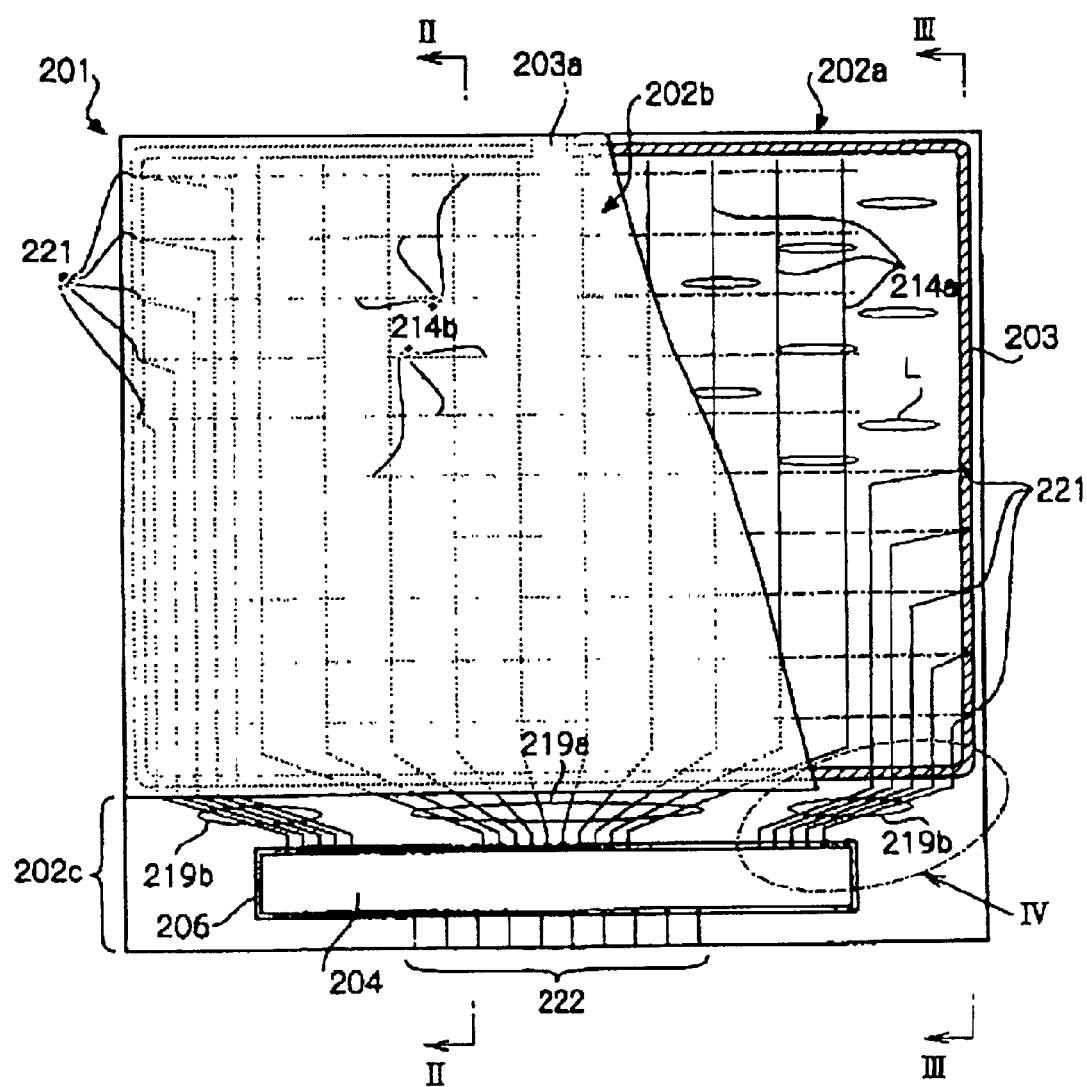
FIG. 19 is a partly cutaway plan view showing a liquid crystal device which is one example of an electrooptic device according to still another embodiment of the present invention.

Hereinafter, a case in which the present invention is applied to a single matrix type and a COG (Chip On Glass) type liquid crystal device will be described, FIG. 19 shows a liquid crystal device according to an embodiment, that is, an electrooptic device according to an embodiment. A liquid crystal device 201 shown in the figure is formed by bonding, that is, adhering, a first substrate 202a disposed at the rear side in the figure to a second substrate 202b disposed in the front side in the figure with a circular sealing material 203.

A region surrounded by the sealing material 203, the first substrate 202a, and the second substrate 202b form a gap having a constant distance, that is, a so-called cell gap. In addition, in a part of the sealing material 203, a liquid crystal injection inlet 203a is formed. In the cell gap described above, liquid crystal L is injected via the liquid crystal injection inlet 203a, and after the injection, the liquid crystal injection inlet 203a is sealed with a resin or the like.

Figure 20:
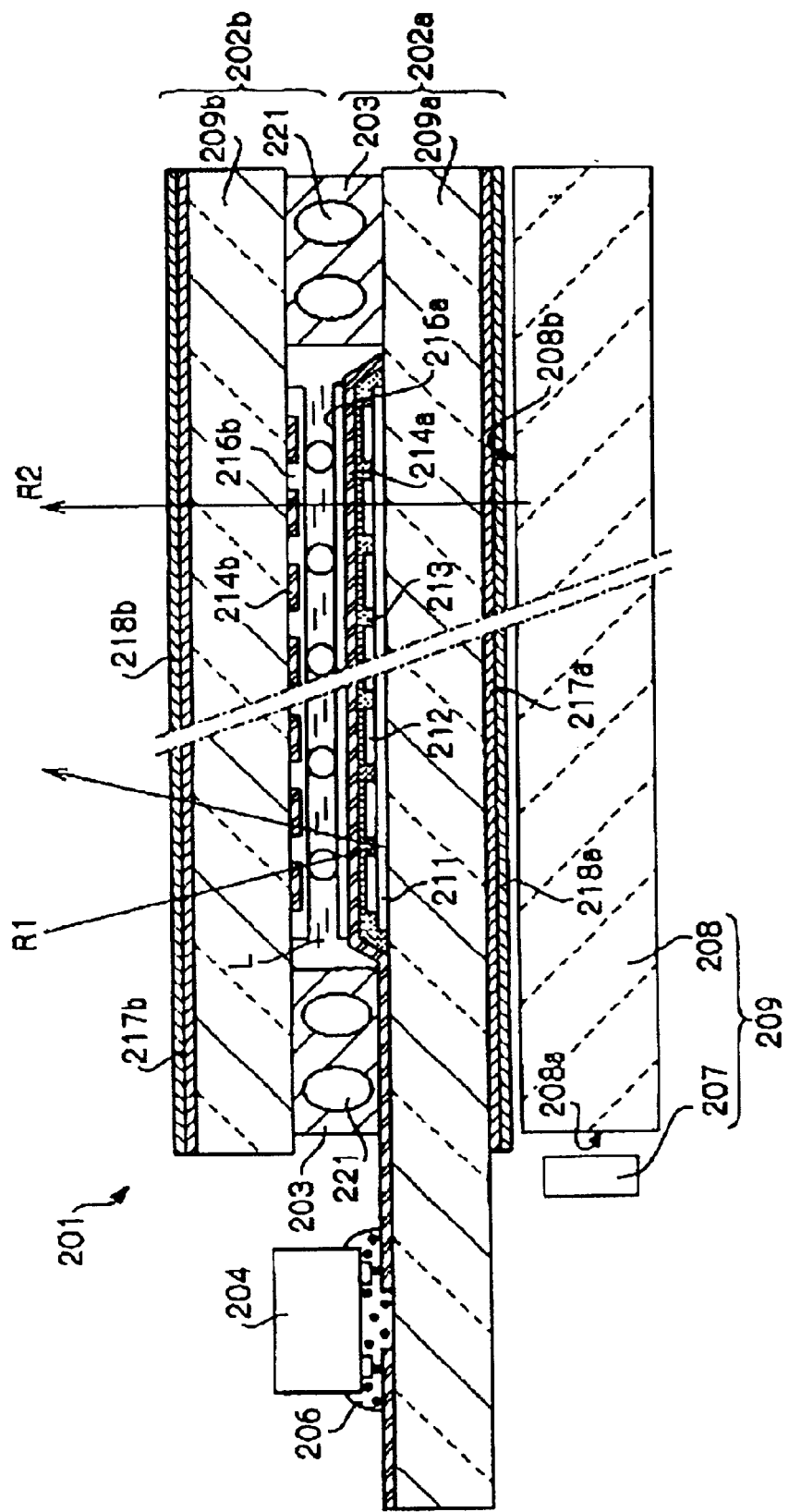
FIG. 20 is a view showing the cross-sectional structure of a display region of the liquid crystal device taken along the line II—II in FIG. 1.

The first substrate 202a has a protruding region 202c protruding from the second substrate 202b, and a driver IC 204 is mounted on this protruding region 202c with a conductive adhesion element such as an ACF (Anisotropic Conductive Film) 206. As shown in FIG. 20 that is a cross-sectional view taken along the line II—II in FIG. 19, on the rear side (lower side of the structure shown in FIG. 20) of the first substrate 202a, a lighting device 209 having a light-emitting source 207 and a light guide body 208 is provided as a backlight.

In FIG. 20, the first substrate 202a has a base member 209a, and on the inside surface of the base member 209a, that is, the surface at the liquid crystal L side, a transflective film 211 is formed, color filters 212 are formed thereon, a planarizing film 213 is formed thereon, first electrodes 214a are formed thereon, and an alignment film 216a is formed thereon. In addition, on the outside surface of the base member 209a, a retardation film 217a is formed, and a polarizer 218a is further formed thereon.

As shown in FIG. 19, the first electrodes 214a are formed in a stripe pattern by disposing a number of linear electrodes parallel with each other. In the figure, in order to facilitate understanding of the electrode pattern, the first electrodes 214a are schematically shown so as to have a larger gap therebetween; however, in practice, the gap between the first electrodes 214a is formed to be very small.

In FIG. 20, the second substrate 202b has a base member 209b, and on the inside surface of the base member 209b, that is, the surface at the liquid crystal L side, second electrodes 214b are formed, and an alignment film 216b is formed thereon. In addition, on the outside surface of the base member 209b, a retardation film 217b is formed, and a polarizer 218b is further formed thereon.

The second electrodes 214b are, as shown in FIG. 19, formed in a stripe pattern by disposing a number of linear electrodes in parallel with each other in the direction perpendicular to the first electrodes 214a. In the figure, in order to facilitate understanding of the electrode pattern, the second electrodes 214b are schematically shown so as to have a larger gap therebetween; however, in practice, the gap between the second electrodes 214b is formed to be very small.

In FIG. 19, intersections of the first electrodes 214a and the second electrodes 214b are disposed in a dot matrix pattern, and each of these crossing points forms one display dot, each of the color patterns of the color filter 212 shown in FIG. 20 corresponds to this display dot. In the color filter 212, one unit composed of, for example, three primary colors R, G, and B forms one pixel. That is, one unit composed of three display dots forms one pixel.

The base members 209a and 209b are formed of, for example, a glass or a plastic. In addition, the transflective film 211 is formed of a light reflective material such as Al (aluminum). However, in order to perform a transflective function, the light reflective material may be formed thin so as to allow light to pass therethrough, or apertures (not shown) may be formed in the transflective film at suitable positions for passing light therethrough at an appropriate area ratio.

The color filter 212 is formed by applying pigments so as to form an optional pattern, such as a mosaic pattern, a stripe pattern, or a delta pattern, by a conventional method for forming color picture elements, such as an inkjet method or a pigment dispersion method. In addition, the planarizing film 213 is formed by uniformly applying an optional light transmissive resin material by, for example, spin coating or roll coating.

The electrodes 214a and 214b are formed into desired patterns by steps of forming films composed of ITO (Indium Tin Oxide) or the like by a conventional method such as sputtering or vacuum deposition, and patterning by a photoetching method. The alignment films 216a and 216b are formed by, for example, a method for applying a polyimide solution followed by firing or an offset printing method.

In FIG. 19, on the protruding region 202c of the first substrate 202a, wires 219a extending directly from the first electrodes 214a and wires 219b which are connected to the second electrodes 214b on the second substrate 202b via a conductive material 221 (see FIG. 20) are formed. In addition, on the end portion of the protruding region 202c, terminals 222 are formed. These wires and terminals are conductively connected to bumps (not shown) of the driver IC 204 via conductive particles in the ACF 206.

In FIG. 20, in order to facilitate understanding of the entire structure of the liquid crystal device 201, a conductive material 221 having an oval shape in cross-sectional view is schematically shown; however, in practice, the conductive material 221 is formed into a spherical or a cylindrical form, and the side thereof is very small compared to the line width of the sealing material 203. Accordingly, a plurality of particles of the conductive material 221 is present in the line width direction of the sealing material 203.

Since the liquid crystal device 201 of this embodiment is formed as described above, two display modes, that is, reflective display and transmissive display, can be selectively performed. In reflective display, as indicated by the arrow R1 in FIG. 20, external light incident on the second substrate 202 is reflected from the transflective film 211 and is then supplied to the liquid crystal L layer. In this state, by controlling a voltage applied to the liquid crystal L of each display dot so as to adjust the orientation of the liquid crystal in each display dot, the light supplied to the liquid crystal L layer is modulated by each display dot, and the modulated light is then supplied to the polarizer 218b. Accordingly, images such as letters are displayed at the second substrate 202b side.

On the other hand, when transmissive display is performed by the liquid crystal device 201, light is emitted form the light-emitting source 207 of the lighting apparatus 209. Light R2 from the light-emitting source 207 is transmitted through a light incident surface 208a, is then introduced into the light guide body 207, is propagated evenly inside the light guide body 208, and is then emitted outside from a light-emitting surface 208b. Accordingly, light thus emitted is supplied to the liquid crystal L layer. Display is performed by modulating this light by the liquid crystal L in a manner equivalent to that in the reflective display.

As shown in FIG. 19, the wires 219b are provided on the first substrate 202a and are connected to the second electrodes 214b on the second substrate 202b via the conductive material 221. In this embodiment, the wires 219b extend from the protruding region 202c, pass through the sealing material 203, and then enter the region surrounded thereby, in which the liquid crystal is enclosed. The wires 219b are then electrically connected to the second electrodes 214b via the conductive material 221 dispersed in the sealing material 203.

Figure 21:
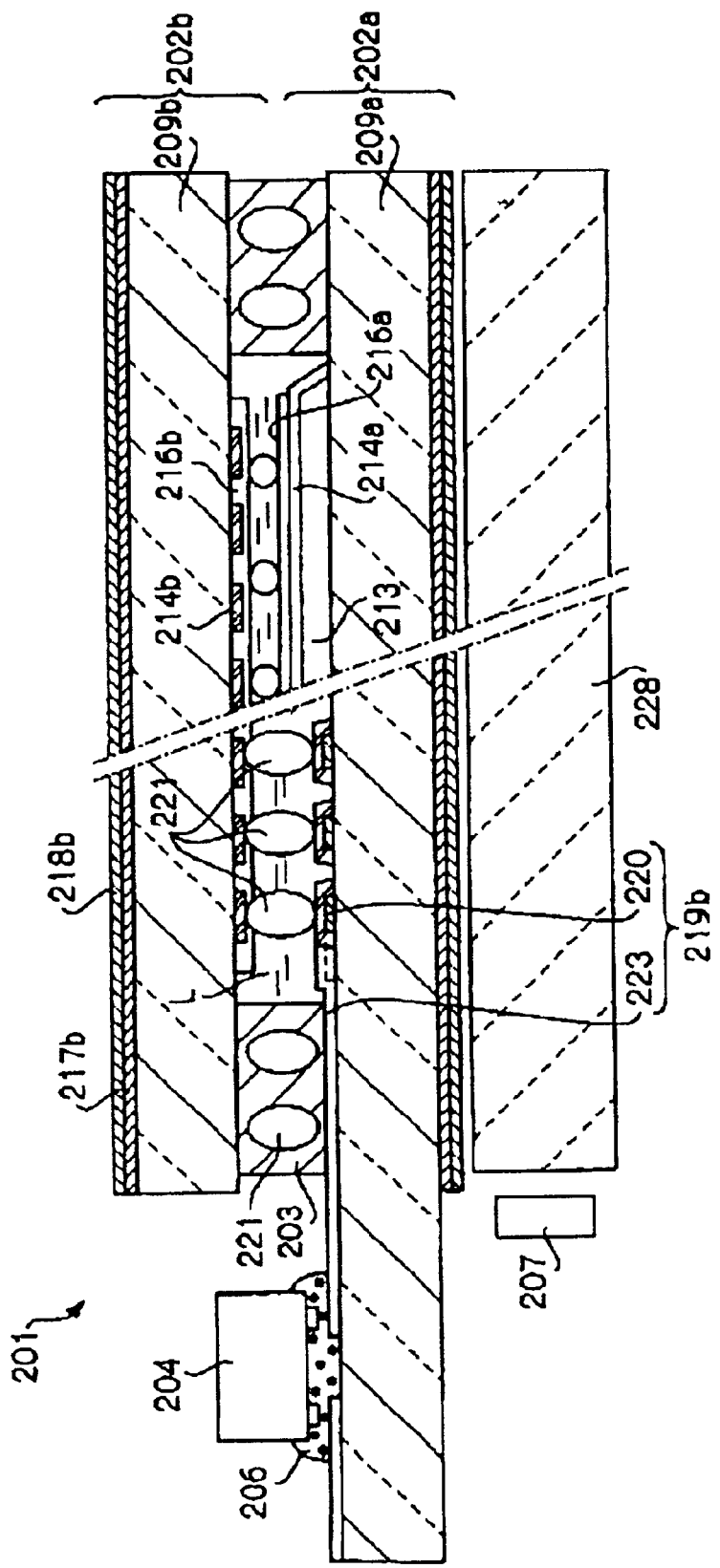
FIG. 21 is a view showing the cross-sectional structure of the vertical conduction member of the liquid crystal device taken along the line III—III in FIG. 1.
Figure 22:
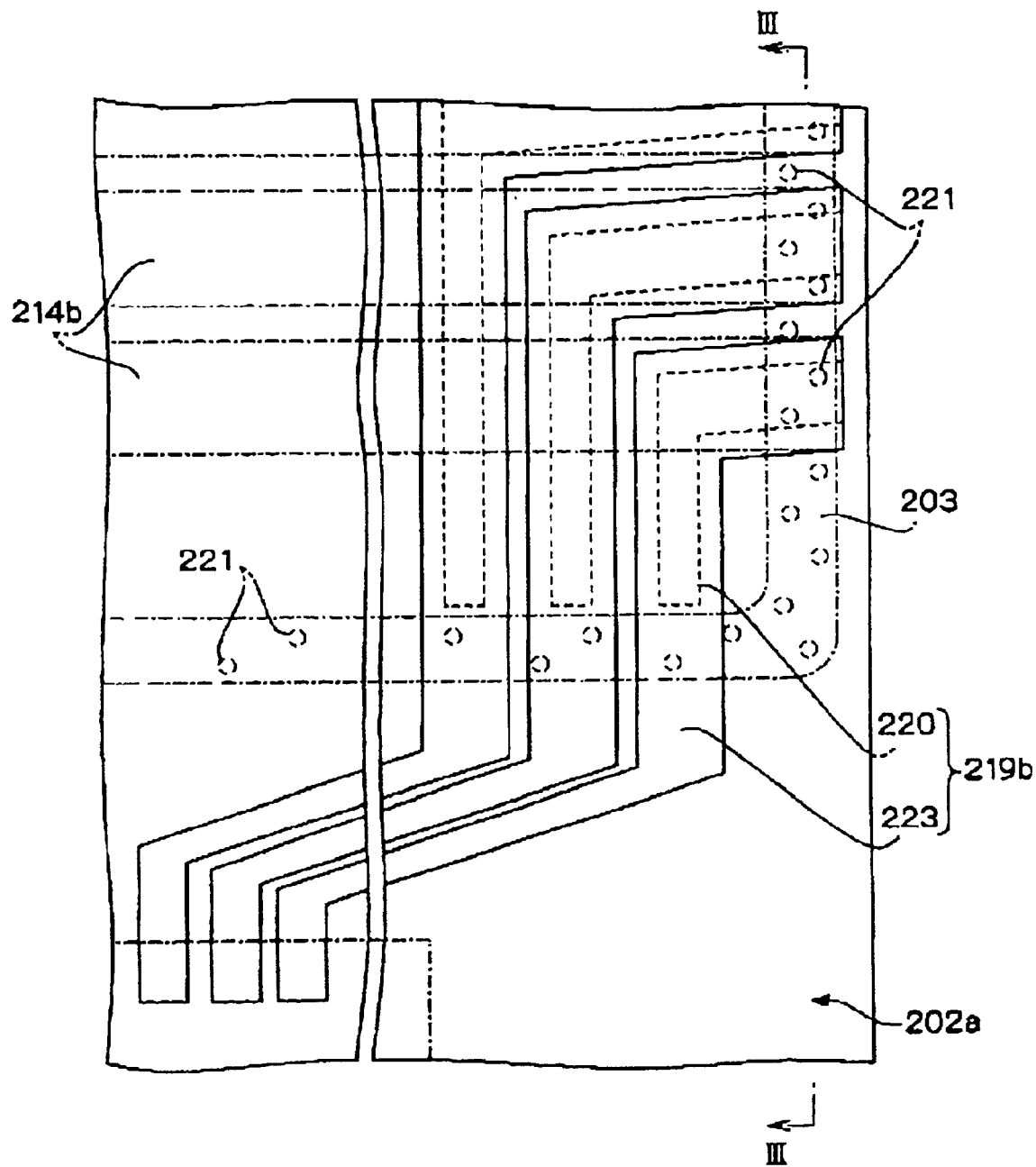
FIG. 22 is an enlarged plan view showing a wire portion indicated by the arrow IV in FIG. 1.

In addition, as shown in FIG. 21 which is a cross-sectional view taken along the line III—III in FIG. 19 and in FIG. 22 which is an enlarged view of a part shown in FIG. 19 indicated by the arrow IV, the wire 219b has a laminated structure formed of a conductive film 220 as a first layer and a conductive film 223 as a second layer. The conductive film 220 is formed of, for example, an APC alloy containing Ag as a primary component and Pd and Cu as an additive. In addition, the conductive film 223 is simultaneously formed when the first electrodes 214a are patterned, that is, the conductive film 223 is formed of the same layer as that for forming the first electrodes 214a. As a result, the conductive film 223 is formed of ITO which is also used for forming the first electrodes 214a.

Since the wire 219 of this embodiment comprises the APC alloy having a resistance lower than that of ITO, as described above, the wiring resistance of the wire 219b is low compared to that of a wire only containing ITO. Accordingly, the deformation of waveform of signals passing through the wire 219b may not occur, and hence, an image having superior display quality can be created on the display region of the liquid crystal device 201.

The APC alloy has the superior low resistance property described above; however, there has been a problem in that the alloy is susceptible to corrosion. When corrosion of the wires 219b occurs, a voltage applied to the liquid crystal L may not be normally controlled in some cases, and as a result, the display quality may not be maintained at a higher level.

Concerning this problem, in this embodiment, the conductive films 220 composed of the APC alloy are disposed in the region surrounded by the sealing material 203, that is, the region in which the liquid crystal L is enclosed, so as not to be disposed outside the sealing material 203. As a result, the conductive film 220 is prevented from being exposed to outside air, thereby preventing corrosion generated on the film 220.

In FIG. 22, in order to facilitate understanding of the relation between the wire 219b and the sealing material 203, the line width of the wire 219b with respect to that of the sealing material 203 is shown wider than the actual width; however, in practice, the width of the wire 219b is smaller than that of the sealing material 203 in many cases. In the case described above, the wire 219b may be disposed in the width region of the sealing material 203. That is, the wire 219b may be disposed in the region in which the sealing material 203 is formed.

In the case shown in FIGS. 21 and 22, the whole conductive film 220 is disposed in the region surrounded by the sealing material 203; however, in place of that, the conductive film 220, which is disposed inside the conductive film 223, may extend past the sealing material 203 so that a part of the conductive film 220 is disposed in the region surrounded by the sealing material 203 and the other part of the conductive film 220 is disposed outside the sealing material 203.

Seventh Embodiment of Electrooptic Device

Figure 23:
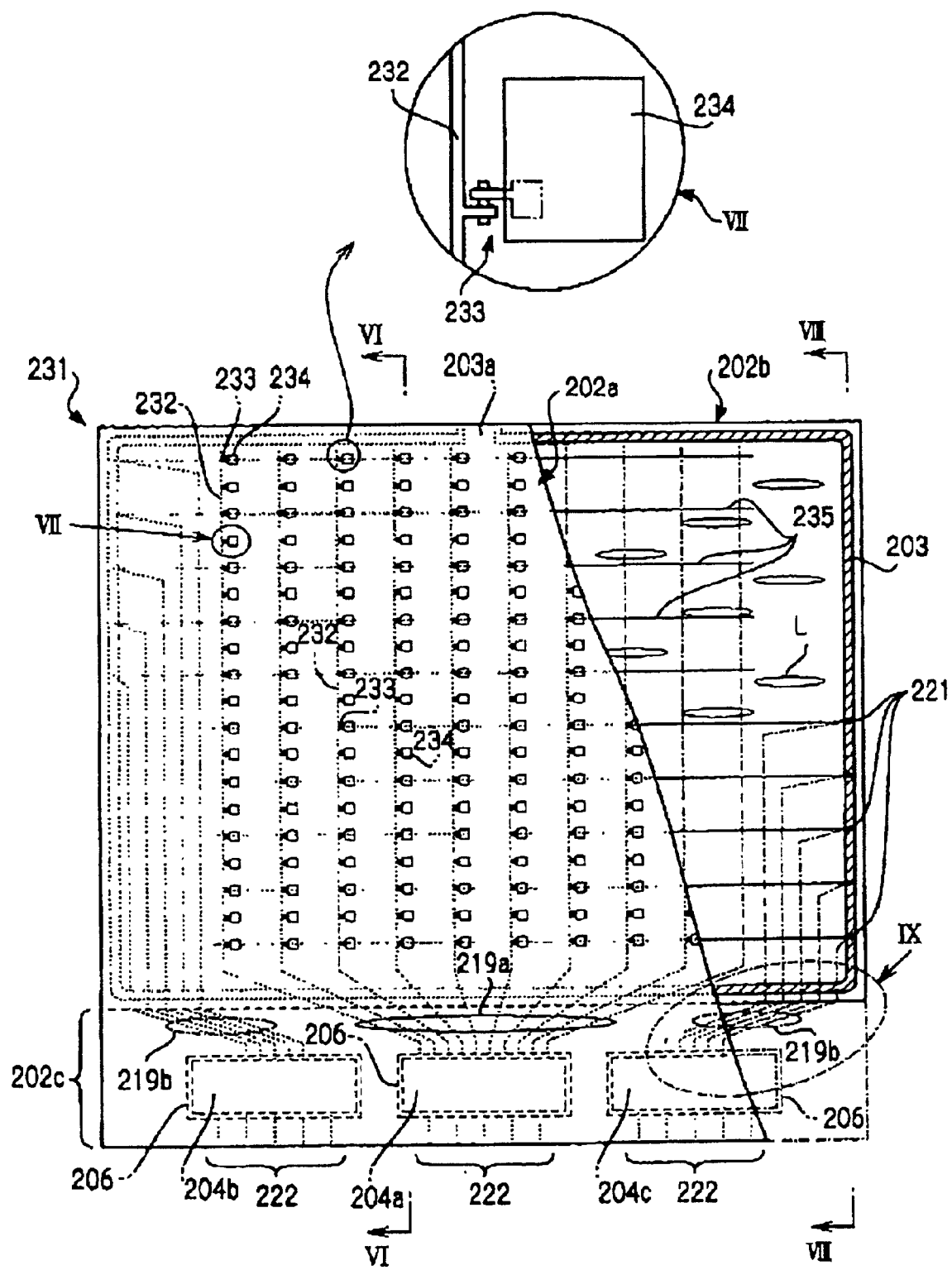
FIG. 23 is a partly cutaway plan view showing a liquid crystal device which is one example of an electrooptic device according to still another embodiment of the present invention.

FIG. 23 shows an embodiment in which the present invention is applied to an active matrix type and a COG type liquid crystal device using TFD's as a switching element. A liquid crystal device 231 shown in this embodiment is formed by bonding, that is, adhering, the first substrate 202a disposed in the front side of the figure to the second substrate 202b disposed at the rear side in the figure with the circular sealing material 203 therebetween.

Figure 24:
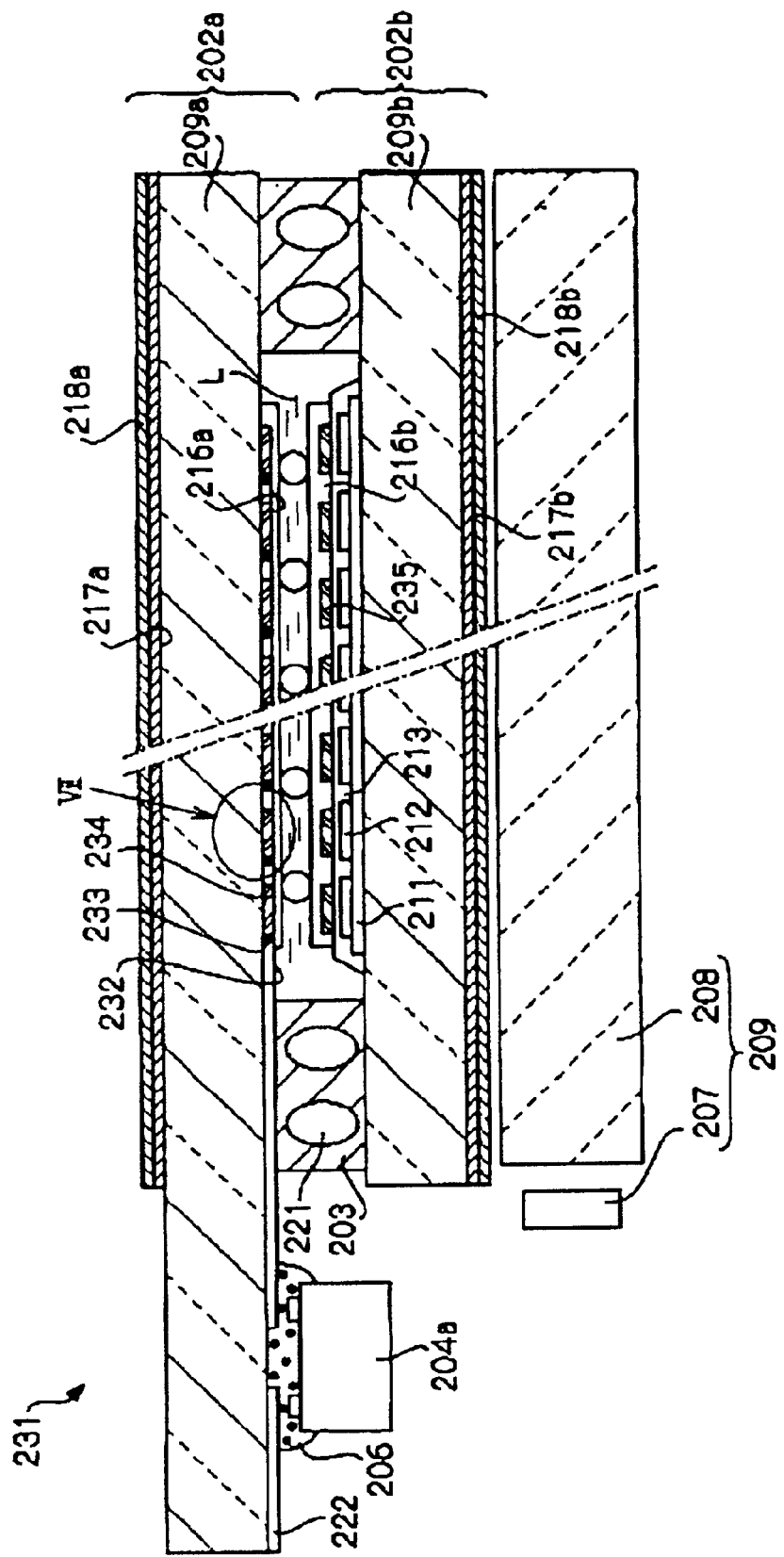
FIG. 24 is a view showing the cross-sectional structure of a display region of the liquid crystal device taken along the line VI—VI in FIG. 5.

The sealing material 203, the first substrate 202a, and the second substrate 202b form the cell gap, and the liquid crystal L is enclosed in this cell gap in a manner equivalent to that of the liquid crystal device 201 shown in FIG. 19. FIG. 24 is a cross-sectional view of the display region of the liquid crystal device 231 taken along the line VI—VI in FIG. 23. As shown in FIG. 24, at the rear side of the second substrate 202b, the lighting apparatus 209 having the light-emitting source 207 and the light guide body 208 is provided as a backlight.

In FIG. 23, the first substrate 202a has the protruding region 202c protruding from the second substrate 202b, and on this protruding region 202c, three driver IC 204a, 204b, and 204c are mounted with conductive adhesion elements, such as the ACF (Anisotropic Conductive Film) 206. In this embodiment, the reason three driver IC's are used in a manner different from that of the embodiment shown in FIG. 19 is that a voltage at the first substrate 202a side and a voltage at the second substrate 202b side, that is, a voltage used for a scanning line drive system and a voltage used for a signal line drive system, are different from each other, and these voltages cannot be controlled by one IC chip.

In FIG. 24, the first substrate 202a has the base member 209a, and on the inside surface of the base member 209a, that is, the surface at the liquid crystal L side, line wires 232, TFD's 233 electrically connected to the line wires 232, and pixel electrodes 234 electrically connected to the line wires 232 via the TFD's 233 are formed. In addition, on the pixel electrodes 234, the TFD's 233, and the line wires 232, an alignment film 216a is formed. In addition, on the outside surface of the base member 209a, the retardation film 217a is formed, and the polarizer 218a is further formed thereon.

The line wires 232 are, as shown in FIG. 23, formed parallel with each other so as to form a stripe pattern, the pixel electrodes 234 are provided between the line wires 232 so as to form a dot matrix pattern, and the TFD's 233 are each provided for the corresponding pixel electrode 234 so as to be electrically connected to the line wire at one end of the TFD and to be electrically connected to the pixel electrode 234 at the other end thereof.

Figure 25:
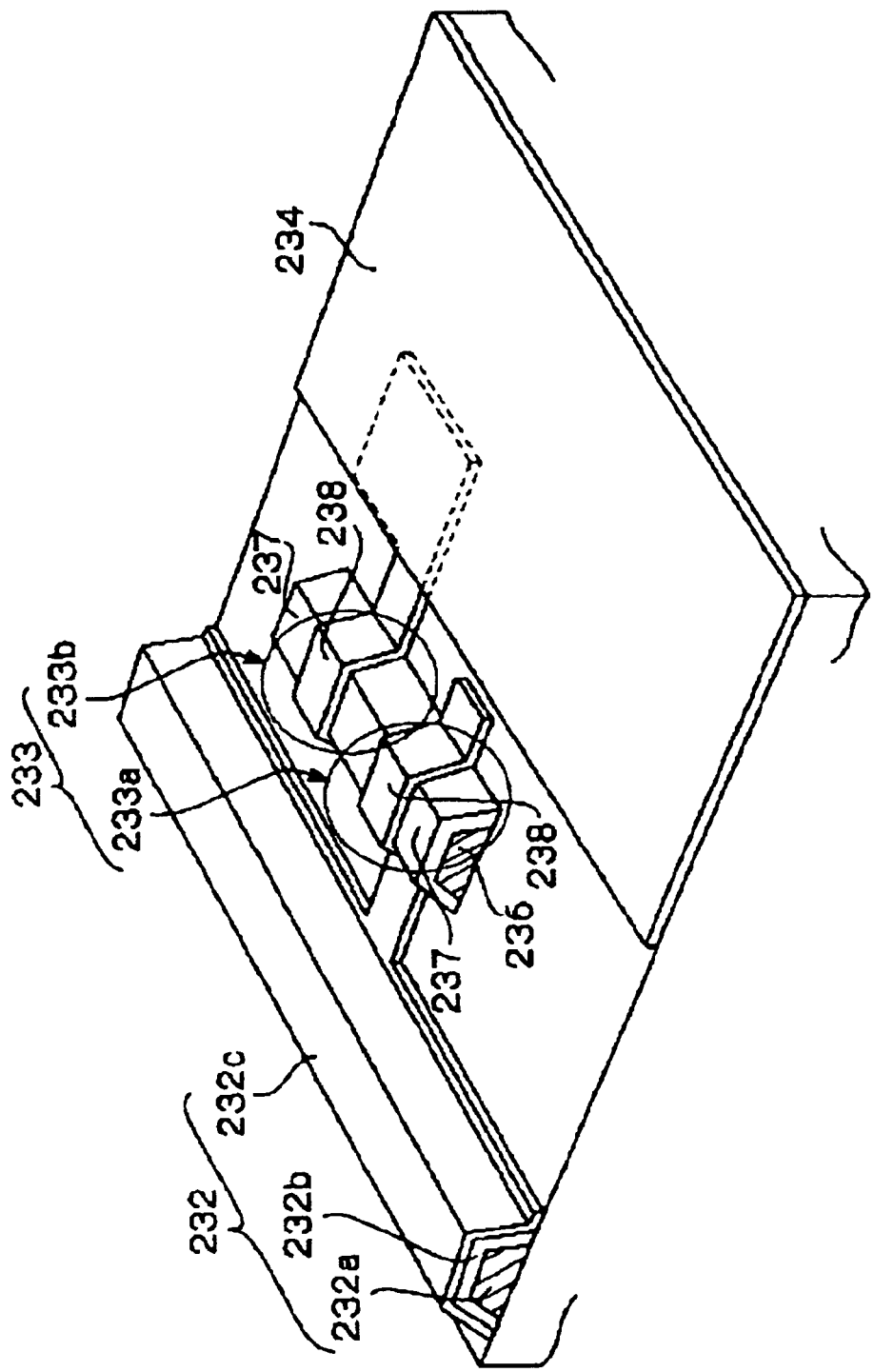
FIG. 25 is an enlarged perspective view showing a switching element portion indicated by the arrow VII in FIGS. 23 and 24.

The structure of the vicinity of one TFD indicated by the arrow VII in FIGS. 23 and 24 is shown in FIG. 25 by way of example. FIG. 25 shows a TFD having a so-called back-to-back structure. As shown in FIG. 25, the line wire 232 has a three-layered structure comprising a first layer 232a composed of, for example, TaW (tantalum tungsten), a second layer 232b composed of, for example, $Ta_2O_5$ (tantalum oxide) which is an anodized film, and a third layer 232c composed of, for example, Cr.

In addition, the TFD 233 is formed of a first TFD portion 233a and a second TFD portion 233b connected thereto in series. The first TFD portion 233a and the second TFD portion 233b each has a three-layered structure comprising a first metal layer 236 composed of TaW, an insulting layer 237 composed of $Ta_2O_5$ formed by anodizing, and a second metal layer 238 composed of Cr which is the same layer as that forming the third layer 232c of the line wire 232.

When the first TFD portion 233a is viewed from the line wire 232 side, a laminated structure composed of the second metal layer 238, the insulating layer 237, and the first metal layer 236 is formed, and on the other hand, when the second TFD portion 233b is viewed from the line wire 232 side, a laminated structure composed of the first metal layer 236, the insulating layer 237, and the second metal layer 238 is formed. As described above, by forming the TFD having a back-to-back structure in which the two TFD portions 233a and 233b are connected in series and electrically opposite to each other, the switching properties of the TFD can be stabilized. The pixel electrode 234 is formed of, for example, ITO so as to be electrically connected to the second metal layer 238 of the second TFD portion 233b.

In FIG. 24, the second substrate 202b has the base member 209b, and on the inside surface of the base member 209b, that is, the surface at the liquid crystal L side, the transflective film 211 is formed, the color filters 212 are formed thereon, the planarizing film 213 is formed thereon, second electrodes 235 are formed thereon, and the alignment film 216b is formed thereon. In addition, on the outside surface of the base member 209b, the retardation film 217b is formed, and the polarizer 218b is further formed thereon.

The second electrodes 234 are, as shown in FIG. 23, formed parallel with each other so as to intersect a plurality of the line wires 232, thereby forming a stripe pattern. In the figure, in order to facilitate understanding of the electrode pattern, the second electrodes 235 are schematically shown so as to have a larger gap therebetween; however, in practice, the gap between the second electrodes 235 is formed to be very small in accordance with the size of the dot pitch.

The intersections of the pixel electrodes 234 and the second electrodes 235 are disposed in a dot matrix, each intersection forms one display dot, and each color pattern of the color filter 212 in FIG. 24 corresponds to one display dot. In the color filter 212, three primary colors, such as R, G, and B, form one unit, and this one unit forms one pixel. That is, one unit composed of three display dots forms one pixel.

The base members 209a and 209b, the transflective film 211, the color filter 212, and the alignment films 216a and 216b may be formed of the same materials and by the same methods as those used in the embodiment shown in FIG. 19. In addition, the pixel electrodes 234 and the second electrodes 235 may be formed in a manner equivalent to that for the electrodes 214a and 214b of the embodiment shown in FIG. 19.

In FIG. 23, on the protruding region 202c of the first substrate 202a, the wires 219a extending directly from the line wires 232 and the wires 219b connected to the second electrodes 234 on the second substrate 202b via the conductive material 221 (see FIG. 24) dispersed in the sealing material 203 are formed. In addition, on the peripheral portion of the protruding region 202c, the terminals 222 are formed.

In FIG. 24, in order to facilitate understanding of the entire structure of the liquid crystal device 231, a conductive material 221 having an oval shape in cross-sectional view is schematically shown; however, in practice, the conductive material 221 is formed into a spherical or a cylindrical form, and the size thereof is very small compared to the line width of the sealing material 203. Accordingly, a plurality of the particles of the conductive material 221 is present in the line width direction of the sealing material 203.

Since the liquid crystal device 231 in this embodiment is formed as described above, two display modes, that is, reflective display and transmissive display, can be selectively performed as is the liquid crystal device 201 shown in FIG. 19. Since light passes through the device of each display mode in a manner equivalent to that described with reference to FIG. 19, the detailed description thereof is omitted. Concerning a method for modulating light, in the case of the single matrix method shown in FIG. 19, light modulation is performed by controlling a voltage applied between the first electrode 214a and the second electrode 214b, and in this embodiment shown in FIG. 24, the orientation of the liquid crystal molecules is controlled in accordance with switching operation of the TFD 233, thereby controlling the modulation of light passing through the liquid crystal layer.

In this embodiment, the wires 219b, which are provided on the first substrate 202a and which are connected to the second electrodes 235 on the second substrate 202b via the conductive material 221, as shown in FIG. 23, extend from the protruding region 202c, pass through the sealing material 203, and enter the region surrounded thereby, in which the liquid crystal is enclosed. The wires 219b are then electrically connected to the second electrodes 235 via the conductive material 221 dispersed in the sealing material 203.

Figure 26:
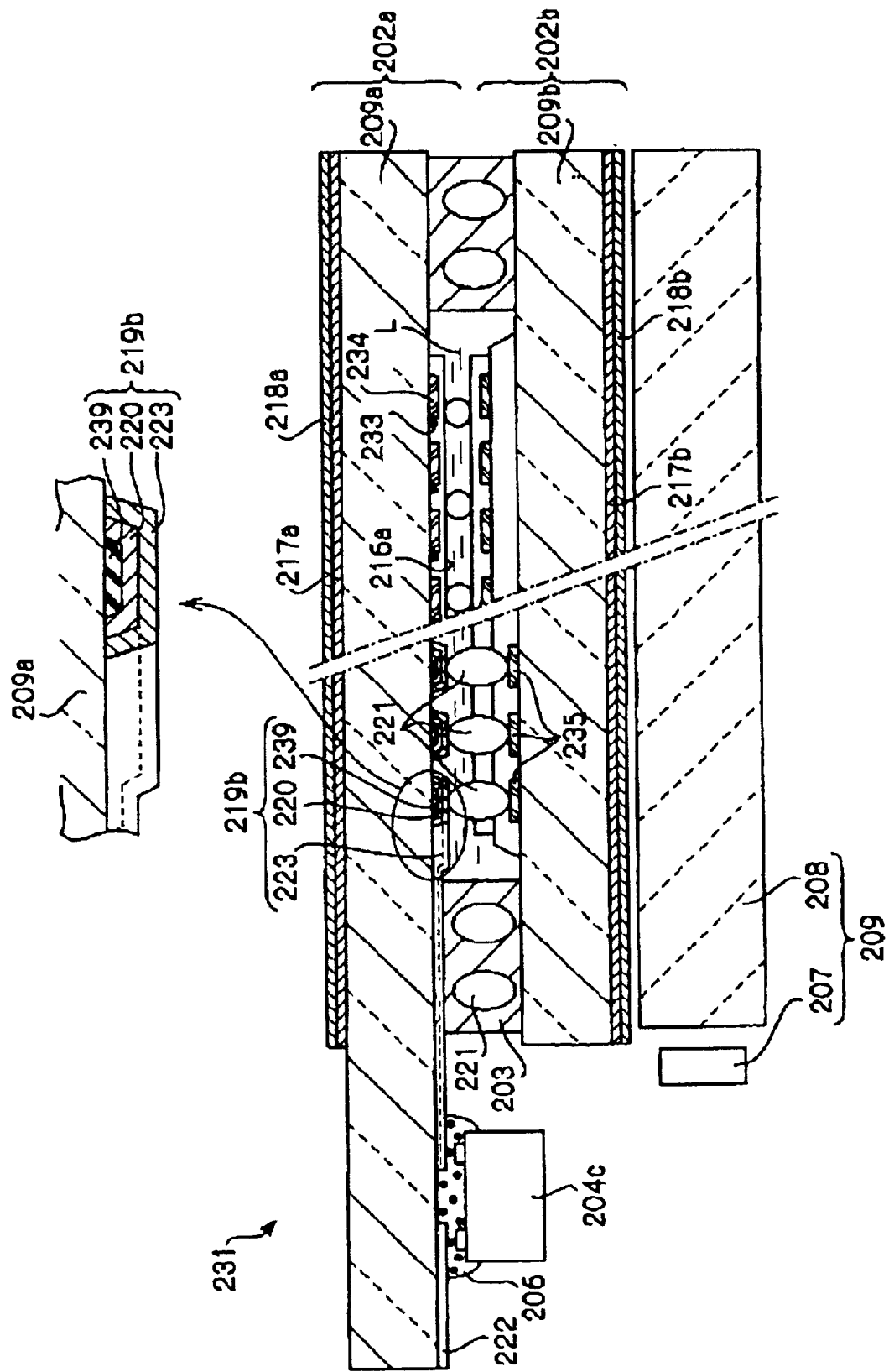
FIG. 26 is a view showing the cross-sectional structure of a vertical conduction member of the liquid crystal device taken along the line VIII—VIII in FIG. 23.
Figure 27:
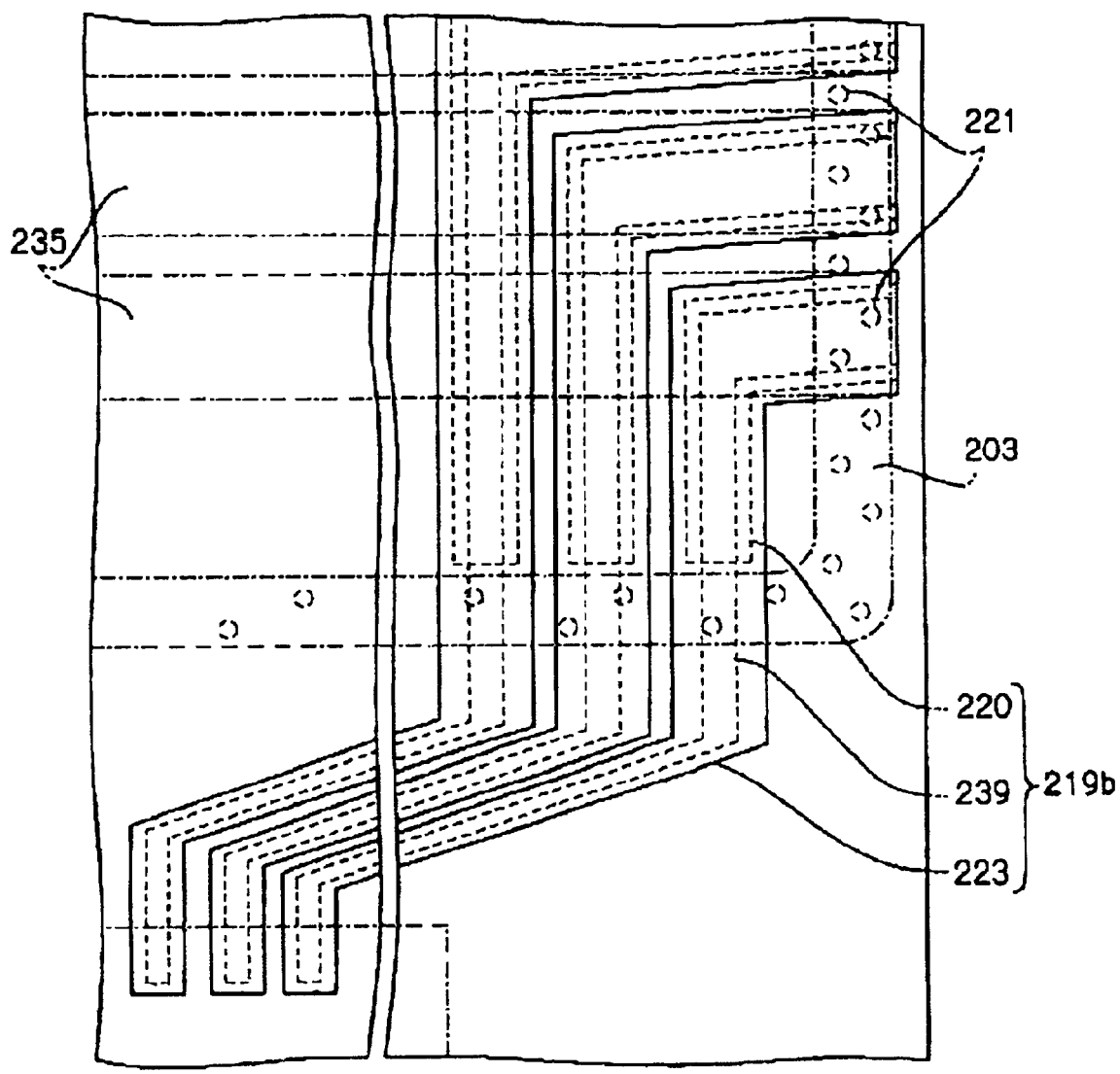
FIG. 27 is an enlarged plan view showing a wire portion indicated by the arrow IX in FIG. 23.

In addition, as shown in FIGS. 26 and 27, the wire 219b has a laminated structure composed of TaW as a first layer 239, the conductive film 220 as a second layer, and the conductive film 223 as a third layer. The conductive film 220 may be formed of, for example, the same layer as that for the second metal layer 238 of the TFD 233 on the first substrate 202a, and in the case described above, the conductive film 220 is formed of Cr. In addition, the conductive film 223 is formed simultaneously when the pixel electrode 234 is formed on the first substrate 202a by patterning, that is, the conductive film 223 and the pixel electrode 234 are formed of the same layer. As a result, the conductive film 223 is formed of the ITO that also forms the pixel electrode 234.

The wire 219b of this embodiment comprises Cr having a resistance lower than that of ITO, and hence, the wiring resistance of the wire 219b is low compared to that formed of ITO itself. Accordingly, the deformation of waveforms of signals passing through the wire 219b may not occur, and hence, an image having superior display quality can be created on the display region of the liquid crystal device 231.

Cr has the superior low resistance property described above; however, it also has a problem in that corrosion is likely to occur. When corrosion occurs on the wires 219b, a voltage applied to the liquid crystal L may not be normally controlled in some cases, and as a result, the display quality may not be maintained at a higher level.

Concerning this problem, in this embodiment, the conductive films 220 composed of Cr are disposed in the region surrounded by the sealing material 203, that is, the region in which the liquid crystal L is enclosed, so as not to extend outside the sealing material 203. As a result, the conductive film 220 is prevented from being exposed to outside air, whereby corrosion generated on the film 220 is prevented.

In FIG. 27, in order to facilitate understanding of the relation between the wire 219b and the sealing material 203, the line width of the wire 219b with respect to that of the sealing material 203 is shown wider than the actual width; however, in practice, the width of the wire 219b is smaller than that of the sealing material 203 in many cases. In the case described above, the wire 219b may be disposed in the width region of the sealing material 203. That is, the wire 219b may be disposed in the region in which the sealing material 203 is formed.

In the case shown in FIGS. 26 and 27, the whole conductive film 220 is disposed in the region surrounded by the sealing material 203; however, in place of that, the conductive film 220, which is disposed inside the conductive film 223, may extend past the sealing material 203 so that a part of the conductive film 220 is disposed in the region surrounded by the sealing material 203 and the other part of the conductive film 220 is disposed outside the sealing material 203.

Eighth Embodiment of Electrooptic Device

Figure 28:
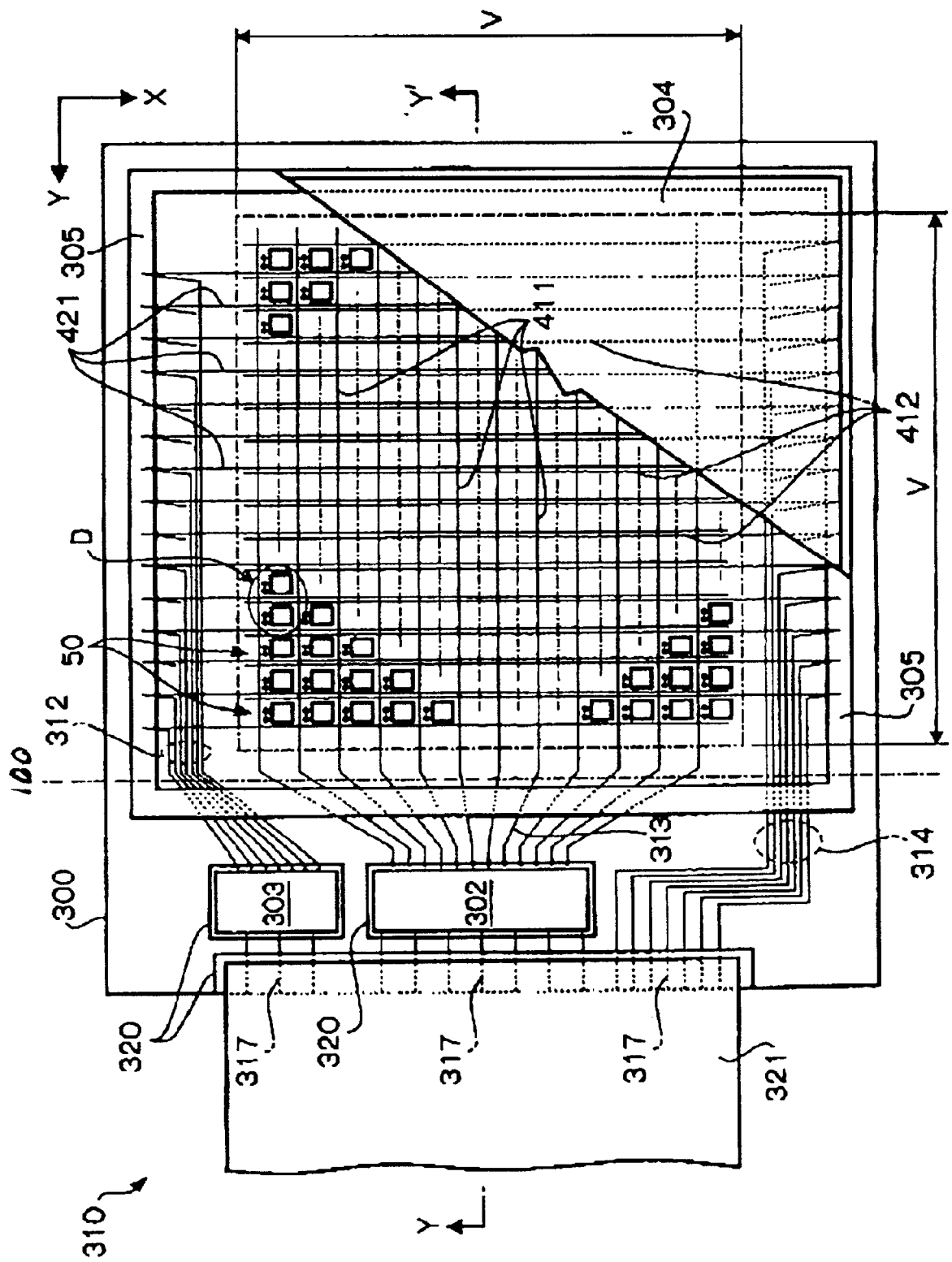
FIG. 28 is a partly cutaway plan view showing an EL device which is one example of an electrooptic device according to still another embodiment of the present invention.
Figure 29:
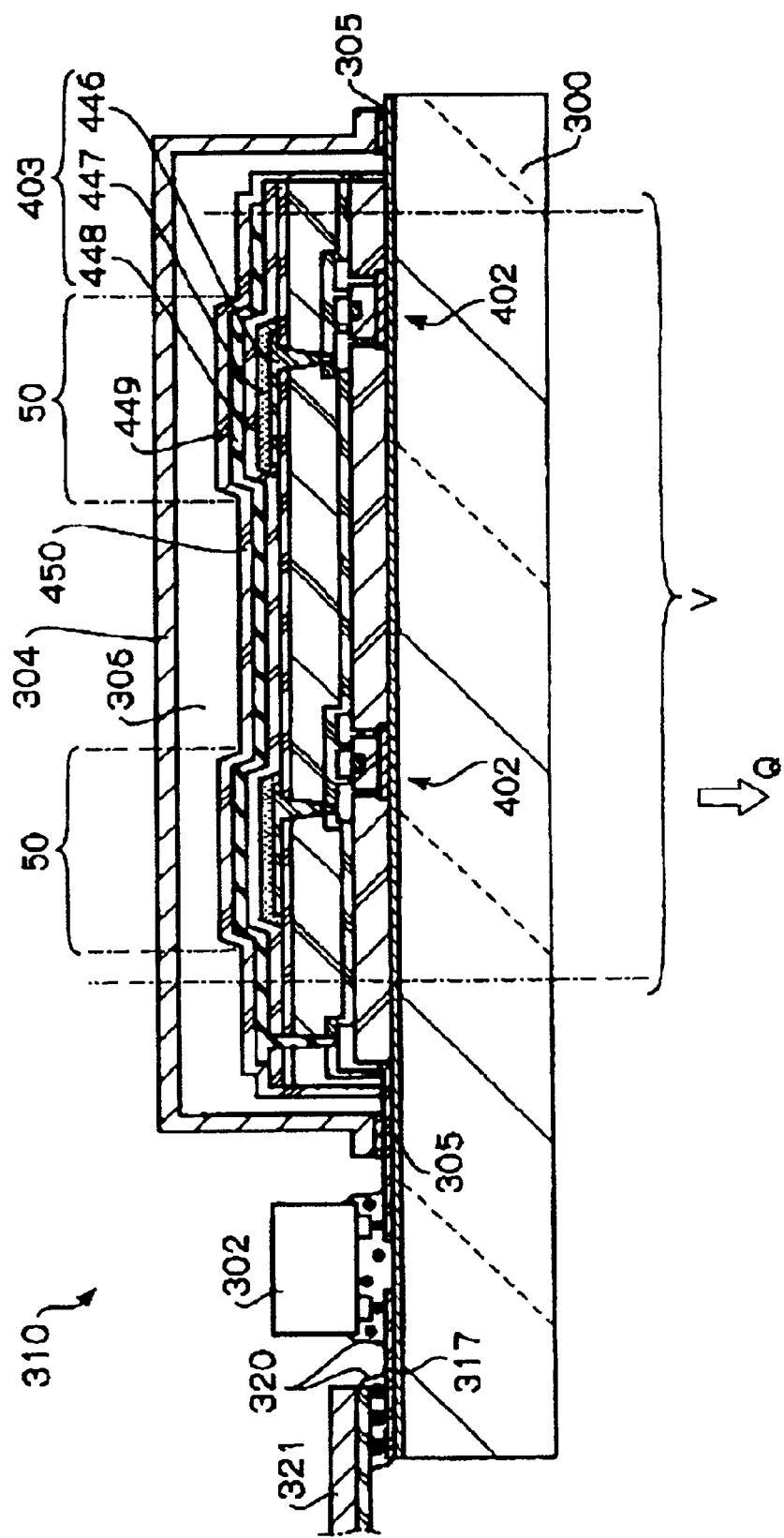
FIG. 29 is a view showing the cross-sectional structure of the EL device taken along the line Y–Y' in FIG. 28.

FIG. 28 shows an active matrix type EL (Electro Luminescent) device 310 which is one example of an electrooptic device according to an embodiment of the present invention. In addition, FIG. 29 is a cross-sectional view of the EL device 310 taken along the line Y–Y' in FIG. 28.

In these figures, on a substrate 300, a region in which a plurality of pixels is formed, that is, the display region V, is formed. In addition, a gate side driver IC 302 and a source side driver IC 303 are mounted on the substrate 300 with an ACF 320. In addition, an FPC 320 is connected to the end portion of the substrate 300 with the ACF 320. Output terminals of the FPC 321 and input terminals of the driver IC's 302 and 303 are connected to each other via external connection terminals 317 formed on the substrate 300.

In each of the driver IC's 302 and 303, for example, a shift register circuit, a buffer circuit, a level shifter circuit, a sampling circuit, and the like are included. In addition, when digital drive is performed, a signal conversion circuit such as a D/A converter may also be included. Furthermore, circuits corresponding to the driver IC's 302 and 303 may be formed on the substrate 300 simultaneously when semiconductor elements or the like are formed in the display region V In the case described above, in addition to the circuit structure formed in the display region V and the circuit structure corresponding to the driver IC's 302 and 303, logic circuits, such as a signal dividing circuit, a D/A converter, an operational amplifier circuit, or a γ-correction circuit, may also be formed directly on the substrate 300. Furthermore, memory portions, microprocessors, and the like may also be formed directly on the substrate 300.

To the substrate 300, a housing 304 is tightly bonded with an adhesive 305. This housing 304 is provided so as to at least surround the display region V. This housing 304 has a shape having a recess portion in which the inside height thereof is larger than the height of the display region or has a sheet shape having no recess portion. The housing 304 tightly bonded with the adhesive 305 forms a closed space around the display region V in cooperation with the substrate 300. In the step described above, a plurality of EL elements formed in the display region V is completely enclosed in this closed space and is completely isolated from outside air.

A material of the housing 304 is preferably an insulating material such as a glass or a polymer. For example, there may be mentioned an amorphous glass such as a borosilicate glass or quartz, a crystallized glass, a ceramic glass, organic resins (for example, acrylic resins, styrene resins, polycarbonate resins, or epoxy resins), or silicone resins. In addition, when the adhesive 305 is an insulating material, a metal material such as a stainless alloy may also be used.

As the adhesive 305, for example, an epoxy-based or an acrylic-based adhesive may be used. In addition, a thermosetting resin or a photocurable resin may also be used as an adhesive. However, a material not substantially transmitting oxygen or moisture therethrough must be used.

In FIG. 29, the space 306 between the housing 304 and the substrate 300 is preferably filled with an inert gas such as argon, helium, or nitrogen. In addition, in place of the gas, an inert liquid such as a liquid fluorinated hydrocarbon represented by, for example, perfluoroalkane may also be used. In addition, it is also effective that a desiccant be placed in the space 306, and as the desiccant mentioned above, barium oxide may be mentioned by way of example.

Figure 30:
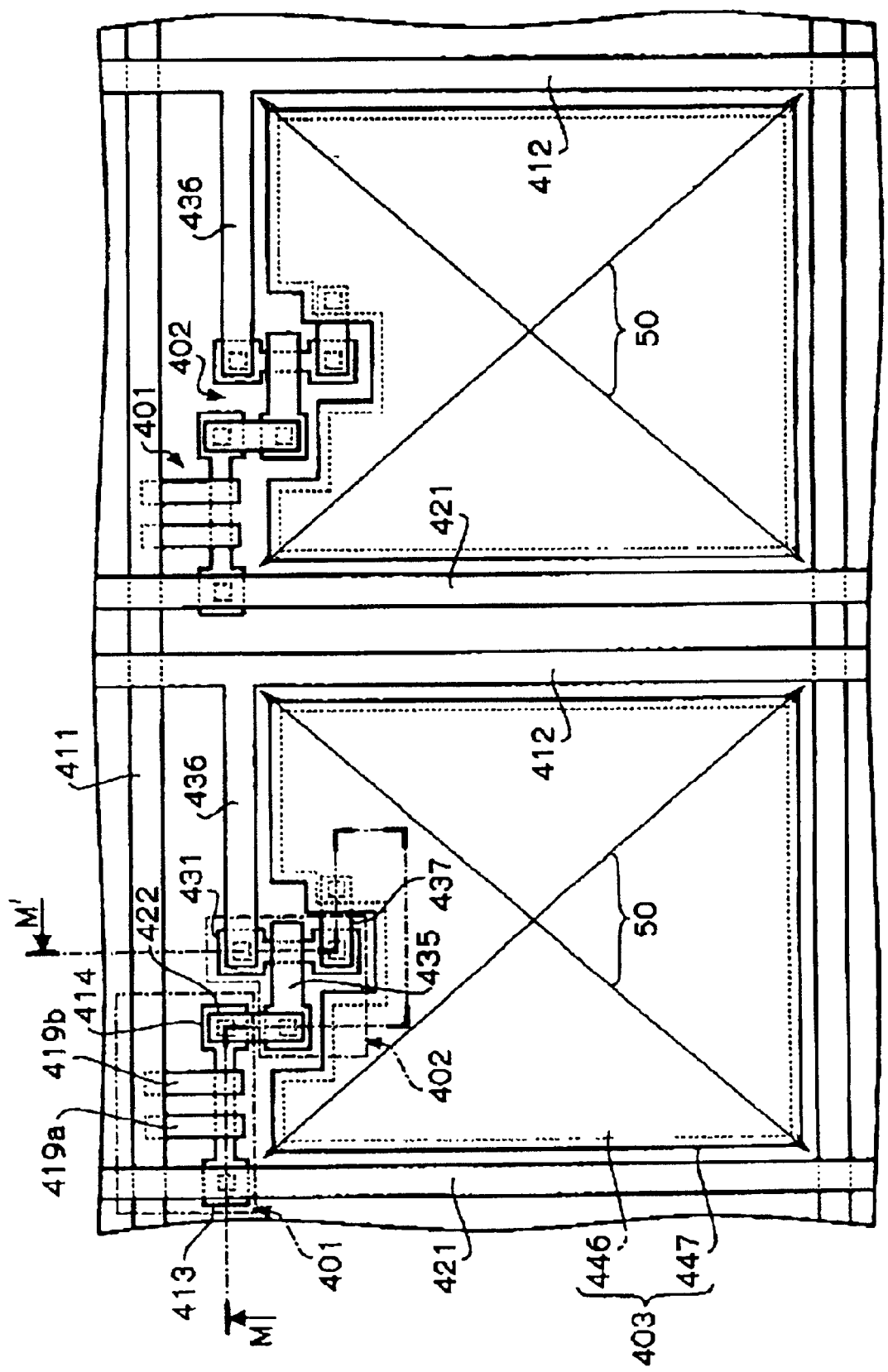
FIG. 30 is an enlarged plan view showing display dot portions indicated by the arrow D in FIG. 28.

As shown in FIG. 28, a plurality of display dots 50 independent of each other is disposed in a matrix in the display region V. In FIG. 30, the two display dots adjacent to each other, which are indicated by the arrow D in FIG. 28, are shown. In addition, FIG. 31 shows an equivalent circuit diagram of an electrical circuit structure in these display dots.

Figure 31:
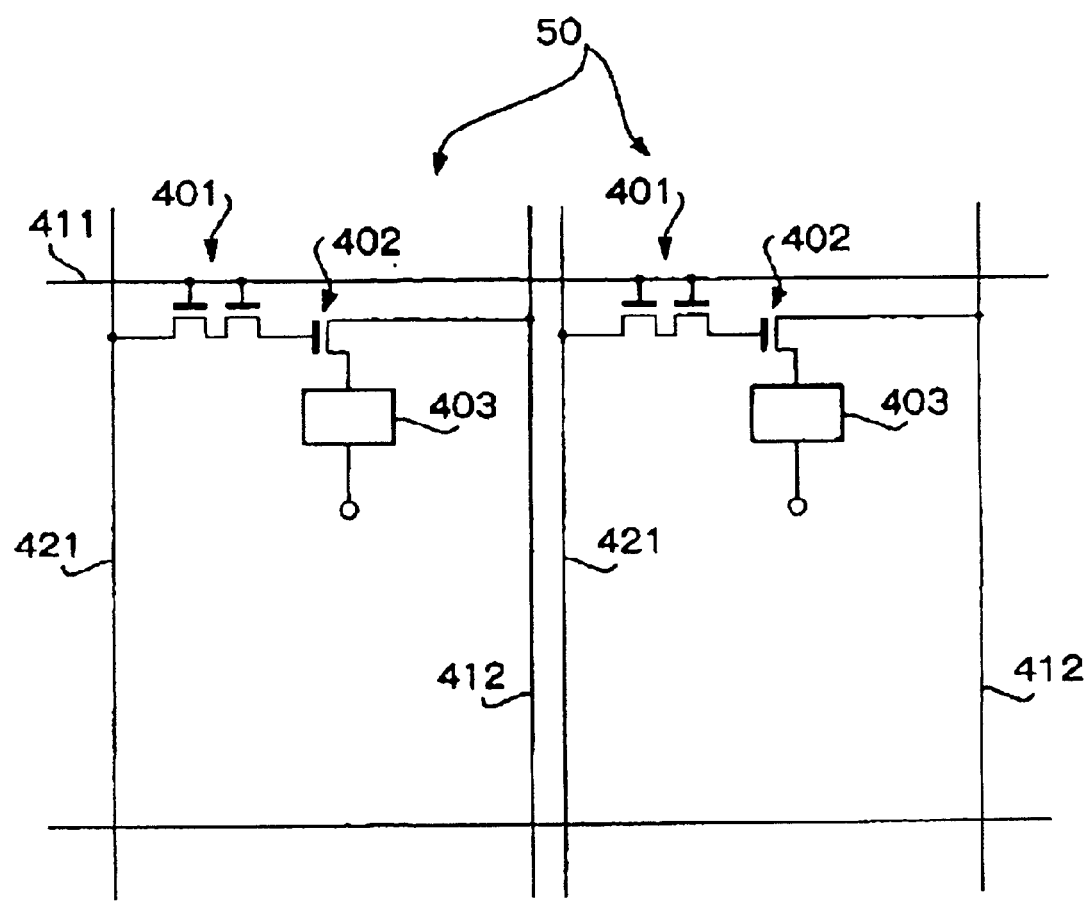
FIG. 31 is an electrically equivalent circuit corresponding to the structure shown in FIG. 30.

As shown in FIGS. 30 and 31, each display dot 50 comprises a switching TFT 401 functioning as a switching element and a current control TFT 402 functioning as a current-control element which control the amount of current flowing into the EL element. The source of the switching TFT 401 is connected to a source wire 421, the gate is connected to a gate wire 411, and the drain is connected to the gate of the current control TFT 402.

In addition, the source of the current control TFT 402 is connected to a current control wire 412, and the drain is connected to an EL element 403. The EL element 403 is a light-emitting element having the structure in which an EL layer containing a light-emitting layer is provided between an anode and a cathode. In FIG. 30, a pixel electrode 446 is shown as an approximately square anode, an EL layer 447 containing a light-emitting layer is laminated on the pixel electrode 446, and on this EL layer, a cathode (not shown in FIG. 30) is laminated as a common electrode commonly used for all display dots 50, and this laminated structure described above forms the EL element 403.

In FIG. 28, the source wires 421 extend in the longitudinal direction in the figure (that is, the X direction), enter the adhesive 305 at the upper side in FIG. 28, that is, enter the lower layer thereof, and are brought into contact with wires 312 inside the adhesive 305, that is, are electrically connected thereto. The wires 312 extend in the region surrounded by the adhesive 305, that is, the region inside the conduction positions, in the lateral direction (that is, the Y direction) in the figure, traverse the left side of the adhesive 305, are further extend outside the housing 304, and are connected to the output terminals of the source driver IC 303.

The gate wires 411 extend in the Y direction in FIG. 28 and are connected to wires 313 in the vicinity of the left side of the adhesive 305. The wires 313 traverse the left side of the adhesive 305, extend outside the housing 304, and are connected to the output terminals of the gate side driver IC 302.

The current supply wires 412 extend in the Y direction in FIG. 28, enter the adhesive 305 at the lower side in FIG. 28, that is, enter the lower layer thereof, and are brought into contact with wires 314 in the adhesive 305, that is, are electrically connected thereto. The wires 314 extend in the region surrounded by the adhesive 305, that is, the region inside the conduction positions, in the Y direction, traverse the left side of the adhesive 305, further extend outside the housing 304, and are connected to the output terminals of the FPC 321 via the external connection terminals 317.

Figure 32:
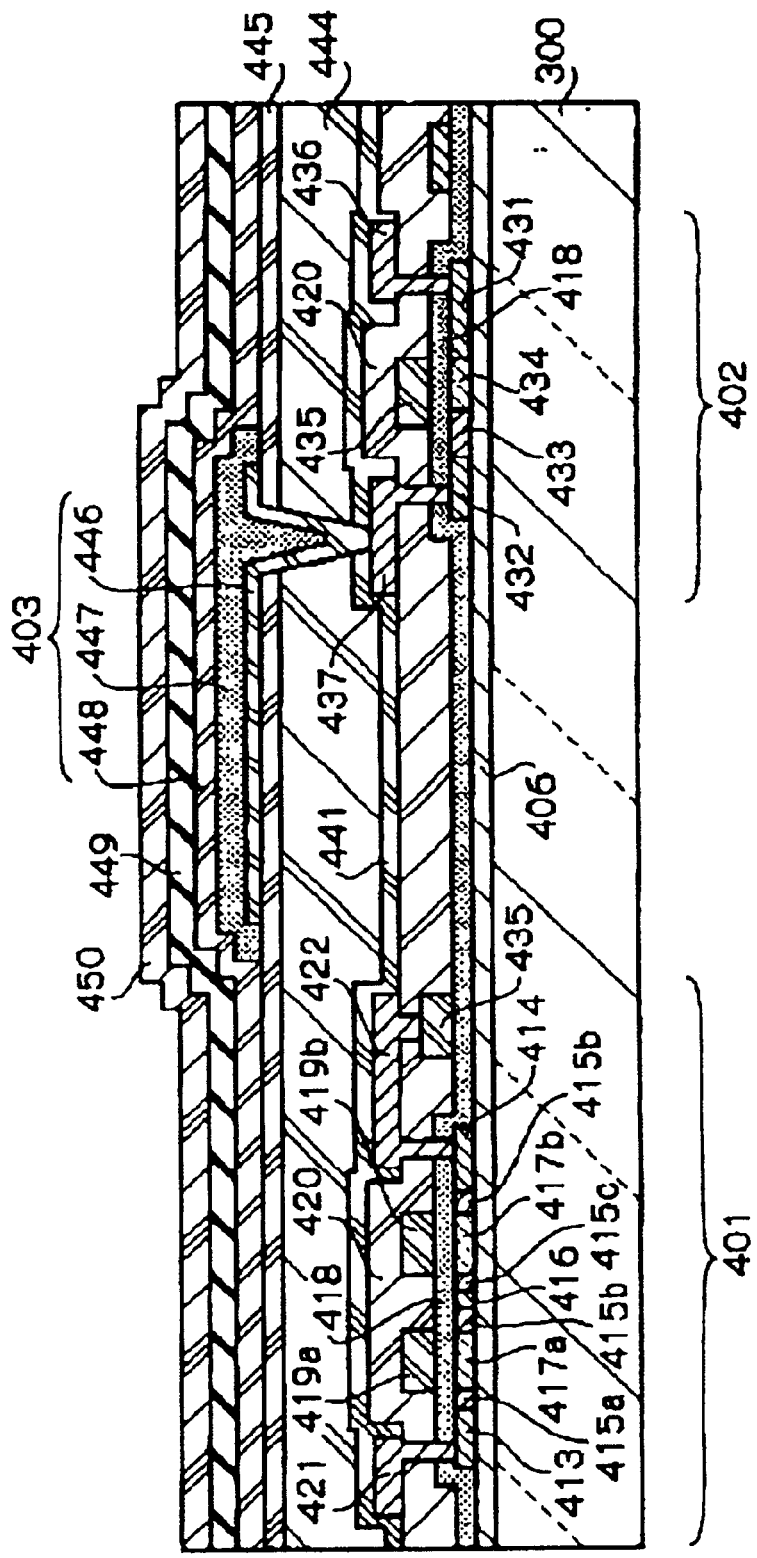
FIG. 32 is a view showing the cross-sectional structure of a TFT taken along the line M–M' in FIG. 30.

FIG. 32 shows a cross-sectional view of the active element portion for driving the EL device, taken along the line M–M' in FIG. 30. In FIG. 32, on the substrate 300, an insulating film 406 used as an underlayer is formed. The substrate 300 is formed of, for example, a glass substrate, a glass ceramic substrate, a quartz substrate, a silicon substrate, a ceramic substrate, a metal substrate, a plastic substrate, or a plastic film.

The underlayer 406 is effective particularly when a substrate containing movable ions or a substrate having conductivity is used, and when a quartz substrate is used as the substrate 300, the underlayer 406 may not be provided. As the underlayer 406, for example, an insulating film containing silicon (that is, Si) may be used. In addition, the underlayer 406 preferably has a heat dissipation function for dissipating heat generated in TFT's.

In this embodiment, two TFT's, that is, the switching TFT 401 functioning as a switching element and the current control TFT 402 functioning as a current control element which control the amount of current flowing into the EL element, are provided in one display dot. In this embodiment, both TFT's are formed of an n-channel type TFT; however, both TFT's or one of them may be formed of a p-channel type TFT.

The switching TFT 401 has an active layer comprising five elements, that is, a source region 413, a drain region 414, LDD (Lightly Doped Drain) regions 415a, 415b, 415c, and 415d, a highly doped region 416, and channel forming regions 417a and 417b. In addition, the switching TFT 401 has a gate insulating film 418, gate electrodes 419a and 419b, a first interlayer insulating film 420, the source wire 421, and the drain wire 422.

As shown in FIG. 30, the gate electrodes 419a and 419b form a double gate structure, that is, the gate electrodes 419a and 419b are electrically connected to each other with the gate wire 411 composed of a material different from that for the gate electrodes 419a and 419b and having a resistance lower than that of the gate electrodes 419a and 419b. In addition to the double gate structure, a so-called multi-gate structure, such as a triple gate structure, provided with an active layer including at least two channel forming regions connected in series, may also be used.

The active layer is formed of a semiconductor film including a crystal structure, that is, a single crystal semiconductor film, a polycrystalline semiconductor film, a fine crystal semiconductor film, or the like. In addition, the gate electrode 419a and 419b, the source wire 421, and the drain wire 422 may be formed of any type of conductive film. In addition, in the switching TFT 401, the LDD regions 415a to 415d are formed under the gate insulating film 418 so as not to overlap the gate electrodes 419a and 419b. The structure described above is very effective to decrease an OFF current.

Next, in FIG. 32, the current control TFT 402 has an active layer comprising four elements, that is, a source region 431, a drain region 432, an LDD region 433, and a channel forming region 434; the gate insulating film 418; a gate electrode 435; the first interlayer insulating film 420; a source wire 436; and a drain wire 437. The gate electrode 435 has a single gate structure; however, in place of that, a multi-gate structure may also be formed.

In FIG. 32, the drain of the switching TFT 401 is connected to the gate of the current control TFT. In particular, the gate electrode 435 of the current control TFT 402 is electrically connected to the drain region 414 of the switching TFT 401 via the drain wire 422. In addition, the source wire 436 is connected to the current supply wire 412.

The current control TFT 402 supplies current so as to enable the EL element 403 to emit light and, in addition, simultaneously controls the amount of the current so that gray scale display is performed. Accordingly, measures must be taken against degradation caused by hot carrier implantation so that the degradation will not occur when current flows. In addition, when a black color is displayed, the current control TFT 402 is placed in an OFF state; however, in the case described above, when the OFF current is high, a clear black display cannot be created, and degradation of contrast occurs. Accordingly, the OFF current is preferably decreased.

In FIG. 32, on the first interlayer insulating film 420, a first passivation film 441 is formed. This first passivation film 441 is formed of, for example, an insulating film containing silicon. This first passivation film 441 functions to protect the formed TFT from alkali metals or moisture. The EL layer, which is finally provided above the TFT, contains alkali metals such as sodium. That is, the first passivation film 441 functions as a protection film that prevents these alkali metals from penetrating into the TFT side.

In addition, when heat dissipation properties are imparted to the first passivation film 441, degradation of the EL layer caused by heat can be prevented. Furthermore, according to the structure shown in FIG. 32, since the substrate 300 is irradiated with light, the first passivation film 441 must have light transmission property. In addition, when an organic material is used for the EL layer, since the EL layer is degraded when combined with oxygen, it is preferable that an insulating film likely to evolve oxygen be not used.

On the first passivation film 441, a second interlayer insulating film 444 is formed so as to cover each TFT. This second interlayer insulating film 444 serves to planarize steps formed by the TFT's. As the second interlayer insulating film 444, for example, an organic resin, such as polyimide, polyamide, or acrylic resins, may be used. When sufficient planarization can be performed by an inorganic film, it may also be used.

Since the EL layer is very thin, when there is a step on the surface on which the EL layer is formed, light-emitting defect may occur in some cases. Accordingly, it is important that the steps formed by the TFT's be planarizes by the second interlayer insulating film 444 in order to make the EL layer formed thereon normally work.

On the second interlayer insulating film 444, a second passivation film 445 is formed. This second passivation film 445 serves to prevent alkaline metals that diffuse from the EL element from penetration. The second passivation film 445 may be formed of the same material as that for the first passivation film 441. In addition, the second passivation film 445 preferably serves as a dissipation layer for dissipating heat generated from the EL element, and the heat is prevented from being saved in the EL element by this dissipation function.

On the second passivation film 445, the pixel electrodes 446 are formed. The pixel electrode 446 is formed of, for example, a transparent conductive film and serves as an anode of the EL element. Contact holes are formed after apertures are formed in the second passivation film 445, the second interlayer insulating film 444, and the first passivation film 441, and the pixel electrodes 446 are then formed so as to be connected to the drain wires 437 of the current control TFT's 402 via the contact holes.

Next, on the pixel electrodes 446, the EL layers 447 are formed. This EL layer 447 is formed so as to have a single layer structure or a multi-layer structure, and in general, the multi-layer structure has been formed in many cases. In this EL layer 447, as a layer in direct contact with the pixel electrode 446, a hole injection layer, a hole transport layer, or a light-emitting layer may be mentioned.

When a two-layer structure composed of the hole transport layer and the light-emitting layer is used, the hole transport layer may be formed of, for example, poly (phenylene vinylene). As the light-emitting layer, cyanopoly (phenylene vinylene) as a red light-emitting layer, poly (phenylene vinylene) as a green light-emitting layer, and poly(phenylene vinylene) or polyalkylphenylene as a blue light-emitting layer may be used.

Next, on the EL layer 447 formed as described above, a cathode 448 is formed, and on the cathode, a protection electrode 449 is further formed. These cathode 448 and the protection electrode 449 are formed by, for example, vacuum deposition. When the cathode 448 and the protection electrode 449 are continuously formed without being exposed to the air, the degradation of the EL layer 447 can be suppressed. A light-emitting element formed of the pixel electrode 446, the EL layer 447, and the cathode 448 is the EL element 403.

As the cathode 448, a material containing magnesium (Mg), lithium (Li), or calcium (Ca), which has a small work function, may be used. The protection electrode 449 is provided to protect the cathode 448 from external moisture or the like and may be formed of, for example, a material containing aluminum (Al) or silver (Ag). This protection film 449 also has a heat dissipation effect.

The structure shown in FIG. 32 is a monochromatic light emitting structure in which one type EL element 403 having one of color R, G, and B is formed corresponding to each display dot 50. However, as the light-emitting system, in addition to the monochromatic light emitting system described above, there may be mentioned, for example, a system formed of white light emitting EL elements in combination with color filters, a light emitting system formed of blue or cyan light emitting EL elements in combination with a fluorescent material, or a light emitting system in which EL elements corresponding to R, G, and B overlap cathodes formed of a transparent material. By using these various systems described above, color display may also be performed. In addition, by forming a monolayer of a white light emitting EL layer, monochrome display nay also be performed.

On the protection electrode 449, a third passivation film 450 is formed. This third passivation film 450 serves to protect the EL layer 447 from moisture and, when necessary, may also be formed so as to have a heat dissipation function as the second passivation film 445. When an organic material is used for the EL layer, since the organic material may be degraded by the combination with oxygen, it is preferable that an insulating film likely to evolve oxygen be not used for the third passivation film 450.

Since the EL device 310 of this embodiment is formed as described above, in FIG. 28, one of a scanning signal or a data signal is supplied to the gate wire 411 by the gate side drive circuit 302, and the other type of signal is supplied to the source wire 421 by the source side drive circuit 303. In addition, the current supply line 412 supplies a current to the current control TFT 402 in each display dot to enable the EL element to emit light.

An appropriate display dot of the plurality of display dots disposed in a matrix in the display region V is selected in accordance with the data signal, and during this selection period, the switching TFT 401 is placed in an ON state, whereby the data voltage is saved. During non-selection period, the TFT 401 is placed in an OFF state, and the voltage is maintained thereby. By these switching and saving operation, appropriate display dots of the plurality of display dots selectively emit light, and these light-emitting dots display letters, numerals, figures or the like on the rear side of the plane in FIG. 28, that is, in the direction indicated by the arrow Q in FIG. 29.

In FIG. 28, a signal is supplied to the source wire 421 via the wire 312. In addition, a signal is supplied to the gate wire 411 via the wire 313. A current is supplied to the current supply line 412 via the wire 314. In this embodiment, at the position in the vicinity of the housing 304, which covers the inside of the EL device 310 so as to form a closed state which is independent of the outside conditions, at which the wires 312, 313, and 314 extend outside the housing 304, a wire boundary 10*b* is set.

The layered structure of each of the wires 312, 313, and 314 inside the wire boundary 10*b* may be different from that outside the wire boundary 10*b* in a manner equivalent to that of, for example, the wire 219*b* shown in FIG. 21. In particular, in the area at the display region V side (that is, the right side in FIG. 28) from the wire boundary 10*b*, the cross-sectional structure of the wire may be a two-layered structure similar to that composed of the first metal film 220 and the second metal film 223, and on the other hand, in the area at which the wires are extended (that is, the left side in FIG. 28) from the wire boundary 10b, the cross-sectional structure of the wire may be a single layer structure similar to that composed of the second metal film 223. The materials for the first metal film and the second metal film in FIGS. 28 and 21 may be selected suitably in consideration of the individual cases.

For example, in the case in which the first metal film, which is disposed only inside the wire boundary 10b (that is, the display region V side), is formed of a material having a low resistance and being susceptible to corrosion, when the first metal wire described above is formed inside the wire, the wiring resistance can be decreased, and as a result, stable image display can be performed by the EL device 310.

In addition, even in the case in which the first metal film is formed of a material susceptible to corrosion, since the region in which the first metal film is disposed is the limited region independent of external conditions, the first metal film susceptible to corrosion is not exposed to outside air, and display defects which is caused by corrosion generated over the entire wire along the first metal film can be reliably prevented.

In this embodiment, since the wires 312 and 314 are disposed inside the adhesive 305, that is, inside the conduction positions, the protruding portion of the substrate 300 protruding from the housing 304, that is, the picture frame region, can be significantly decreased.

Furthermore, in this embodiment, since parts of the wires 312 and 314 extending in the Y direction are disposed in the housing 304, these wires can be reliably prevented from being exposed to outside air, and accordingly, problems, it has been believed that they are caused by the wires exposed to outside air, such as corrosion or short-circuiting, can be reliably prevented.

In addition, in the embodiments, the EL device and the liquid crystal device are only described; however, the present invention can also be applied to, for example, an electrophoresis device in which a dispersion medium and electrophoresis particles are enclosed between substrates.

As has thus been described in detail, according to the electrooptic device of the present invention, since the wires are disposed at the central portion side from the conduction positions, that is, inner side, compared to previous cases, the picture frame region can be decreased. In addition, the picture frame region in a symmetrical shape in the lateral direction can also be formed. Accordingly, when the electrooptic device of the present invention is applied to electronic apparatuses, designing and manufacturing can be very easily performed.

In addition, since the compact electrooptic device formed by decreasing the picture frame region is provided, although being compact and having superior portability, the electronic apparatus has a wide display region.

Japanese patent applications 2001-117251, filed Apr. 16, 2001, 2001-148298, filed May 17, 2001, 2001-148299, filed May 17, 2001, and 2002-100570, filed Apr. 2, 2002, are hereby incorporated by reference.

What is claimed is:

1. An electrooptic device comprising:
a first substrate and a second substrate;
a first electrode provided on the first substrate;
a second electrode provided on the second substrate, the second electrode disposed to oppose the first electrode;
a wire provided on the first substrate;
an electrooptic material provided between the first electrode and the second electrode; and
a sealing material between the first substrate and the second substrate defining a sealed area, the electrooptic material disposed within the sealed area;
wherein the wire includes a first end and a second end opposite the first end, one of said first end and said second end of the wire being electrically connected to the second electrode at a conduction position located between said first and second substrates and entirely covered by the sealing material; and
wherein the wire extends inward from the conduction position to within the sealed area and extends beyond the sealed area.

2. An electrooptic device according to claim 1, wherein an end of the wire that extends inside from the conduction position is connected to an external circuit.

3. An electrooptic device according to claim 1, further comprising a conductive material contained in the sealing material, wherein the wire and the second electrode are electrically connected to each other via the conductive material.

4. An electrooptic device according to claim 1, further comprising a dummy pattern provided on the first substrate and corresponding to at least one of the second electrodes,
wherein the dummy pattern is provided at a side opposite to the conduction positions so as to oppose at least one of the second electrodes.

5. An electronic apparatus comprising an electrooptic device according to claim 1.

6. An electrooptic device according to claim 1, wherein the wire comprises a first wire array having more than one of the wire and a second wire array having more than one of the wire;
wherein each wire of the first wire array is electrically connected to successive first ends of the second electrodes; and
wherein each wire of the second wire array is electrically connected to successive second ends of the second electrodes, the first ends of the second electrodes located opposite the second ends.

7. An electrooptic device comprising:
a first substrate;
a plurality of first electrodes provided in a stripe pattern on the first substrate;
a second substrate;
a plurality of second electrodes provided on the second substrate in a stripe pattern, said second electrodes are provided orthogonal to the first electrodes;
a sealing material which bonds the first substrate to the second substrate so that the individual surfaces thereof oppose each other, the sealing material at least substantially surrounding an interior region;
liquid crystal positioned at the interior region and surrounded by the first substrate and the second substrate;
a conductive material disposed in the sealing material; and
wires provided on the first substrate and electrically connected to the second electrodes via the conductive material;
wherein the wires each comprise a first conductive film having a resistance lower than that of first electrodes, said first conductive film is an APC film;
wherein the wires extend from the sealing material to the interior region of the sealing material such that a part or the entirety of the first conductive film is provided in the region surrounded by the sealing material.

8. An electrooptic device according to claim 7, wherein the wires each further comprise a second conductive film formed of the same layer as that for the first electrode, and the first conductive film and the second conductive film form a laminated film.

9. An electrooptic device according to claim 8, wherein the second conductive film comprises ITO, and the first conductive film having a low resistance comprises silver or aluminum.

10. An electrooptic device according to claim 7, further comprising a driver IC mounted on the first substrate, wherein the driver IC drives the second electrodes via the wires.

11. An electrooptic device according to claim 7, wherein a part of each of the wires provided outside the region of the sealing material does not include the first conductive film.

12. An electrooptic device comprising:

a first substrate;

a plurality of pixel electrodes in a dot matrix provided on the first substrate;

a plurality of two-terminal switching elements electrically connected to the corresponding pixel electrodes, said switching elements are provided on the first substrate;

a second substrate;

a plurality of second electrodes provided on the second substrate in a stripe pattern and which oppose the pixel electrodes at a viewing area;

a sealing material which bonds the first substrate to the second substrate so that the individual surfaces thereof oppose each other, the sealing material defining an interior region bordered by the sealing material, the interior region including the viewing area;

liquid crystal enclosed in a region surrounded by the first substrate, the second substrate, and the sealing material;

a conductive material disposed within the sealing material; and a plurality of wires provided on the first substrate electrically connected to the second electrodes via the conductive material;

wherein the two-terminal switching elements have a laminated structure comprising a first metal film, an insulating film, and a second metal film, wherein all of the wires extend inward from the sealing material to the interior region bordered by the sealing material at first positions and extend through the interior region between the sealing material and the viewing area and outward from the interior region at second positions different from the first positions, the wires each comprise a first conductive film having a resistance lower than that of the pixel electrodes, and a part or an entirety of the first conductive film is provided in the interior region bordered by the sealing material.

13. An electrooptic device according to claim 12, wherein the wires each further comprise a second conductive film which is the same layer as that for the first electrodes, and the first conductive film and the second conductive film form a laminated film.

14. An electrooptic device according to claim 12, wherein the first conductive film is the same layer as that for the second metal film forming the two-terminal switching device.

15. An electrooptic device according to claim 12, further comprising a driver IC mounted on the first substrate, wherein the driver IC drives the second electrodes via the wires.

16. An electrooptic device according to claim 12, wherein a part of each of the wires provided outside the region of the sealing material does not include the first conductive film.

17. An electrooptic device according to claim 12, wherein the second conductive film which is the same layer as that for the first electrode comprises ITO, and the first conductive film comprises Cr.

18. An electrooptic device comprising:

a first substrate and a second substrate;

a first electrode provided on the first substrate;

a second electrode provided on the second substrate, the second electrode disposed opposite the first electrode;

an electrooptic material provided between the first electrode and the second electrode;

a sealing material between the first substrate and the second substrate defining a sealed area, the electrooptic material disposed within the sealed area, the sealing material including a conductive region and a non-conductive region; and a wire provided on the first substrate, the wire extending inward from the sealing material into the sealed area, the wire extending through both the conductive region and the non-conductive region of the sealing material.

19. An electrooptic device as claimed in claim 18, wherein the sealing material has an approximate rectangular shape with two sets of opposing sides, the conductive region being located in one set of opposing sides and the non-conductive region being located in another set of opposing sides.

20. An electrooptic device as claimed in claim 18, wherein the non-conductive region of the sealing material is located closer to the sealed area than the conductive region of the sealing material.

* * * * *

UNITED STATES PATENT AND TRADEMARK OFFICE
CERTIFICATE OF CORRECTION

PATENT NO. : 6,888,606 B2  
APPLICATION NO. : 10/122631  
DATED : May 3, 2005  
INVENTOR(S) : Shoji Hinata et al.

Page 1 of 1

It is certified that error appears in the above-identified patent and that said Letters Patent is hereby corrected as shown below:

Col. 14, Line 51      "APO" should be --APC--

Col. 38, Line 52      Claim 21. Insert --21. An electrooptic device according to Claim 1, wherein the electrooptic material is liquid crystal or an EL (Electro Luminescent) material.--

Signed and Sealed this

Twenty-sixth Day of May, 2009

JOHN DOLL  
*Acting Director of the United States Patent and Trademark Office*